(12) United States Patent
Singer et al.

(10) Patent No.: US 12,228,531 B1
(45) Date of Patent: Feb. 18, 2025

(54) METHOD OF DETERMINING SOLID AND LIQUID COMPONENTS IN SEDIMENTARY ROCKS USING NMR RELAXATION

(71) Applicants: Vinegar Technologies LLC, Bellaire, TX (US); William Marsh Rice University, Houston, TX (US)

(72) Inventors: Philip M. Singer, Richmond, TX (US); Yunke Liu, Houston, TX (US); Xinglin Wang, Houston, TX (US); George J. Hirasaki, Bellaire, TX (US); Harold J. Vinegar, West Lake Hills, TX (US)

(73) Assignee: Vinegar Technologies LLC, West Lake Hills, TX (US)

( * ) Notice: Subject to any disclaimer, the term of this patent is extended or adjusted under 35 U.S.C. 154(b) by 145 days.

(21) Appl. No.: 18/125,757

(22) Filed: Mar. 24, 2023

Related U.S. Application Data

(60) Provisional application No. 63/324,710, filed on Mar. 29, 2022.

(51) Int. Cl.
*G01N 24/08* (2006.01)
*G01R 33/50* (2006.01)
*G01V 3/32* (2006.01)

(52) U.S. Cl.
CPC .......... *G01N 24/081* (2013.01); *G01R 33/50* (2013.01); *G01V 3/32* (2013.01)

(58) Field of Classification Search
CPC ......... G01N 24/081; G01R 33/50; G01V 3/32
See application file for complete search history.

(56) References Cited

U.S. PATENT DOCUMENTS

| | | | |
|---|---|---|---|
| 5,497,087 | A | 3/1996 | Vinegar |
| 6,991,045 | B2 | 1/2006 | Vinegar |
| | | (Continued) | |

FOREIGN PATENT DOCUMENTS

| | | |
|---|---|---|
| GB | 2542406 A | 3/2017 |
| WO | 2012/123863 A2 | 9/2012 |
| WO | 2017/151928 A1 | 9/2017 |

OTHER PUBLICATIONS

Hürlimann, M.D., Diffusion and Relaxation Effects in General Stray Field NMR Experiments, Journal of Magnetic Resonance, 148, 367-378, 2001.

(Continued)

*Primary Examiner* — G. M. A Hyder
(74) *Attorney, Agent, or Firm* — Momentum IP; Marc Van Dyke

(57) ABSTRACT

A method for separating liquid-like ($T_{2e}$) from solid-like ($T_{2G}$) $^1$H NMR transverse relaxation times in porous media uses novel pulse sequences together with a $^1$H NMR spectrometer optimized for geological core samples. The method is applied to obtain 1D $T_2$ distributions and 2D $T_1$-$T_2$ maps in organic-rich chalks for quantification of liquid-like signal (micropore fluids, meso-macropore fluids, fluids dissolved in organic matter, and clay-bound water) and solid-like signal (kerogen, bitumen, and clay hydroxyls). The novel pulse sequences comprise a solid-echo, which detects more solid-like signal than an FID. The method is used for fluid typing in micro/meso-macro pores, clay mineral identification, determination of kerogen content, and quantification of solvent-extracted bitumen versus bitumen expelled from kerogen due to swelling from dissolved hydrocarbons. The method is used to quantify the asphaltene, resin, aromatic, and/or saturate content of bitumen in the rock.

34 Claims, 30 Drawing Sheets

(56) References Cited

U.S. PATENT DOCUMENTS

| | | |
|---|---|---|
| 7,526,953 B2 | 5/2009 | Goodwin |
| 9,552,462 B2 | 1/2017 | Walters |
| 11,099,292 B1 | 8/2021 | Vinegar |
| 11,131,186 B1 | 9/2021 | Al-Garadi |
| 11,486,949 B1 | 11/2022 | MacMillan |
| 11,921,069 B1 | 3/2024 | Vinegar |
| 11,933,932 B1 | 3/2024 | Vinegar |
| 2006/0055403 A1 | 3/2006 | Freedman |
| 2009/0256562 A1 | 10/2009 | Gao |
| 2009/0288881 A1 | 11/2009 | Mullins |
| 2011/0088895 A1 | 4/2011 | Pop |
| 2012/0092007 A1 | 4/2012 | Li |
| 2012/0296617 A1 | 11/2012 | Zuo |
| 2013/0113480 A1 | 5/2013 | Kadayam Viswanathan |
| 2013/0161502 A1 | 6/2013 | Pomerantz |
| 2013/0234703 A1 | 9/2013 | Chen |
| 2014/0225607 A1 | 8/2014 | Edwards |
| 2015/0153433 A1 | 6/2015 | Paulsen |
| 2015/0168588 A1 | 6/2015 | Vinegar |
| 2015/0184500 A1 | 7/2015 | Vinegar |
| 2015/0210917 A1 | 7/2015 | Vinegar |
| 2015/0329785 A1 | 11/2015 | Vinegar |
| 2016/0091389 A1 | 3/2016 | Zuo |
| 2016/0341680 A1* | 11/2016 | Kadayam Viswanathan ............... G01R 33/448 |
| 2018/0195383 A1 | 7/2018 | Smith |
| 2019/0017377 A1 | 1/2019 | He |
| 2020/0224080 A1 | 7/2020 | Nevison |
| 2020/0264116 A1* | 8/2020 | Gawankar ............ G01N 24/081 |
| 2021/0285902 A1 | 9/2021 | Elsayed |
| 2022/0050223 A1* | 2/2022 | Tang .................... G01R 33/448 |

OTHER PUBLICATIONS

Acosta, R.H., Silletta, E.V., Monti, G.A., Garro Linck, Y., Bedini, P.C., Vila, G.S., Masiero, D.M., Domené, E.A., Velsco, M.I., Detection of solid organic material and fluids in the shale rock by means of low field NMR, US 2021/0123874 A1, 2021.

Birdwell, J.E., Washburn, K.E., Multivariate analysis relating oil shale geochemical properties to NMR relaxometry, Energy Fuels, 29, 2234-2243, 2015.

Boutis, G.S., Ravinath Kausik, R., Comparing the efficacy of solid and magic-echo refocusing sequences: Applications to 1H NMR echo spectroscopy of shale rock, Solid State Nuclear Magnetic Resonance 88, 22-28, 2017.

Carvajal-Ortiz, H., Gentzis, T., Critical considerations when assessing hydrocarbon plays using Rock-Eval pyrolysis and organic petrology data: Data quality revisited, International Journal of Coal Geology, 152, 113-122, 2015.

Chen, Q., Marble, A.E., Colpitts, B.G., Balcom, B.J., The internal magnetic field distribution, and single exponential magnetic resonance free induction decay, in rocks, Journal of Magnetic Resonance, 175, 300-308, 2005.

Chen, Z., Singer, P.M., Kuang, J., Vargas, F.M., Hirasaki, G.J., Effects of bitumen extraction on the 2D NMR response of saturated kerogen isolates, Petrophysics, 58, 470-484, 2017.

Chen, Z., Singer, P.M., Wang, X., Hirasaki, G.J., Vinegar, H.J., Evaluation of light hydrocarbon composition, pore size, and tortuosity in organic-rich chalks using NMR core analysis and logging, Society of Petrophysicists and Well-Log Analysts, SPWLA-2019-K, 2019.

Chen, Z., Singer, P.M., Wang, X., Vinegar, H.J., Nguyen, S.V., Hirasaki, G.J., NMR evaluation of light-hydrocarbon composition, pore size, and tortuosity in organic-rich chalks, Petrophysics 60 (06), 771-797, 2019.

Cowan, B. Nuclear magnetic resonance and relaxation; Cambridge University Press, 1997.

Dang, S.T., Sondergeld, C.H., Rai, C.S, Interpretation of nuclear-magnetic-resonance response to hydrocarbons: application to miscible enhanced-oil-recovery experiments in shales, Society of Petroleum Engineers, SPE Res Eval & Eng, 22 (01): 302-309, SPE-191144-PA, 2019.

Dick, M.J., Veselinovic, D., Green, D., Review of recent developments in NMR core analysis, Petrophysics, 63 (3), 454, 2022.

Enjilela, R., Guo, J., MacMillan, B., Marica, F., Afrough, A., Balcom, B., T1-T*2 relaxation correlation measurements, Journal of Magnetic Resonance, 326, 106961, 2021.

Fleury, M., Gautier, S., Norrant, F., Kohler E., Characterization of nano porous systems with low field NMR: application to kaolinite and smectite clays, Society of Core Analysts, SCA2011-32, 2011.

Fleury, M., Kohler, E., Norrant, F., Gautier, S., M'Hamdi, J., Barré, L., Characterization and quantification of water in smectites with low-field NMR, Journal of Physical Chemistry C, 117, 4551-4560, 2013.

Fleury, M., Romero-Sarmiento, M., Characterization of shales using T1-T*2 NMR maps, Journal of Petroleum Science and Engineering, 137, 55-62, 2016.

Galeev, R.I., Sakharov, B.V., Khasanova, N.M., Volkov, V.Y., Fazlyyyakhmatov, M.G., Shamanov, I.N., Emelianov, D.A., Kozlova, E.V., Petrashov, O.V., Varfolomeev, M.A., Nurgaliev, D.K., Novel low-field NMR method for characterization content and SARA composition of bitumen in rocks, Journal of Petroleum Science and Engineering, 214, 110486, 2022.

Gentzis, T., Carvajal-Ortiz, H., Xie, Z.H., Hackley, P.C., Fowler, H., An integrated geochemical, spectroscopic, and petrographic approach to examining the producibility of hydrocarbons from liquids-rich unconventional formations, Fuel, 298, 120357, 2021.

Guo, J., MacMillan, B., Zamiri, M.S., Balcom, B.J., Magnetic resonance T1-T*2 and T1rho-T2* relaxation correlation measurements in solid-like materials with non-exponential decays, Journal of Magnetic Resonance, 328, 107005, 2021.

Guo, J., Zamiri, M.S., Balcom, B.J., Rapid measurement of T*1-T*2 relaxation correlation with a Look-Locker sequence, Journal of Magnetic Resonance, 335, 107123, 2022.

Jiang, T., Rylander, E., Singer, P.M., Lewis, R., Sinclair, S.M., Integrated petrophysical interpretation of Eagle Ford shale with 1-D and 2-D nuclear magnetic resonance (NMR), Society of Petrophysicists and Well Log Analysts, SPWLA-2013-LL, 2013.

Kausik, K. Fellah, K., Rylander, E., Singer, P.M., Lewis, R.E., Sinclair, S.M., NMR relaxometry in shale and implications for logging, Petrophysics, 57, 339-350, 2016.

Kausik, K., Freed, D., Fellah, K., Feng, L., Ling, Y., Simpson, G., Frequency and temperature dependence of 2D NMR T1-T2 maps of shale, Petrophysics, 60 (1), 2019.

Khatibi, S., Ostadhassan, M., Xie, Z.H., Gentzis, T., Bubach, B., Gan, Z., Carvajal-Ortiz, H., NMR relaxometry a new approach to detect geochemical properties of organic matter in tight shales, Fuel, 235, 167-177, 2019.

Kowalewski, J., Maler, L., Nuclear spin relaxation in liquids: theory, experiments, and applications, Series in Chemical Physics, Taylor & Francis, 2006.

Li, J., Jiang, C., Wang, M., Xu, L., Li, M., Yu, C., Wu, Y., Lu, S., Determination of in situ hydrocarbon contents in shale oil plays. Part 1: Is routine Rock-Eval analysis reliable for quantifying the hydrocarbon contents of preserved shale cores?, Organic Geochemistry, 170, 104449, 2022.

Li, J., Jiang, C., Wang, M., Xu, L., Li, M., Yu, C., Wu, Y., Lu, S., Determination of in situ hydrocarbon contents in shale oil plays. Part 2: Two-dimensional nuclear magnetic resonance (2D NMR) as a potential approach to characterize preserved cores, Marine and Petroleum Geology, https://doi.org/10.1016/j.marpetgeo.2022.105890, 2022.

Liu, B., Bai, L., Chi, Y., Jia, R., Fu, X. Yang, L., Geochemical characterization and quantitative evaluation of shale oil reservoir by two-dimensional nuclear magnetic resonance and quantitative grain fluorescence on extract: A case study from the Qingshankou Formation in Southern Songliao Basin, northeast China, Marine and Petroleum Geology, 109, 561-573, 2019.

Liu, K., Gentzis, T., Carvajal-Ortiz, H., Xie, Z.H., Ostadhassan, M., Experimental investigation of solid organic matter with a 2D NMR T1-T2 map, Energy Fuels, 35, 19, 15709-15720, 2021.

(56) References Cited

OTHER PUBLICATIONS

McCarthy, K., Rojas, K., Niemann, M., Palrnowski, D., Peters, K., Stankiewicz, A., Basic petroleum geochemistry for source rock evaluation, Oilfield Review, 23(2), 32-43, 2011.

Mitchell, J., Gladden, L.F., Chandrasekera, T.C., Fordham, E.J., Low-field permanent magnets for industrial process and quality control, Progress in Nuclear Magnetic Resonance Spectroscopy, 76, 1-60, 2014.

Nicot, B., Vorapalawut, N., Rousseau, B., Madariaga, L.F., Hamon, G., Korb, J.-P., Estimating saturations in organic shales using 2D NMR, Petrophysics, 57(1), 19-29, 2016.

Ozen A.E., Sigal R.F., T1/T2 NMR surface relaxation ratio for hydrocarbons and brines in contact with mature organic-shale reservoir rocks, Petrophysics 54 (1), 11-19. 2013.

Panattoni, F., Colbourne, A.A, Fordham, E.J., Mitchell, J., Grey, C.P., Magusin, P.C.M.M., Improved description of organic matter in shales by enhanced solid fraction detection with low-field 1H NMR relaxometry, Energy Fuels, 35 (22), 18194-18209, 2021.

Powles, J.G., Mansfield, P., Double-pulse nuclear-resonance transients in solids, Physics Letters, 2, 58-59, 1962.

Powles, J.G., Strange, J.H., Zero time resolution nuclear magnetic resonance transients in solids, Proceedings of the Physical Society, 82, 6-15, 1963.

Rosenberg, Y.O., Reznik, I.J., Vinegar, H.J., Feinstein, S., Bartov, Y., Comparing natural and artificial thermal maturation of a Type II-S source rock, Late Cretaceous, Israel, Marine and Petroleum Geology, 124, 104773, 2021.

Rylander, E., Singer, P.M., Jiang, T., Lewis, R.E., McLin, R., Sinclair, S.M., NMR T2-distributions in the Eagle Ford shale: Reflections on pore size, Society of Petroleum Engineers, SPE-164554-MS, 2013.

Silletta, E.V., Delfa, G.M., Velasco, M.I., Donadelli, J.A., Monti, G.A., Smal, C., Acosta, R.H., Quantification of imbibed heptane in shale rocks determined by edited T1-T2 nuclear magnetic resonance relaxation experiments at high magnetic field, Energy Fuels, https://doi.org/10.1021/acs.energyfuels.2c01554, 2022.

Silletta, E.V., Vila, G.S., Domené, E.A., Velasco, M.I., Bedini, P.C., Garro-Linck, Y., Masiero, D., Monti, G.A., Acosta, R.H., Organic matter detection in shale reservoirs using a novel pulse sequence for T1-T2 relaxation maps at 2 MHZ, Fuel, 312, 122863, 2022.

Singer, P. M., Valiya Parambathu, A., Wang, X., Asthagiri, D., Chapman, W.G., Hirasaki, G.J., Fleury, M., Elucidating the 1H NMR relaxation mechanism in polydisperse polymers and bitumen using measurements, MD simulations, and models, J. Phys. Chem. B, 124, 4222, 2020.

Singer, P.M, Asthagiri, D., Chapman, W.G., Hirasaki, G.J., Molecular dynamics simulations of NMR relaxation and diffusion of bulk hydrocarbons and water, Journal of Magnetic Resonance, 277, 15-24, 2017.

Singer, P.M, Chen, Z., Hirasaki, G.J., Fluid typing and pore size in organic shale using 2D NMR in saturated kerogen isolates, Petrophysics, 57, 604-619, 2016.

Singer, P.M., Arsenault, A., Imai, T., Fujita, M., 139La NMR investigation of the interplay between the lattice, charge, and spin dynamics in charge ordered high Tc cuprate La1.875Ba0.125CuO4, Physical Review B, 101, 174508, 2020.

Singer, P.M., Asthagiri, D., Chen, Z., Valiya Parambathu, A., Hirasaki, G.J., Chapman, W.G., Role of internal motions and molecular geometry on the NMR relaxation of hydrocarbons, Journal of Chemical Physics, 148 (16), 164507, 2018.

Singer, P.M., Chen, Z., Alemany L.B., Hirasaki, G.J., Zhu, K., Xie, Z.H., Vo, T.D., Interpretation of NMR relaxation in bitumen and organic shale using polymer-heptane mixes, Energy Fuels, 32 (2), 1535, 2018.

Singer, P.M., Chen, Z., Wang, X., Hirasaki, G.J., Diffusive coupling in heptane-saturated kerogen isolates evidenced by NMR T1-T2 and T2-T2 maps, Fuel, 280, 118626, 2020.

Singer, P.M., Rylander, E., Jiang, T., Lewis, R.E., McLin, R., Sinclair, S.M., 1D and 2D NMR core-log integration in organic shale, Society of Core Analysts, SCA2013-18, 2013.

Song, Y.Q., Venkataramanan, L., Hurlimann, M.D., Flaum, M., Frulla, P., Straley, C., T1-T2 correlation spectra obtained using a fast two-dimensional Laplace inversion, Journal of Magnetic Resonance, 154, 261-268, 2002.

Ungerer, P., Collell, J., Yiannourakou, M., Molecular modeling of the volumetric and thermodynamic properties of kerogen: Influence of organic type and maturity, Energy Fuels, 29, 91-105, 2015.

Valiya Parambathu, A., Singer, P.M., Hirasaki, G.J., Chapman, W.G., Asthagiri, D., Critical role of confinement in the NMR surface relaxation and diffusion of n-heptane in a polymer matrix revealed by MD simulations, J. Phys. Chem. B, 124, 3801, 2020.

Valori, A., Hursan, G., Ma, S.M., Laboratory and downhole wettability from NMR T1/T2 ratio, Petrophysics, 58, 352-365, 2017.

Valori, A., Van Den Berg, S., Ali, F., Abdallah, W., Permeability estimation from NMR time dependent methane saturation monitoring in shales, Energy Fuels, 31, 5913, 2017.

Venkataramanan, L., Song, Y.Q., Hurlimann, M. D., Solving Fredholm integrals of the first kind with tensor product structure in 2 and 2.5 dimensions, IEEE Transactions on Signal Processing, 50, 1017-1026, 2002.

Vinegar, E.G., Rosenberg, Y.O., Reznick, I., Gordin, Y., Singer, P.M., Wang, X., Chen, Z., Nguyen, S.V., Li, W., Bradley, T., Hirasaki, G.J., Lake, L.W., Feinstein, S., Hatzor, Y.H., Vinegar, H.J., What happens to the petrophysical properties of a dual porosity organic-rich chalk during early-stage organic maturation?, Society of Petrophysicists and Well-Log Analysts, SPWLA-5092, 2020.

Volkov, V.Y., Al-Muntaser, A.A., Varfolomeev, M.A., Khasanova, N.M., Sakharov, B.V., Suwaid, M.A., Djimasbe, R., Galeev, R.I., Nurgaliev, D.K., Low-field NMR-relaxometry as fast and simple technique for in-situ determination of SARA-composition of crude oils, Journal of Petroleum Science and Engineering, 196, 107990, 2021.

Wang, X., Singer, P.M., Chen, Z., Hirasaki, G.J., Vinegar, H.J., A new method of estimating tortuosity and pore size in unconventional formations using NMR restricted diffusion measurements, Society of Petrophysicists and Well-Log Analysts, SPWLA-5046, 2020.

Wang, X., Singer, P.M., Liu, Y., Chen, Z., Hirasaki, G.J., Vinegar, H.J., Pore size, tortuosity, and permeability from NMR restricted diffusion in organic-rich chalks, Petrophysics 62(3), 244-264, 2021.

Washburn, K.E., Anderssen, E., Vogt, S.J., Seymour, J.D., Birdwell, J.E., Kirkland, C.M., Codd, S.L., Simultaneous Gaussian and exponential inversion for improved analysis of shales by NMR relaxometry, Journal of Magnetic Resonance, 250, 7-16, 2015.

Washburn, K.E., Birdwell, J.E., Updated methodology for nuclear magnetic resonance characterization of shales, Journal of Magnetic Resonance, 233, 17-28, 2013.

Washburn, K.E., Relaxation mechanisms and shales, Concepts in Magnetic Resonance Part A, 43A (3), 57-78, 2014.

Xie, Z.H., Gentzis, T., Carvajal-Ortiz, H., Measuring kerogen, solid organics, and oil production potentials of unconventional source rocks using solid type 20-MHZ NMR techniques, Society of Petrophysicists and Well-Log Analysts, SPWLA-2021-0094, 2021.

Xu, C., Xie, R., Guo, J., Jin, G., Fan, W., Xiao, L., Comprehensive characterization of petrophysical properties in shale by solvent extraction experiments and 2D NMR, Fuel, 335, 127070, 2023.

Yang, K., Connolly, P.R.J., Li, M., Seltzer, S.J., McCarty, D.K., Mahmoud, M., El-Husseiny, A., May, E.F., Johns, M.L., Shale rock core analysis using NMR: Effect of bitumen and water content, Journal of Petroleum Science and Engineering, 195, 107847, 2020.

Yang, Z., Hirasaki, G.J., NMR measurement of bitumen at different temperatures, Journal of Magnetic Resonance, 192, 280-293, 2008.

Zamiri, M.S., Guo, J., Marica, F., Romero-Zerón, L., Balcom, B.J., Characterization of kerogen in shale core plugs using T2*-based magnetic resonance methods, Fuel, 324, 124573, 2022.

Zamiri, M.S., MacMillan, B., Marica, F., Guo, J., Romero-Zerón, L., Balcom, B.J., Petrophysical and geochemical evaluation of shales using magnetic resonance relaxation correlation, Fuel, 284, 119014, 2021.

Zamiri, M.S., Marica, F., Romero-Zeron, L., Balcom, B.J., Monitoring shale water uptake using 2D magnetic resonance relaxation

(56) References Cited

OTHER PUBLICATIONS correlation and SPRITE MRI, Chemical Engineering Journal, 428, 131042, 2022.

* cited by examiner

METHOD OF DETERMINING SOLID AND LIQUID COMPONENTS IN SEDIMENTARY ROCKS USING NMR RELAXATION

CROSS-REFERENCE TO RELATED APPLICATIONS

This patent application claims the benefit of U.S. Provisional Patent Application No. 63/324,710, filed on Mar. 29, 2022, which is incorporated herein by reference in its entirety.

FIELD OF THE INVENTION

The present invention relates to determining solid and liquid components in sedimentary rocks using NMR relaxation, and in particular to separation of liquid-like ($T_{2e}$) from solid-like ($T_{2G}$) $^1$H NMR transverse relaxation times in porous media.

SUMMARY

A method is disclosed, according to embodiments, for nuclear magnetic resonance (NMR) measurement on a sample. The method comprises: (a) applying a 180° RF pulse to the sample, thereby yielding an inverted longitudinal magnetization $M_z=-M_0$ away from equilibrium; (b) during a selected inversion recovery time $\tau_1$, allowing $M_z$ to recover towards an equilibrium value of $M_z=M_0$ governed by a time constant $T_1$; (c) after the selected inversion recovery time $\tau_1$, applying a 90° RF pulse for rotating the instantaneous $M_z$ into a transverse plane $M_{x,y}$; (d) at a selected pulse-separation time $\tau_S$, applying a second 90° RF pulse for rotating $M_{x,y}$ within the transverse plane, creating observable magnetization by formation of a solid-echo; (e) sampling with discretized time steps the observable solid-echo magnetization during a time t following the applying of the second 90° RF pulse to acquire signal amplitude measurements as the observable transverse magnetization decays toward equilibrium with magnetization $M_{x,y}=0$, wherein, during the time t, a decay time constant is $T^*_{2G}$; (f) repeating at least once, responsively to a recovery of the sample substantially to equilibrium, steps (a) to (e) with a different selected recovery time $\tau_1$ in step (c); and (g) processing the solid-echo measurements to produce a $T_1$-$T^*_{2G}$ map for use in characterizing the sample, wherein the characterizing includes at least one of determining a structure and determining a plurality of components.

In some embodiments, the solid-like components can comprise at least one of kerogen, bitumen, and a clay hydroxyl of a geologic sample. In some embodiments, the liquid-like components can comprise at least one of a micropore fluid, a meso-macropore fluid, a fluid dissolved in organic matter, and a clay-bound water of a geologic sample.

In some embodiments, it can be that the instrumental deadtime $t_d$ is not greater than 0.01 ms.

In some embodiments, the longitudinal magnetization can be saturated ($M_z=0$) by a series of RF pulses, and/or can be followed by a selected inversion recovery time $\tau_1$, and/or can be followed by rotation into the transverse plane to form a solid-echo.

In some embodiments, the method can additionally comprise using the measurements before and after bitumen extraction of the sample to predict bitumen content and bitumen properties including at least one of asphaltene, resin, aromatic, and saturate fractions of the bitumen in the sample. In some embodiments, the method can additionally comprise using the measurements before and after saturation of the sample with light hydrocarbons to predict expelled bitumen content and bitumen properties including at least one of asphaltene, resin, aromatic, and saturate fractions of the bitumen in the sample.

In some embodiments, the sample can comprise bulk crude-oil or bulk bitumen to predict the asphaltene, resin, aromatic, and/or saturate fractions of the bulk crude-oil or bulk bitumen.

In some embodiments, the inversion can be based on 2D inverse Laplace techniques for use in determining structure or components of the sample. In some embodiments, the transverse magnetization $M_{x,y}$ decay can be inverted with one of an exponential function, a Gaussian function, and a sinc-Gaussian kernel function. In some embodiments, the longitudinal magnetization $M_z$ recovery can be inverted with an exponential kernel.

In some embodiments, one or more of the nominal 90° RF pulse can comprise a different tip angle. In some embodiments, one or more of the nominal 180° RF pulse can comprise a different tip angle.

In some embodiments, it can be that one or more of the steps (a) to (g) is correlated with geochemistry data, such as RockEval or LECO, for determining structure or components of the sample.

In some embodiments, the method can be applied to predict NMR-derived geochemical quantities including S1, S2, S1/S2, HI, OI, as well as elemental ratios H/C, H/S, H/O, H/N of elements for the crude-oil or bitumen.

In some embodiments, a distinction between solid-like and liquid-like NMR signal can be determined by a transverse relaxation time being respectively above or below a value of 0.1 ms. In some embodiments, a distinction between solid-like and liquid-like NMR signal can be determined by a viscosity being respectively above or below a value of $10^7$ cP.

A method is disclosed, according to embodiments, for nuclear magnetic resonance (NMR) measurement on a sample. The method comprises: (a) measuring liquid-like components using an inversion-recovery CPMG sequence, without dephasing from the inhomogeneous magnetic field; (b) processing the measurements of the liquid-like components to produce a $T_1$-$T_{2e}$ map of the liquid-like components; (c) measuring solid-like components using an inversion-recovery solid-echo sequence, with minimal instrumental deadtime; (d) processing the measurements of the liquid-like components to produce a $T_1$-$T^*_{2G}$ map of the solid-like components; (e) combining the $T_1$-$T_{2e}$ map with the $T_1$-$T^*_{2G}$ map using a $T_2$ cutoff to create a spliced $T_1$-$\{T^*_{2G}; T_{2e}\}$ map; and (f) analyzing the $T_1$-$\{T^*_{2G}; T_{2e}\}$ map for use in characterizing the sample, wherein the characterizing includes at least one of determining a structure and determining a plurality of components.

In some embodiments, the solid-like components can comprise at least one of kerogen, bitumen, and a clay hydroxyl of a geologic sample. In some embodiments, the liquid-like components can comprise at least one of a micropore fluid, a meso-macropore fluid, a fluid dissolved in organic matter, and a clay-bound water of a geologic sample.

In some embodiments, it can be that the instrumental deadtime $t_d$ is not greater than 0.01 ms.

In some embodiments, the longitudinal magnetization can be saturated ($M_z=0$) by a series of RF pulses, and/or can be followed by a selected inversion recovery time $\tau_1$, and/or can be followed by rotation into the transverse plane to form a solid-echo.

In some embodiments, the method can additionally comprise using the measurements before and after bitumen extraction of the sample to predict bitumen content and bitumen properties including at least one of asphaltene, resin, aromatic, and saturate fractions of the bitumen in the sample. In some embodiments, the method can additionally comprise using the measurements before and after saturation of the sample with light hydrocarbons to predict expelled bitumen content and bitumen properties including at least one of asphaltene, resin, aromatic, and saturate fractions of the bitumen in the sample.

In some embodiments, the sample can comprise bulk crude-oil or bulk bitumen to predict the asphaltene, resin, aromatic, and/or saturate fractions of the bulk crude-oil or bulk bitumen.

In some embodiments, the inversion can be based on 2D inverse Laplace techniques for use in determining structure or components of the sample. In some embodiments, the transverse magnetization $M_{x,y}$ decay can be inverted with one of an exponential function, a Gaussian function, and a sinc-Gaussian kernel function. In some embodiments, the longitudinal magnetization $M_z$ recovery can be inverted with an exponential kernel.

In some embodiments, one or more of the nominal 90° RF pulse can comprise a different tip angle. In some embodiments, one or more of the nominal 180° RF pulse can comprise a different tip angle.

In some embodiments, it can be that one or more of the steps (a) to (g) is correlated with geochemistry data, such as RockEval or LECO, for determining structure or components of the sample.

In some embodiments, the method can be applied to predict NMR-derived geochemical quantities including S1, S2, S1/S2, HI, OI, as well as elemental ratios H/C, H/S, H/O, H/N of elements for the crude-oil or bitumen.

In some embodiments, a distinction between solid-like and liquid-like NMR signal can be determined by a transverse relaxation time being respectively above or below a value of 0.1 ms. In some embodiments, a distinction between solid-like and liquid-like NMR signal can be determined by a viscosity being respectively above or below a value of $10^7$ cP.

BACKGROUND

Currently there is no reliable method to interpret the $^1$H NMR $T_2$ relaxation (i.e., transverse relaxation) of porous geological media containing both liquid-like and solid-like components without losing information about one of the components. This has an impact on the interpretation of commercial NMR core and log analysis of organic-rich shales, such as shale oil and shale gas, where $T_1$-$T_2$ relaxation maps are routinely used to identify sweet spots and producibility of the hydrocarbon reservoir.

The $^1$H NMR $T_2$ relaxation (i.e., transverse relaxation) of a hydrogen-bearing liquid in a porous medium with large (>100 nm) pores is known to decay with a multi-exponential distribution of relaxation times $T_{2e}$. On the other hand, a hydrogen-bearing solid phases such as kerogen and clay hydroxyls are known to decay with a multi-Gaussian distribution of relaxation times $T_{2G}$ [1, 2, 3]. Liquids under nano-pore (<1 nm) confinement (i.e., solvated liquids, or dissolved liquids) in kerogen may also decay with a multi-Gaussian distribution of $T_{2G}$ times, which is a result of residual dipolar coupling from the highly anisotropic rotational motion of the liquid under nano-confinement [3].

The presence of both multi-exponential ($T_{2e}$) and multi-Gaussian ($T_{2G}$) decay in the transverse magnetization $M_{CPMG}(t)$ from a CPMG (Carr-Purcell-Meiboom-Gill) sequence causes complications in the interpretation of $T_2$ relaxation. More specifically, forcing a multi-exponential decay on an underlying Gaussian decay results in a poor fit to $M_{CPMG}(t)$, which typically overestimates the total porosity and yields non-physical relaxation times [3]. Meanwhile, fitting a multi-Gaussian decay on an underlying exponential decay results in a poor fit to $M_{CPMG}(t)$ which typically underestimates the total porosity and yields non-physical relaxation times. The presence of both exponential and Gaussian decays therefore creates a conundrum about what kernel function (exponential or Gaussian) to use in the inversion.

One reported method to deal with this scenario is to fit $M_{CPMG}(t)$ using both multi-exponential and multi-Gaussian kernels, but with a sigmoidal penalty function which favors multi-exponential decay at long times and multi-Gaussian decay at short times [4,5].

The limitation with this method is that it introduces four additional parameters into the inversion, and it has not been adapted to $T_1$-$T_2$ mapping.

Another complication with solid-like signal is that the $T_{2G}$ relaxation times are typically shorter ($T_{2G} \approx 0.01$ ms) than the shortest echo-spacing $t_E$ of a CPMG sequence. Typically, minimum $t_E \approx 0.1$ ms for 2 MHz relaxometers, while minimum $t_E \approx 0.03$ ms for 20 MHz relaxometers. One solution is to use an FID (free induction decay) sequence instead of a CPMG sequence. The dead times $t_d$ of an FID are typically $t_d \approx 0.07$ ms at 2 MHz and $t_d \approx 0.01$ ms at 20 MHz; this is a huge advantage for detecting solid-like signal at 20 MHz. The complication with FID is that the apparent relaxation time $\tau_2$ contains both the intrinsic relaxation time $\tau_2$ and dephasing in the inhomogeneous magnetic field. This implies that the relaxation time of liquid-like signal with long $T_{2e} \gg 1$ ms is piled up at $T^*_{2e} \approx 1$ ms, meaning that the only intrinsic petrophysical information retained about the liquid-like signal is the liquid-filled porosity. On the other hand, relaxation times of solid-like signals with short $T_{2G} \approx 0.01$ ms are not affected by dephasing in the inhomogeneous magnetic field, i.e., $T^*_{2G} \approx T_{2G}$.

In such a scenario, incorporating the $T_1$ dimension in the form of a 2D $T_1$-$T^*_2$ map has many advantages. There have been several reports of 2D $T_1$-$T^*_2$ mapping using recovery-FID sequences [6,7], and imaging sequences [8], which make use of multi-exponential inversions for both $T_1$ and $T^*_2$ dimensions. The difference between $T_1$-$T^*_2$ maps and $T_1$-$T_2$ is readily apparent in organic-rich shale [6], including the shortening of long $T_{2e} \gg 1$ ms components due to dephasing in the inhomogeneous magnetic field. Nevertheless, at sufficiently high magnetic fields (>20 MHz), fluid typing in unconventional cores is possible using $T_1$-$T^*_2$ maps [6,9], given the $T_1$ contrast between hydrocarbons and water. At Larmor frequencies ≈20 MHz, it has been shown that $T_1$ is larger for producible hydrocarbons than for clay-bound water and interparticle water [10, 11, 12]; likewise it is generally accepted that $T_1$ is larger for kerogen than for clay hydroxyls [13, 14, 15, 16], although $T_1$ for kerogen does depend on maturity [10] and $T_1$ for clay hydroxyls depends on compaction [1].

There have also been reports of 2D $T_1$-$T^*_2$ inversions that separate liquid-like multi-exponential ($T^*_{2e}$) components from solid-like multi-Gaussian ($T^*_{2G}$) (or sinc-Gaussian) components [17,18], which can also be applied in rapid $T^*_1$-$T^*_2$ sequences [19]. The 2D inversions start with a non-linear parametric fit of a single exponential at long times to isolate the multi-Gaussian components at short times. While a single exponential at long times is a good approximation at high magnetic fields (≈100 MHz), where internal gradients dominate $T^*_{2e}$ [20], this is not generally the case at lower magnetic fields (<20 MHz) where the distribution in $T^*_{2e}$ depends on the magnetic field inhomogeneity across the sample.

While 2D $T_1$-$T^*_2$ maps are effective in unconventional cores at sufficiently high magnetic fields (>20 MHz), the use of 2D $T_1$-$T_2$ maps are still required for logs which are acquired in grossly-inhomogeneous low magnetic fields (≈2 MHz) [21]. For conventional rocks at low magnetic fields (≈2 MHz), it has been shown that $T_1/T_{2e}$ of the hydrocarbon phase increases with oil-wetness, implying that $T_1/T_{2e}$ is a good measure of wettability in cores and well logs [22]. In unconventional organic-rich shale at low fields (≈2 MHz), the high $T_1/T_{2e}$=3⇔6 ratio of producible light oil is used for fluid typing in cores and logs [23, 24, 25, 26, 27, 28, 29, 30, 31], since, by contrast, water in clays has a lower $T_1/T_{2e}$≈2 ratio. These well logging techniques require $T_1$-$T_2$ maps rather than $T_1$-$T^*_2$ maps since $T_{2e}$≈$t_{180}$≈0.02 ms (where $t_{180}$ is the RF pulse duration) is prohibitively short for well logging tools [21].

Techniques have been reported to acquire $T_2$ instead of $T^*_2$ for liquid-like signal, while still capturing the solid-like signal $T^*_{2G}$≈$T_{2G}$. One way to do this is to combine (i.e., splice) the FID and CPMG data [5, 16, 32], and then use a sigmoidal penalty function to invert for $T^*_{2G}$ and $T_{2e}$ [4]. The motivation for these techniques originates from adding $M_{FID}(0)$ from FID to $M_{CPMG}(t)$ from CPMG [33], thereby gaining a constraint at short times in the $T_{2e}$ inversion. One complication from splicing FID and CPMG data [5, 16, 32, 34] is that the $M_{FID}(t)$ and $M_{CPMG}(t)$ do not always join at the expected time, implying that splicing in the time domain is not a universal approach. One cause for this mismatch is the potential inclusion of pseudo-$T_{1\rho}$ effects in CPMG decays with short $t_E$; this arises from high RF (radio frequency) duty-cycles, which leads to pseudo spin-locking effects [35].

Other advances in this field include the use of the solid-echo sequence [36, 37, 38, 39], and the solid-echo train [40,41]. The original motivation for preferring the solid-echo over the FID is that the deadtime $t_d$ of the FID necessitates an extrapolation to time-zero in the inversion. On the other hand, the solid-echo results in the detection of a maximum in the echo, which leads to a more stable inversion. The inversion of the solid-echo data currently consists of a parametric fit of a single Gaussian component $T^*_{2G}$ plus two exponentials $T^*_{2e}$ [38,39], without adaptation to 2D $T_1$-$T^*_2$ mapping. Meanwhile, the inversion of the solid-echo train (and magic-echo train) data currently consists of inverting with multi-exponentials 2D $T_1$-$T_{2e}$ [40, 41, 42, 43], without the inclusion of multi-Gaussian 2D $T_1$-$T_{2G}$ components. Nevertheless, a multivariate analysis of 2D $T_1$-$T_{2e}$ maps with a solid-echo train has been shown to correlate well with geochemical properties of raw oil shales and spent oil shale samples exposed to a range of pyrolysis conditions [42]. The oil content determined from multi-exponential 2D $T_1$-$T_{2e}$ maps in oil shale have also been shown to correlate well with the oil content determined from the Dean-Stark method [44,45]. Furthermore, it was also shown that both Dean-Stark and NMR show systematically higher oil content in preserved cores compared to RockEval or thermal desorption-gas chromatography which suffer from loss in oil content (i.e., loss in RockEval S1 signal) during sample preparation [44,45]. Finally, it has also been shown that integrating multi-step solvent extraction experiments with 2D $T_1$-$T_{2e}$ maps enhances the petrophysical interpretation of shale [46].

DETAILED DESCRIPTION OF THE ILLUSTRATED EMBODIMENTS

Figure 1:
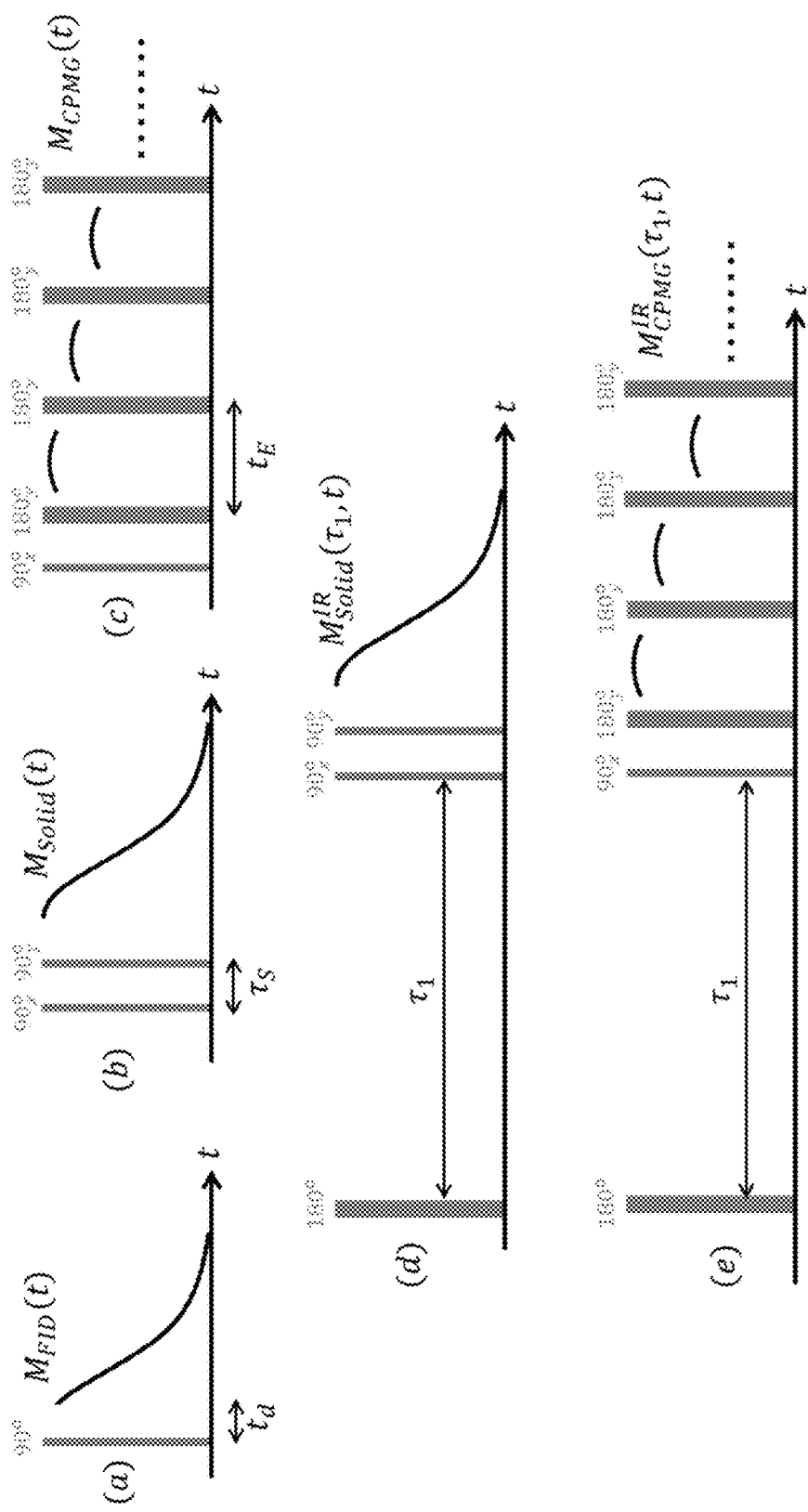
FIG. 1. Illustration of pulse sequences used (grey) and resulting magnetization (black), including (a) FID (free induction decay) $M_{FID}(t)$, (b) solid-echo $M_{Solid}(t)$, (c) CPMG (Carr-Purcell-Meiboom-Gill) $M_{CPMG}(t)$, (d) inversion-recovery solid-echo $M_{Solid}^{IR}(\tau_1, t)$, and (e) inversion-recovery CPMG $M_{CPMG}^{IR}(\tau_1, t)$.

Symbols and abbreviations appearing in the disclosure are to be understood in accordance with the following table.

a. Symbols $\alpha$ Regularization parameter in ILT
e Subscript to denote exponential decay, i.e., liquid-like
G Subscript to denote Gaussian decay, i.e., solid-like
* Superscript to denote dephasing in inhomogeneous magnetic field
N Echo number in CPMG echo train
$n_{SVD}$ Number of singular values in ILT
$\chi$ Mismatch between magnetization data and ILT fit, i.e., square root of $\chi^2$
$\chi_{opt}$ Optimal $\chi$ according to BRD
div Division, i.e., logarithmic ($\log_{10}$) bin spacing
$\Delta_\chi$ Magnetic susceptibility contrast between fluid and solid
$f_0$ $^1$H resonance frequency, a.k.a. Larmor frequency ($f_0 = \omega_0/2\pi$)
$\Delta f_0$ Full width of the FID spectrum
$B_0$ Magnetic field strength
$\Delta B_0$ Half-width of the magnetic field inhomogeneity
G(t) Autocorrelation function for lag-time t
H Hydrogen nucleus
$HI_{NMR}$ NMR hydrogen index
$k_{1,2}$ Kernel function for $T_1$ or $T_2$ in ILT
$k_{klink}$ Klinkenberg corrected $N_2$ gas permeability
K Kernel vector (or matrix) in ILT
P Probability density function
$\Sigma P$ Cumulative of probability density function
pk Subscript for relaxation time at the peak, i.e., mode, of the distribution
pu Porosity units, i.e., percent bulk volume of core
$\phi$ Signal intensity in porosity units
$\Delta \phi$ Difference in $\phi$
M(t) Magnetization decay for time t
$M_{CPMG}$ Magnetization data from CPMG sequence
$M_{Solid}$ Magnetization data from solid-echo sequence
$M_{FID}$ Magnetization data from FID sequence
$m_H$ Mass of $^1$H per mass of rock
$\rho_W$ Density of water
$\rho_{B\_dry}$ Bulk density of dry rock
$t_E$ Echo-spacing of CPMG
$t_d$ Dead-time following RF pulse
$t_\theta$ Time of maximum signal in the solid-echo
$t_{max}$ Maximum time in CPMG echo train
$t_{90}$ Duration of the 90° RF pulse
$t_{180}$ Duration of the 180° RF pulse
$t_{DW}$ Dwell time of data acquisition
$T_1$ Longitudinal (or spin-lattice) nuclear relaxation time
$T_2$ Transverse (or spin-spin) nuclear relaxation time
$T_{2cut}$ $T_2$ cutoff separating solid-like from liquid-like relaxation
$\tau_e$ Molecular correlation time
$\tau_1$ Inversion recovery time
$\tau_S$ Time between pulses in solid-echo
$\Delta \omega^2$ Second moment (i.e. strength) of the $^1$H-$^1$H interaction
$\Delta \omega$ Square root of $\Delta \omega^2$
$\omega_0$ $^1$H resonance frequency (a.k.a. Larmor frequency)
wt % Weight percent
S1, S2, HI, $T_{max}$ RockEval pyrolysis quantities
TOC Total organic carbon b. Abbreviations

BRD Butler, Reeds, Dawson
1D One dimensional
2D Two dimensional
CPMG Carr, Purcell, Meiboom, Gill pulse sequence
ASREC As-received core
DRY Dry state of core
SW1 100% water saturated core
SO1 100% heptane saturated core
SVD singular value decomposition
FID Free induction decay
ILT inverse Laplace transform
MD Molecular dynamics
NMR Nuclear magnetic resonance
RF Radio frequency
IR Inversion recovery
SARA Saturates-aromatics-resins-asphaltenes A new 2D inversion methodology is disclosed which: (1) captures the liquid-like $T_{2e}$ components without dephasing from the inhomogeneous magnetic field, (2) captures the solid-like $T^*_{2G} \approx T_{2G}$ components with minimal deadtime using a solid-echo sequence, (3) does the liquid-solid decomposition with a minimal number of additional free parameters, and (4) is easily adaptable to $T_1$-$T_2$ mapping. The novel NMR method described here satisfies these four requirements and is demonstrated on organic-rich chalks from a NGL (natural gas liquids) reservoir of low (Klinkenberg-corrected) permeability $k_{klink}\approx 0.01$ mD and high (total organic carbon) TOC≈11 wt % of Type II-S [47, 48, 49, 50, 51, 52, 53, 54], using a 20 MHz $^1$H NMR relaxometer. The liquid-like ($T_1$-$T_{2e}$ maps) components of water-saturated versus heptane-saturated samples show a clear contrast in $T/T_{2e}$ ratio between water and heptane in the micro/meso-macro pores, which shows potential for improved fluid typing and saturation in organic-rich chalk, and gives insights into the surface relaxivity and diffusive coupling of the pore network. The solid-like ($T_1$-$T^*_{2G}$ maps) components are used to quantify the clay minerals (hydroxyapatite and kaolinite), the kerogen content, and solvent-extracted bitumen versus bitumen expelled from kerogen due to swelling from dissolved heptane.

A novel 2D pulse sequence is used, comprising $T_1$ encoding plus a solid-echo to acquire a $T_1$-$T^*_{2G}$ map. This is distinct from previous reports of 2D pulse sequences comprising $T_1$ encoding plus FID to acquire a $T_1$-$T^*_2$ map [17,18]; the advantage of the solid-echo is that it detects ≈15% more signal from the solid-like components than an FID, which is a result of the shorter effective deadtime for the spin-echo. The novel 2D pulse sequence is also distinct from previous reports of 2D pulse sequences comprising $T_1$ encoding plus a solid-echo train to acquire a $T_1$-$T_2$ map [40,41]; the advantage of the solid-echo is the ≈10 times greater data-sampling rate compared to the solid-echo train, which allows for greater accuracy in the inversion of the solid-like components.

Theoretical Basis

The transverse relaxation function, specifically the Free Induction Decay (FID), can be expressed as follows [55]:

$$\frac{M(t)}{M(0)} = \exp\left[-3\int_0^t (t-t')G(t')dt'\right] \quad (1)$$

where M(t) is the transverse magnetization, M(0) is the signal amplitude (in porosity units) at t=0, and G(t) is the autocorrelation function for $^1$H-$^1$H dipole-dipole interactions [56]. The second moment, defined as the strength of the $^1$H-$^1$H dipole-dipole interaction, is given by $\Delta\omega^2=3G(0)$. The liquid-like regime exists in the "motional narrowing regime" $\Delta\omega\tau_c\gg 1$, also known as the "Redfield limit", where $\Delta\omega=\overrightarrow{\Delta\omega^2}$ and $\tau_c$ is the characteristic correlation time of the molecular dynamics. The solid-like regime on the other hand exists in the limit $\Delta\omega\tau_c\gg 1$. Note that for simplicity, Eq. (1) assumes $\omega_0\tau_c\gg 1$ which for bitumen at 35° C. occurs above a viscosity of $\eta>6.6\times 10^3$ cP/$f_0$ for frequency $f_0$ in (MHz) units [57]. For example, at $f_0=20$ MHz, the "slow-motion regime" occurs above $\eta>330$ cP at 35° C., while the "fast-motion regime" occurs below $\eta<330$ cP at 35° C.

For the solid-like signal (kerogen, bitumen, and clay hydroxyls) where $\Delta\omega\tau_c\gg 1$, G(t) does not change much during the relaxation time $T_{2G}$, therefore to a good approximation G(t) can be set to G(0) within the integral:

$$\frac{M(t)}{M(0)} \approx \exp\left[-3G(0)\int_0^t (t-t')dt'\right] = \exp\left[-3G(0)\frac{t^2}{2}\right] = \exp\left[-\frac{t^2}{2T_{2G}^2}\right] \quad (2)$$

yielding a Gaussian decay with respect to t. The Gaussian relaxation time $T_{2G}$ is given by $1/T_{2G}^2=\Delta\omega^2$.

For the liquid-like signal (which includes pore fluids, dissolved fluids and clay-bound water) where $\Delta\omega\tau_c\ll 1$, G(t) decays to 0 within the relaxation time $T_{2e}$, therefore to a good approximation the limit of the integral can be taken to infinity:

$$\frac{M(t)}{M(0)} \approx \exp\left[-t\int_0^\infty 3G(t')dt'\right] = \exp\left[-\frac{t}{T_{2e}}\right] \quad (3)$$

yielding an exponential decay with respect to t. The exponential relaxation time $T_{2e}$ is given by $$1/T_{2e} = \int_0^\infty 3G(t')dt' = 3G(0)\tau_c = \Delta\omega^2\tau_c.$$

Note that one does not expect a sharp transition from exponential decay (where $\Delta\omega\tau_c\ll 1$) to Gaussian decay (where $\Delta\omega\tau_c\gg 1$). In other words, the functional form of the decay in M(t) is more complex in the transition regime where $\Delta\omega\tau_c\approx 1$. In the case of bitumen, one can determine the viscosity at which the transition $\Delta\omega\tau_c\approx 1$ occurs. Using the value $\Delta\omega/2\pi\approx 20$ kHz for the ubiquitous $^1$H-$^1$H dipole-dipole interactions in bitumen, and assuming the empirical relation $\tau_c\approx\sqrt{\eta/T}$ for viscous fluids [57], predicts a transition at $\eta\approx 10^7$ cP at 35° C. In other words, bitumen acquires a solid-like Gaussian decay above $\eta>10^7$ cP at 35° C. Note that by contrast, for typical petrophysical systems $T_1$ remains liquid-like (i.e., exponential) above $\Delta\omega\tau_c\gg 1$.

Pulse Sequences

The pulse sequences involved in the methodology are illustrated in FIG. 1, where 90° and 180°, refer to the tipping angles of the RF pulses, and the subscripts x, y indicate the constraint that the phases of the RF pulses be kept in quadrature for both CPMG and solid echo. The signal was averaged over 16 scans (with phase-cycling) for each sequence, which for water-saturated cores resulted in a SNR≈500 (signal-to-noise ratio). The solid-echo and FID measurements of the empty sample holder indicated an equivalent background signal of ≈0.1 pu (for BV≈3 cm$^3$).

Dephasing in an inhomogeneous magnetic field has the following effect on the transverse relaxation [20, 58]:

$$\frac{1}{T_2^*} \approx \frac{1}{T_2} + \gamma\Delta B_0 + \gamma B_0\Delta\chi \quad (4)$$

where $T^*_2$ is relaxation time from an FID or solid echo, $T_2$ is the intrinsic relation time from CPMG, $\gamma$ is the gyromagnetic ratio for $^1$H ($\gamma/2\pi=42.57$ MHz/T), $B_0$ is the magnetic field strength, $\Delta B_0$ is the half-width of the magnetic field inhomogeneity across the 15 mm×20 mm sample, and $\Delta\chi$ is the susceptibility contrast between fluid and mineral. The dephasing term $\gamma\Delta B_0$ results in a full-width at half-maximum of $\Delta f_0\approx 1/\pi T^*_2\approx 500$ Hz for the water calibration sample of size 15 mm×20 mm. Saturated cores of the same size also show $\Delta f_0\approx 500$ Hz, implying that the $\gamma B_0\Delta\chi$ term is negligible compared to $\gamma\Delta B_0$. The net effect is that all the liquid-like signal with $T_{2e}\gg 1$ ms is piled up at $T^*_2\approx 1/\pi\Delta f_0\approx 0.7$ ms.

The RF pulses are $t_{90}=0.004$ ms and $t_{180}=0.008$ ms in duration. A dwell-time of $t_{DW}=0.4$ μs is used. The deadtime of the FID in FIG. 1 (a) is calculated using $t_d=t_{90}/2+t_{rdt}=0.01$ ms, where $t_{rdt}$=0.008 ms is the ring-down time following the RF pulse. The discretized time t for the FID magnetization $M_{FID}(t)$ is given by $t=t_d+nt_{DW}$, where $1 \leq n \leq 10,000$ is the datapoint number.

For the solid-echo $M_{Solid}(t)$ in FIG. 1 (b), the spacing $\tau_S$ between the two RF pulses is $\tau_S$=0.005 ms [36,37]. Unlike the FID however, the deadtime $t_d$ for the solid-echo is not easily defined when is $\tau_s \approx t_{90}$. In the case of a spin-echo, it is known that the spin-echo maximum occurs at time $\tau' \approx \tau + 2t_{90}/\pi$ after the end of the 180° pulse, where the additional delay $2t_{90}/\pi$ is a consequence of the magnetic field inhomogeneity $\Delta B_0$ [21].

A similar delay should also occur for the solid-echo, i.e., $\tau'_s \approx \tau_S + 2t_{90}/\pi \approx 0.008$ ms after the 90°$_y$ pulse. The extended $\tau'_s \approx 0.008$ ms should compensate for the ringing deadtime $t_{rdt}$=0.008 ms, resulting in detection of the solid-echo maximum. However, since the exact delay in $\tau'_s$ for the solid-echo is not known, for practical purposes we instead compute an effective deadtime for the solid-echo based on (a) the known deadtime time $t_d$=0.01 ms for the FID, and (b) the criteria that $M_{Solid}(t)$ cannot be larger than $M_{FID}(t)$ at any given time. This results in an effective deadtime $t_d$=0.004 ms for the solid-echo.

The discretized time t for the CPMG magnetization $M_{CPMG}(t)$ in FIG. 1 (c) is given by $t=nt_E$ with echo-spacing $t_E$. The shortest possible $t_E$ of the instrument is $t_E$=0.03 ms; however, a longer $t_E$=0.2 ms is used instead to avoid solid-like signal with a Gaussian decay. Due to hardware limitations, the maximum number of echoes possible at $t_E$=0.2 ms is 5000, i.e., $1 \leq n \leq 5000$, implying a maximum CPMG decay time of $t_{max}$=1000 ms. In the present case, a $t_{max}$=600 ms was sufficient to fully decay the liquid-like signal. On the other hand, the maximum number of echoes possible using the minimum echo spacing of $t_E$=0.03 ms is 3000, i.e., $1 \leq n \leq 3000$, implying $t_{max}$=90 ms, which is generally insufficient for full decay of the liquid-like signal. The CPMG $T_{2e}$ of the liquid-like signal did not decrease when increasing the echo spacing from $t_E$=0.03 ms to $t_E$=0.2 ms, indicating that internal gradient effects were absent for $t_E \leq 0.2$ ms.

The inversion recoveries in FIG. 1 (d) and FIG. 1 (e) were acquired with 32 log-spaced increments in recovery time $\tau_1$ ranging from 0.03 ms$\leq \tau_1 \leq$3000 ms.

All magnetization data M(t) and porosities $\phi$ are reported in porosity units (pu), where pu$\equiv$% BV (bulk volume of core plug), and the NMR hydrogen index is taken to be $HI_{NMR}$1 throughout, which for water and heptane is a good approximation. For convenience the solid components are also reported in (pu) using $HI_{NMR}$=1, which as shown below can then be readily converted to the more common units of mg-H/g-rock (i.e., mg of $^1$H per g of rock). We specify porosities for liquids $\phi_e$ (i.e., with exponential decay), solids $\phi_G$ (i.e., with Gaussian decay), and total $\phi_T$=$\phi_e$+$\phi_G$. The units of the y-axis of the $T_2$ distributions are in (pu/div), which stands for porosity unit per division. A division div=$\log_{10}(T_{2,i+1})$−$\log_{10}(T_{2,i})$ is the logarithmic bin spacing, which is independent of index "i". This unit convention ensures that a square distribution a decade wide and unit height has an area of 1 pu.

Splice Workflow

Figure 2:
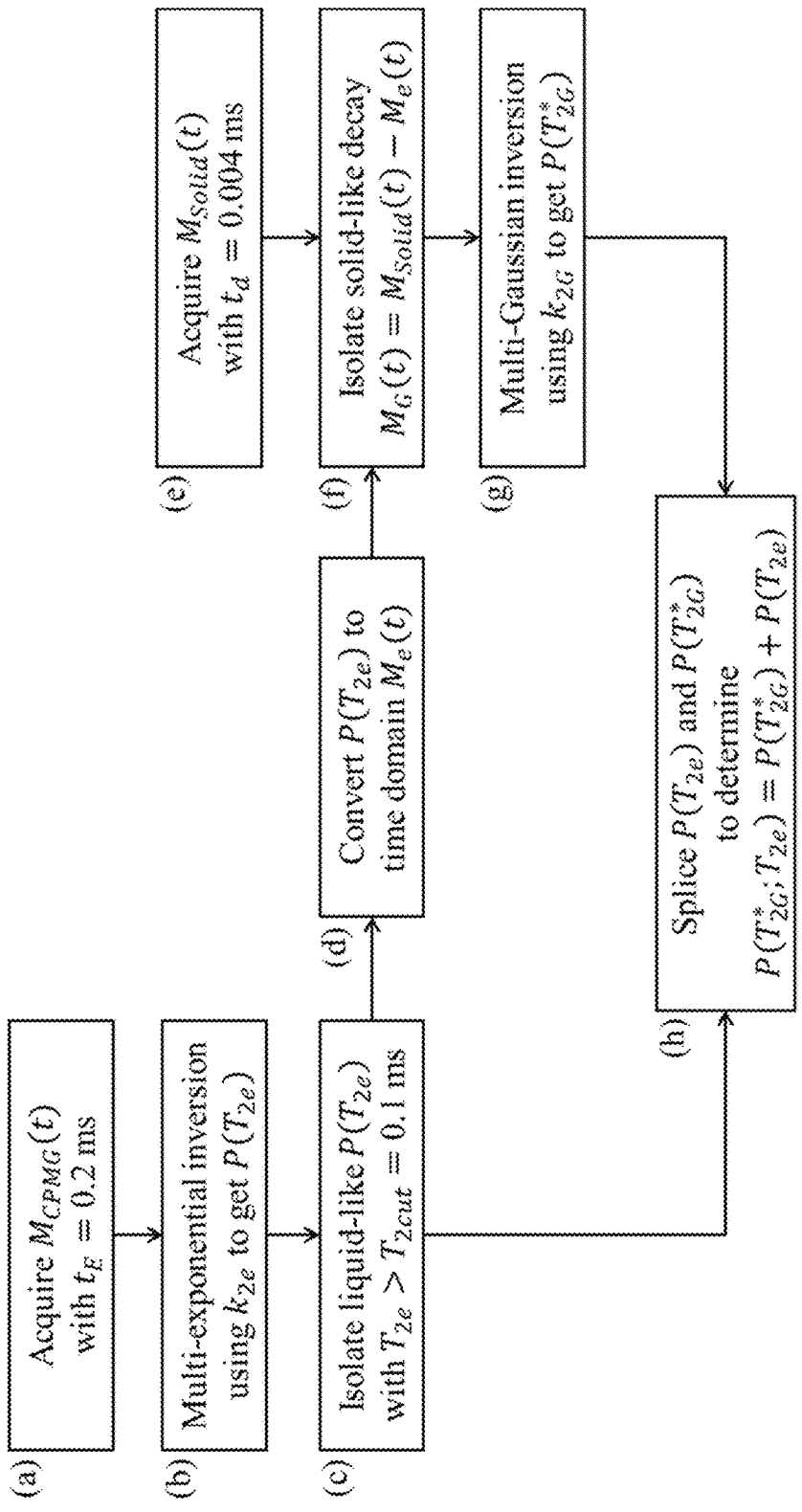
FIG. 2. A workflow to determine the spliced 1D P($T^*_{2G}$; $T_{2e}$) distribution. The liquid-like distribution P($T_{2e}$) is determined from a multi-exponential inversion of the CPMG magnetization $M_{CPMG}(t)$. The multi-exponential distribution P($T_{2e}$) (where only components $T_{2e}$>$T_{2cut}$=0.1 ms are retained) is converted back to the time domain $M_e(t)$ and subtracted from the solid-echo decay $M_{Solid}(t)$, resulting in the solid-like decay alone $M_G(t)$=$M_{Solid}(t)$−$M_e(t)$. A multi-Gaussian inversion is then applied to $M_G(t)$, resulting in the solid-like distribution P($T^*_{2G}$). The two distributions are spliced together to form P($T^*_{2G}$; $T_{2e}$), which fully captures both the liquid-like ($T_{2e}$) and solid-like ($T^*_{2G}$) relaxation components.

The novel workflow is illustrated in FIG. 2, which splices the liquid-like relaxation $T_{2e}$ from $M_{CPMG}(t)$, with the solid-like relaxation $T^*_{2G}$ from $M_{Solid}(t)$. The steps in FIG. 2 are as follows:

(a) The CPMG magnetization $M_{CPMG}(t)$ (where $t=nt_E$ for echo number n) is acquired with an intentionally long $t_E$=0.2 ms to avoid any Gaussian components.

(b) A multi-exponential inversion with kernel function $k_{2e}$ is applied to $M_{CPMG}(t)$, resulting in the distribution $P(T_{2e})$.

(c) The liquid-like components of the distribution $P(T_{2e})$ is determined, where only the components $T_{2e}>T_{2cut}$=0.1 ms are retained.

(d) The liquid-like components $P(T_{2e})$ are converted back to time domain $M_e(t)$.

(e) The solid-echo magnetization $M_{Solid}(t)$ (where $t=t_d+nt_{DW}$ for dwell-time $t_{DW}$ and datapoint number n) is acquired with the shortest possible deadtime $t_d$=0.004 ms to capture all the Gaussian components.

(f) The solid-like signal is isolated $M_G(t)=M_{Solid}(t)-M_e(t)$, where only the positive data is retained, i.e., $M_G(t)$=max{$M_G(t)$, 0}, i.e., only the portion of the $M_{Solid}(t)$ that is in excess of the (extrapolated) exponential response $M_e(t)$ is retained.

(g) A multi-Gaussian inversion with kernel function $k_{2G}$ is applied to $M_G(t)$, resulting in the distribution $P(T^*_{2G})$.

(h) The liquid-like $P(T_{2e>})$ and solid-like $P(T^*_{2G})$ components are spliced together, resulting in total distribution $P(T^*_{2G}; T_{2e})=P(T^*_{2G})+P(T_{2e})$.

Figure 3:
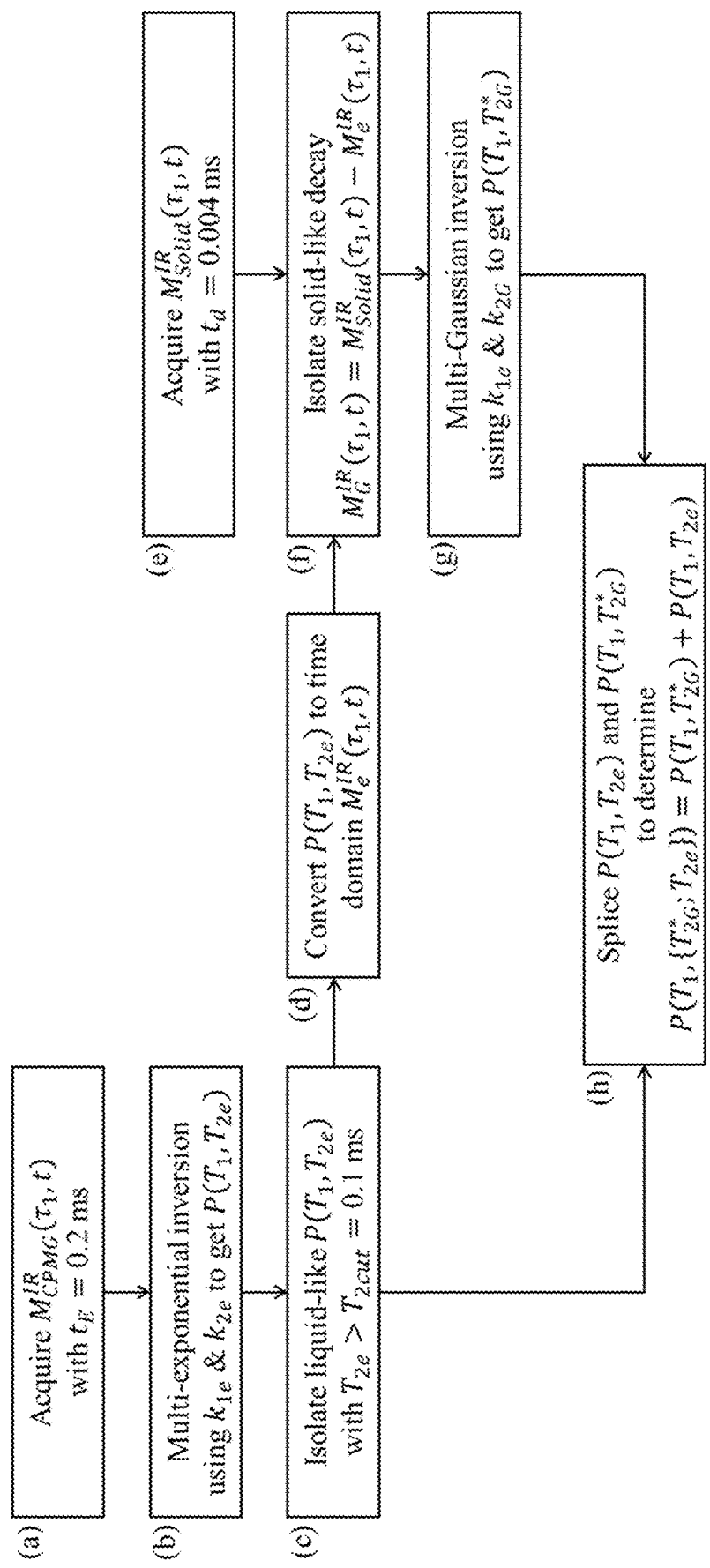
FIG. 3. Same as FIG. 2, but for the 2D splice inversion.

A straight-forward extension of the above workflow to $T_1$-$T_2$ mapping is shown in FIG. 3, resulting in the full distribution $P(T_1, \{T^*_{2G}; T_{2e}\})$, a.k.a. the $T_1$-$\{T^*_{2G}; T_{2e}\}$ map.

Inversion Algorithm

The inversion algorithm for either 1D $T_2$ or 2D $T_1$-$T_2$ is based on the "inverse Laplace transform" (or technically speaking, a Fredholm integral of the first kind) outlined in [59,60]. For the 1D $T_2$ case, the generalized equation relating the measured magnetization M(t) to the distribution $P(T_2)$ is given by the discrete form of:

$$M(t)=\int k_2(t,T_2)P(T_2)dT_2 \qquad (5)$$

The objective is to determine $P(T_2)$ using the following relation:

$$P=\operatorname{argmin}\{\|M-KP\|^2+\alpha\|P\|^2\}, \text{ for } P \geq 0 \text{ (pu/div)} \qquad (6)$$

where M(t)$\equiv$M and $P(T_2)\equiv$P are vectors, kernel K is a matrix, and the Tikhonov regularization parameter $\alpha$ is a scalar, with positivity constraint $P \geq 0$. The supplementary material of [61] provides more details for how to implement the 1D inversion.

The multi-exponential kernel function $k_{2e} \equiv K$ is given by:

$$k_{2e}(t, T_{2e}) = \exp\left(-\frac{t}{T_{2e}}\right) \qquad (7)$$

For the CPMG measurement $M_{CPMG}(t)$, the discretized t is given by $t=nt_E$ with echo-spacing $t_E$=0.2 ms and echo number n.

The multi-Gaussian kernel function $k_{2G}$ is given by:

$$k_{2G}(t, T^*_{2G}) = \exp\left(-\frac{(t-t_0)^2}{2T^{*2}_{2G}}\right) \qquad (8)$$

For the solid-echo component $M_G(t)$, the discretized t is given by $t=t_d+nt_{DW}$ with dead-time $t_d$, dwell-time $t_{DW}$=0.4 µs and data number n. $t_0$ is the time of maximum signal in the solid-echo; it is generally considered a free parameter, however for purposes of illustration herein it is fixed to $t_0=t_d$ given that $M_G(t)$ is flat at early times. Note that fixing $t_0=t_d$ implies that the inversion results are independent of $t_d$.

For the 2D $T_1$-$T_2$ case, the generalized equation relating the measured magnetization $M(\tau_1, t)$ to the distribution $P(T_1, T_2)$ is given by the discrete form of:

$$M(\tau_1,t)=\iint k_1(\tau_1,T_1)k_2(t,T_2)P(T_1,T_2)dT_1dT_2 \qquad (9)$$

The multi-exponential kernel function $k_{1e}$ used for the inversion recovery (IR) sequences $M_{CPMG}^{IR}(\tau_1, t)$ and $M_G^{IR}(\tau_1, t)$ is given by:

$$k_{1e}(\tau_1, T_1) = 1 - 2\exp\left(-\frac{\tau_1}{T_1}\right) \qquad (10)$$

where $\tau_1$ is the (discrete) inversion-recovery time. A saturation recovery (SR) sequence could be used instead, in which case the kernel function $k_{1e}$ is given by:

$$k_{1e}(\tau_1, T_1) = 1 - \exp\left(-\frac{\tau_1}{T_1}\right) \qquad (11)$$

The 1D $T_{2e}$ and 1D $T_{2G}$ inversions were processed with 250 log-spaced bins ranging from $10^{-3} \leftrightarrow 10^4$ ms, while the 2D $T_1$-$T_{2e}$ and 2D $T_1$-$T^*_{2G}$ inversions were processed with 250×250 log-spaced bins both ranging from $10^{-3} \leftrightarrow 10^4$ ms. A truncated SVD (singular-value-decomposition) of the kernel matrix K was performed; for computational efficiency, only the largest singular values were kept in the computation. Using a condition number of 1000 results in keeping the largest $n_{SVD}=9$ singular values for the 1D inversions, and $n_{SVD}=52$ singular values for the 2D inversions.

The $\chi$ misfit between SVD data and fit $\chi=\|M-KP\|$ was computed as a function of regularization parameter $\alpha$. The computation is started at a large $\alpha \approx 10^6$, and then reduced at half-decade increments until the optimized $\alpha_e$ is determined when the condition $\chi/\chi_{opt}=1$ is satisfied. The optimum misfit $\chi_{opt}$ is given by $\chi_{opt}=\sigma\sqrt{n_{SVD}}$ where $\sigma$ is the experimental noise, a.k.a. the BRD (Butler-Reeds-Dawson) method. In cases where the condition $\chi/\chi_{opt}=1$ is not achieved, the condition $d \log \chi/d \log \alpha=0.1$ is used instead, a.k.a. the "heel" method.

Experimental

The methodologies in FIG. 1 and FIG. 2 are demonstrated on organic-rich chalks from a NGL (natural gas liquids) reservoir of low $k_{klink} \approx 0.01$ mD and high TOC≈11 wt % of Type II-S [47, 48, 49, 50, 51, 52, 53, 54]. More specifically, the NMR measurements are made on the 913 m and 920 m cores from the NESS 2 well in the Golan Heights, Israel, at 100% water saturation, i.e., at SW1 and at 100% heptane saturation, i.e., at SO1. The cores were dried at 120° C. for 4 days in a vacuum oven (~⅓ bar) to remove the as-received fluids consisting mostly of water in the micro-pores of the micritic chalk [48,49]. The cores were then fully saturated with either water or heptane under 2000 psi hydrostatic pressure, which was applied after pulling a vacuum to remove air from the pores.

The NMR measurements were performed on a benchtop Bruker minispec relaxometer at a Larmor frequency of $\omega_0/2\pi=f_0=20$ MHz for $^1$H, probe diameter clearance of 18 mm, ambient pressure, and sample temperature of 35° C. The cores were resized from 1"×2" (diameter×length) down to 15 mm×20 mm (bulk volume of BV≈3 cm$^3$), then placed in a 15 mm ID glass tube with a Teflon stopper. The bulk density of the dry cores was measured by caliper, yielding $\rho_{B\_dry} \approx 1.76$ g/cm$^3$ at 913 m, and $\rho_{B\_dry} \approx 1.63$ g/cm$^3$ at 920 m.

The samples for bitumen extraction at 920 m were prepared differently. The core plugs were dried then underwent a "rough crush" by mortar and pestle down to 1⇔3 mm sized fragments. Half of the homogenized fragments were kept unextracted for NMR, while the other half were bitumen extracted. The bitumen extraction procedure was similar to [62], where 9:1 volume mixture of dichloromethane: methanol azeotrope (boiling point of 37.8° C.) was used in a Bailer-Walker extraction unit for two weeks. The bulk volume (BV≈1.5 cm$^3$) for NMR was determined by mass of the dry fragments and known $\rho_{B\_dry}$. The fragments were saturated in the same manner as the core plugs, and the excess surface fluid on the fragments was removed by controlled evaporation and $T_2$ monitoring.

Geochemical analysis of the 920 m core was measured using RockEval-6 Basic pyrolysis [63,64], yielding S1≈3.5 mg_HC/g_rock, S2≈76 mg_HC/g_rock, HI≈725 mg_HC/g_orgC, $T_{max} \approx 424°$ C., and TOC≈10.5 wt %. The LECO method yielded slightly higher TOC≈11.6 wt %, where the rock powder was treated with HCl to remove calcite. Previous publications indicate a high sulfur content of ≈10⇔13 wt % [49].

A novel $^1$H NMR method is disclosed for separating liquid-like signals (micro/meso-macro fluids, clay-bound water, dissolved fluids) from solid-like signals (kerogen, bitumen, clay hydroxyls) based on $T_2$ relaxation. The method detects solid-like signals ($T^*_{2G}$) with minimal dead-time using a solid-echo in a 20 MHz $^1$H NMR relaxometer, and liquid-like signal ($T_{2e}$) using a CPMG measurement with a long echo train. The 1D $T_2$ splice inversion method first separates the solid-like magnetization decay $M_G(t)$ from the liquid-like magnetization decay $M_e(t)$, then splices together the solid-like distribution $P(T^*_{2G})$ with the liquid-like distribution $P(T_{2e})$, resulting in the 1D distribution $P(T^*_{2G}; T_{2e})$. The 1D $T_2$ splice technique is adapted to 2D $T_1$-$T_2$, which utilizes the inversion-recovery solid-echo $M_{Solid}^{IR}(t)$ and inversion-recovery CPMG $M_{CPMG}^{IR}(\tau_1, t)$, resulting in the 2D distribution $P(T_1, \{T^*_{2G}; T_{2e}\})$.

The method is used for analyzing cores from the organic-rich chalks from a NGL (natural gas liquid) reservoir of low $k_{klink} \approx 0.01$ mD and high TOC≈11 wt % of Type II-S in the Golan Heights, Israel. The cores were dried then fully saturated with either water or heptane, followed by NMR measurements. A set of cutoffs are applied to the resulting 2D $T_1$-$\{T^*_{2G}; T_{2e}\}$ maps to separate the liquid-like components into three regions: micro\meso-macro pore fluid (water or heptane), clay-bound water, and fluids (water or heptane) dissolved in bitumen. The pore network region shows diffusive coupling effects between the micro pores and the meso-macro pores, the extent of which is a function of the amount of bitumen blocking. The heptane in the pore network has a larger $T/T_{2e} \approx 8.5$ than water $T/T_{2e} \approx 2.5$, which shows potential for improved fluid typing and hydrocarbon saturation in organic-rich chalks.

A set of cutoffs are also applied to the 2D $T_1$-$\{T^*_{2G}; T_{2e}\}$ maps to separate solid-like components into three regions: kerogen/bitumen with $T/T^*_{2G} \approx 3700 \Leftrightarrow 4500$, bitumen/hydroxyapatite with $T_1/T^*_{2G} \approx 1300 \Leftrightarrow 2000$, and clay hydroxyls with $T_1/T^*_{2G} \approx 100 \Leftrightarrow 250$. The signal in the clay hydroxyl region is identified as kaolinite based on 2D map of kaolinite isolates, plus its characteristic high hydroxyl content and low clay-bound water content. The signal in the bitumen/hydroxyapatite region is most likely bitumen but may also contain hydroxyapatite.

Additional insight into the kerogen/bitumen region is obtained by bitumen extraction of core fragments, and heptane saturation of the fragments before and after extraction. The data indicate a total of 14.9⇔15.6 pu kerogen, plus a total of 2.6⇔3.3 pu bitumen of which ≈1.7 pu can be easily extracted by solvents and 0.9⇔1.6 pu cannot be easily extracted by solvents. Furthermore, there is 2.6⇔3.6 pu heptane with $T_1/T_{2e}$≈50⇔110 which dissolves in the bitumen, causing the bitumen to swell and get expelled from the kerogen into the meso-macro pore network. With organic maturation, more of the kerogen converts to bitumen. With further increasing organic maturation into the oil window, the bitumen thermally cracks into lighter, producible hydrocarbons. The free bitumen signal shifts to longer $T_2$ times as the viscosity is reduced due to the lighter hydrocarbons.

Another interpretation is proposed where the bitumen in the kerogen/bitumen peak consists of asphaltenes alone, while the bitumen signal in the bitumen/hydroxyapatite consists of the resins, aromatics, and saturates (i.e., the other SARA components of the bitumen). This would predict ≈75 wt % asphaltenes in the bitumen, which is reasonable given that this formation is immature.

The 2D maps indicate that the three organic components kerogen, bitumen, and dissolved heptane all have roughly the same $T_1$~40⇔50 ms. This indicates that strong cross-relaxation effects average out variations in $T_1$ across $^1H$ sites, where the variations in $T_1$ result from differences in $^1H$-$^1H$ dipole-dipole interactions between $^1H$ sites. The cross-relaxation effects in $T_1$ have previously observed in heavy crude-oils and bitumen. On the other hand, cross-relaxation effects do not exist in $T_2$, which allows for clear separation of kerogen, bitumen, and dissolved heptane with $T_2$.

Splice Inversion
1D Inversion

Figure 4:
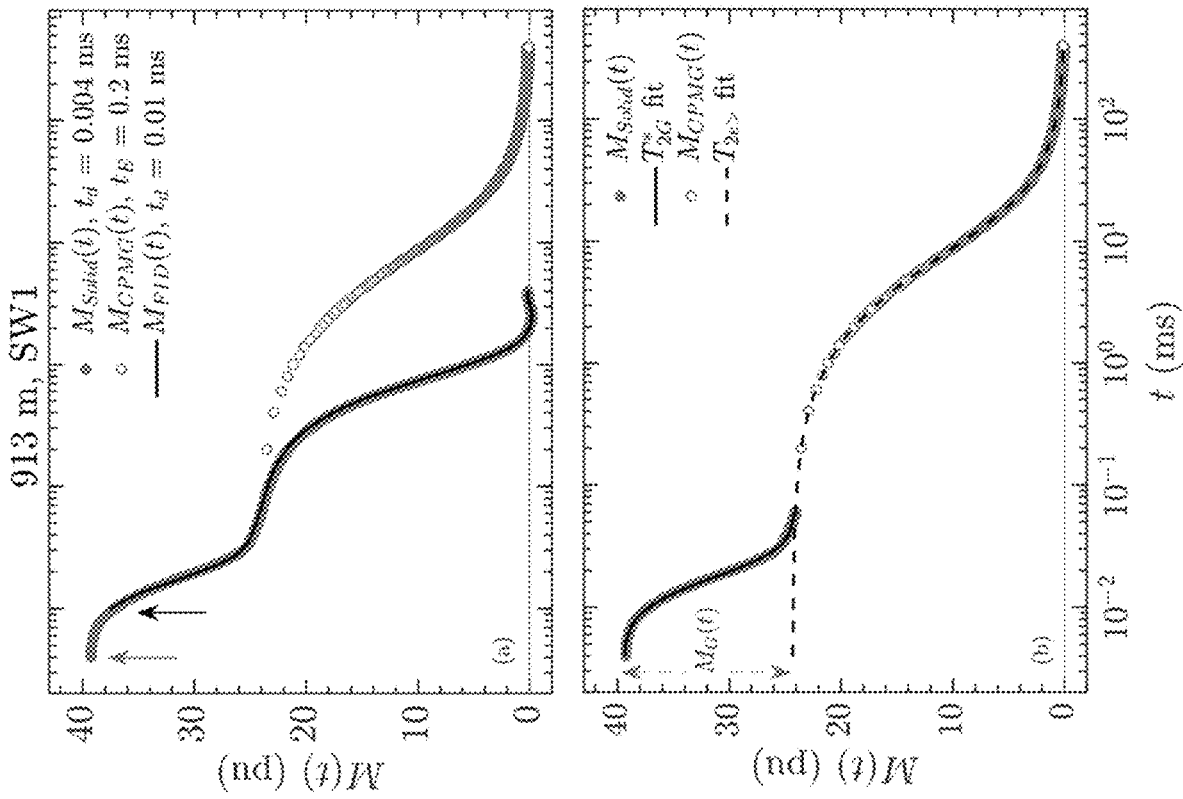
FIG. 4. (a) Magnetization data in pu (porosity units) for solid-echo $M_{Solid}(t)$ (closed symbols), CPMG $M_{CPMG}(t)$ (open symbols), and FID $M_{FID}(t)$ (solid line), with deadtimes $t_d$ and echo-spacing $t_E$ listed. (b) $M_{CPMG}(t)$ data and multi-exponential $T_{2e}$ fit (dashed line), along with $M_{Solid}(t)$ data and multi-Gaussian $T^*_{2G}$ fit to $M_G(t)$ (solid line). Data is for the 913 m core at SW1.
Figure 5:
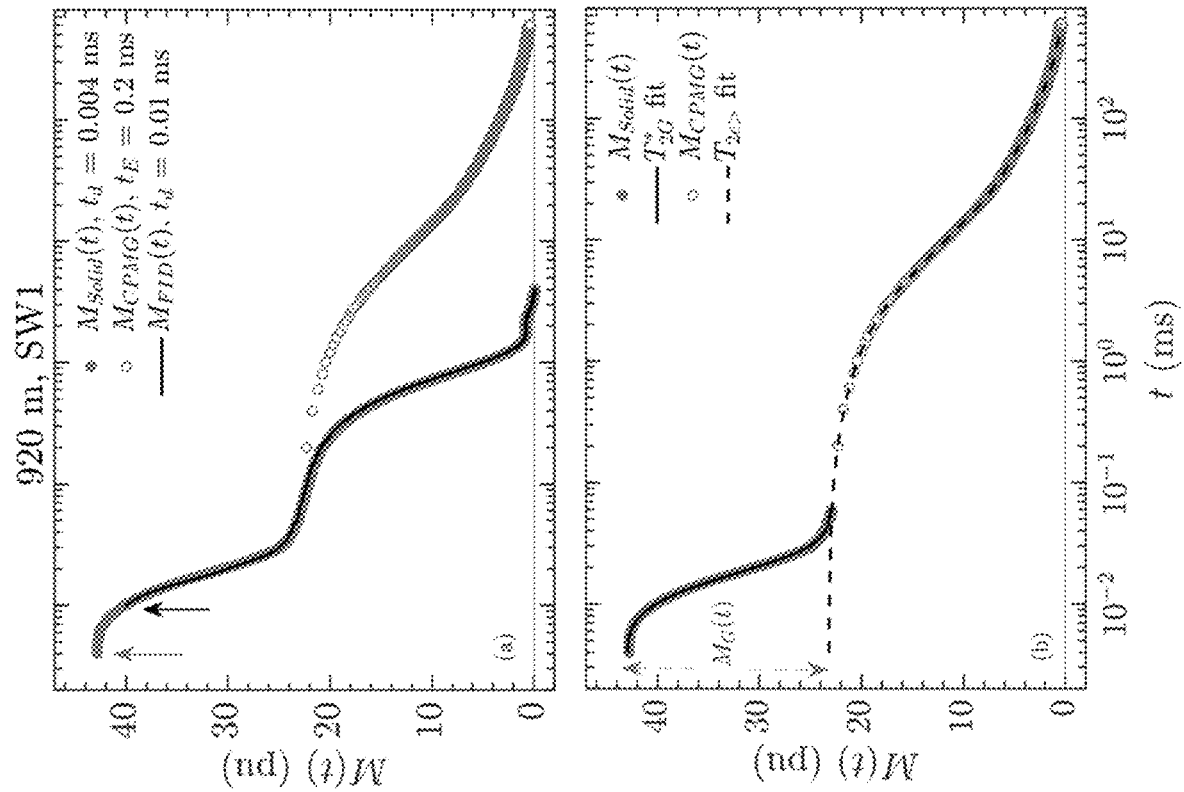
FIG. 5. Same as FIG. 4, but for the 920 m core at SW1.

The 1D splice inversion method for 913 m and 920 m cores at SW1 are shown in FIG. 4 and FIG. 5, respectively. In the case of 920 m at SW1 in FIG. 5 (a), the effective deadtime $t_d$=0.004 ms for $M_{Solid}(t)$ was determined by matching $M_{Solid}(t)$ to $M_{FID}(t)$, which is based on the criteria that $M_{Solid}(t)$ cannot be larger than $M_{FID}(t)$ at any given time. The discretized time t for $M_{Solid}(t)$ is then given by $t=t_d+nt_{DW}$, where 1≤n≤10,000. The difference between $M_{Solid}(t)$ and $M_{CPMG}(t)$ is because of dephasing of transverse relaxation in an inhomogeneous magnetic field, as discussed in the Pulse Sequences section. FIG. 5 (b) shows the corresponding multi-exponential $T_{2e}$ fit for the $M_{CPMG}(t)$ data. A multi-Gaussian inversion is then applied to fit the solid-like signal $M_G(t)$, which is acquired by subtracting $M_{Solid}(t)$ from $M_e(t)$ while retaining only the positive data.

Note that according to FIG. 4 and FIG. 5, the solid-echo results in ≈12% and ≈17% more signal from the solid-like components for 913 m and 920 m cores at SW1, respectively (see vertical arrows in plots). The ≈15% larger signal intensity for the solid-echo is a result of its shorter effective deadtime of $t_d$=0.004 ms compared to the FID deadtime of $t_d$=0.01 ms. As a result of the shorter deadtime, the solid-echo captures a greater portion of the faster relaxing solid-like components compared to an FID.

Figure 6:
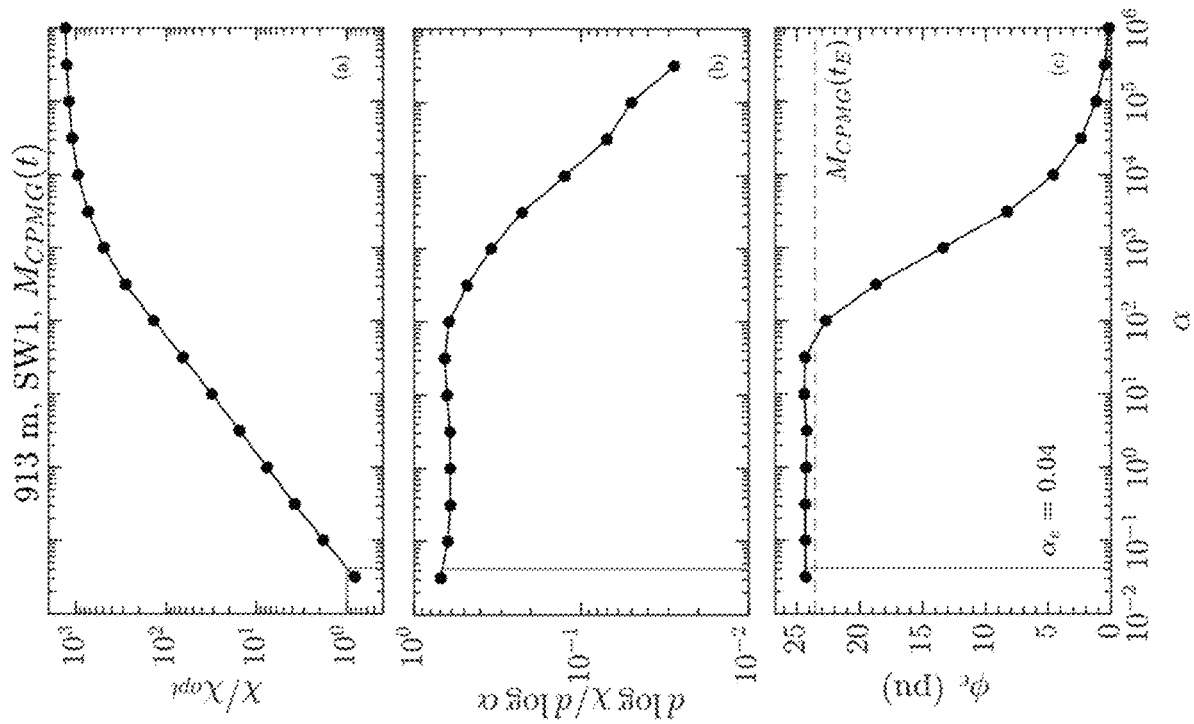
FIG. 6. (a) χ misfit of $M_{CPMG}(t)$ data from fit, normalized by the optimal $\chi_{opt}$, as a function of regularization parameter α. The optimum $\alpha_e$=0.2 (vertical grey line) is obtained when $\chi/\chi_{opt}$=1. (b) Logarithmic slope d log χ/d log α versus α. (c) Total porosity $\phi_e$ in pu (porosity units) versus α, along with $M_{CPMG}(t_E)$ (dashed horizontal line) corresponding to the value of the first datapoint in $M_{CPMG}(t)$ (i.e., at t=$t_E$).
Figure 7:
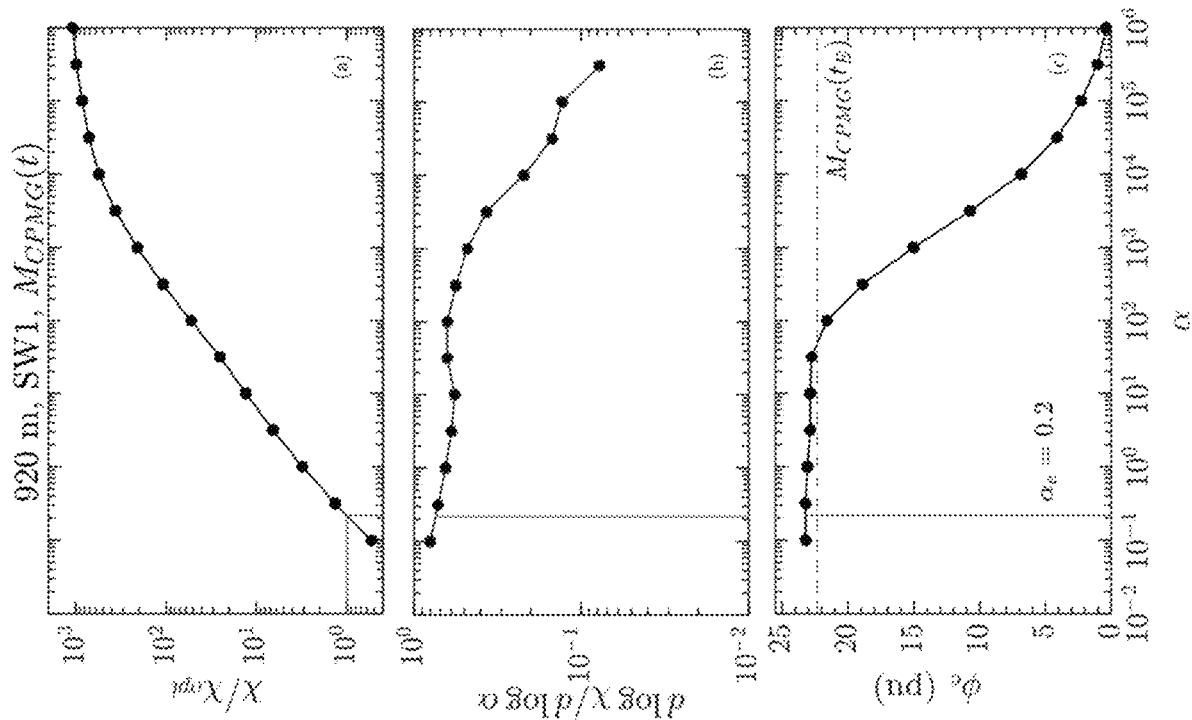
FIG. 7. Same as FIG. 6, but for the 920 m core at SW1.

The inversion optimization procedures for 913 m and 920 m cores at SW1 are shown in FIG. 6 and FIG. 7, respectively. FIG. 7 (a) shows the inversion optimized procedure for the 1D CPMG $M_{CPMG}(t)$ case at 920 m, from which the optimum $\alpha_e$=0.2 is determined by choosing $\chi/\chi_{opt}$=1. FIG. 7 (b) shows the logarithmic slope d log $\chi$/d log $\alpha$ versus $\alpha$, while FIG. 7 (c) shows the total porosity $\phi_e$ versus $\alpha$, along with $M_{CPMG}(t_E)$ corresponding to the value of the first datapoint in $M_{CPMG}(t)$ (i.e., at t $t_E$). Note that the optimal inverted porosity $\phi_e$≈23.2 pu is only slightly larger than the measured $M_{CPMG}(t_E)$≈22.3 pu, implying that the inversion does not require a large extrapolation to time zero $\phi_e \equiv M_{CPMG}(0)$. The same conclusion was found for the solid components $\phi_G$≈19.8 pu and $M_G(t_d)$≈19.6 pu. These findings imply stable inversion results. This is contrary to force fitting a multi-exponential inversion to both liquid-like and solid-like components, which is known to result in overestimating porosity. FIG. 6 shows the same procedure for 913 m where a lower optimum $\alpha_e$=0.04 is determined; this is due to the higher SNR at 913 m (SNR≈800) than at 920 m (SNR≈500), which is a result of the larger sample size (i.e., larger BV) for 913 m.

Figure 8:
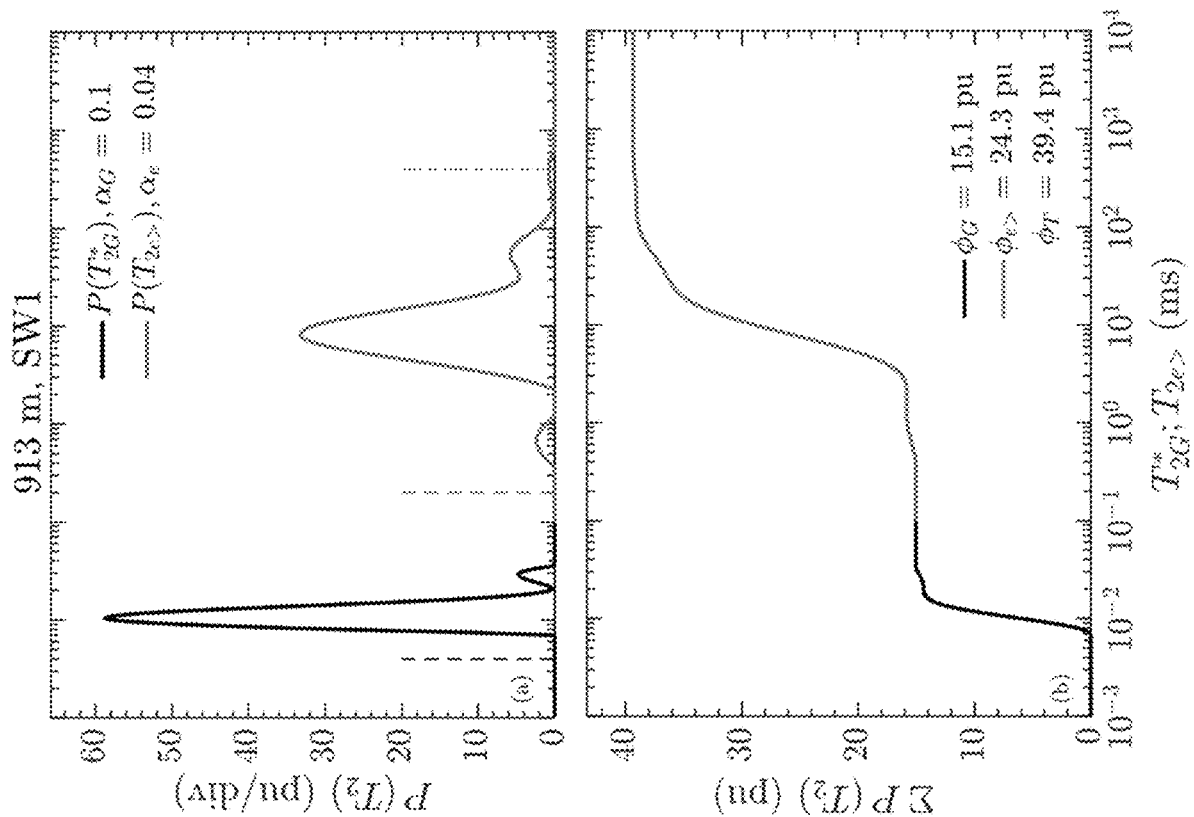
FIG. 8. (a) Multi-exponential P($T_{2e}$) (grey) and multi-Gaussian P($T^*_{2G}$) (black) distributions spliced together P($T^*_{2G}$; $T_{2e}$). Optimal regularization parameters $\alpha_e$ and $\alpha_G$ are listed. Also shown are $t_d$ (dashed black line), $t_E$ (dashed grey line) and $t_{max}$ (dashed-dot grey line). (b) Cumulative distributions for multi-exponential ΣP($T_{2e}$) (grey) and multi-Gaussian ΣP($T^*_{2G}$) (black), with porosities $\phi_e$, $\phi_G$ and $\phi_T$ listed. Data is for the 913 m core at SW1.
Figure 9:
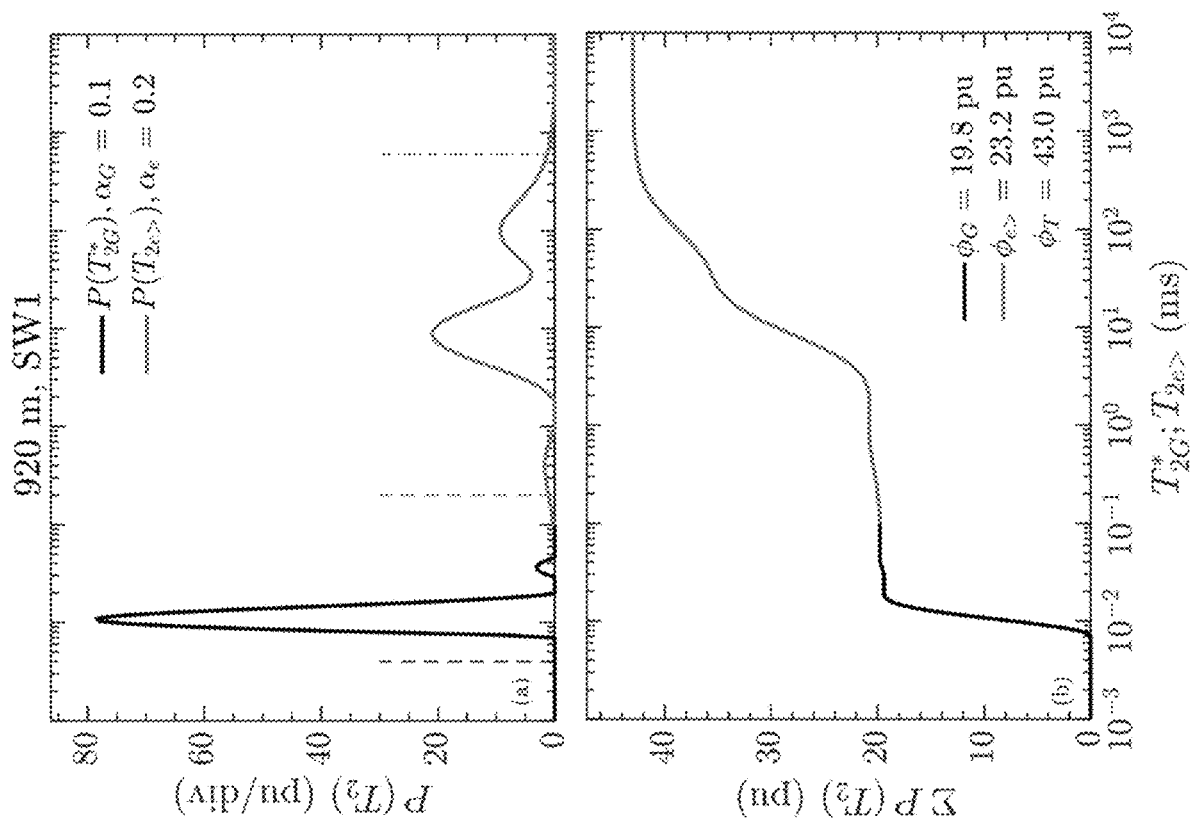
FIG. 9. Same as FIG. 8, but for the 920 m core at SW1.

The results of the 1D P($T^*_{2G}$; $T_{2e}$) distribution for 913 m and 920 m cores at SW1 are shown in FIG. 8 (a) and FIG. 9 (a), respectively, along with the cumulative distributions $\Sigma P(T^*_{2G}; T_{2e})$ in FIG. 8 (b) and FIG. 9 (b), respectively. Note that in the present case there is no liquid-like signal below $T_{2e}$<$T_{2cut}$=0.1 ms (for an echo-spacing of $t_E$=0.2 ms). However, in order to keep the method as general as possible, the workflow specifies isolating the liquid-like signal $T_{2e}$>$T_{2cut}$=0.1 ms in cases where a shorter echo-spacing $t_E$<0.2 ms is used.

2D Inversion

Figure 10A:
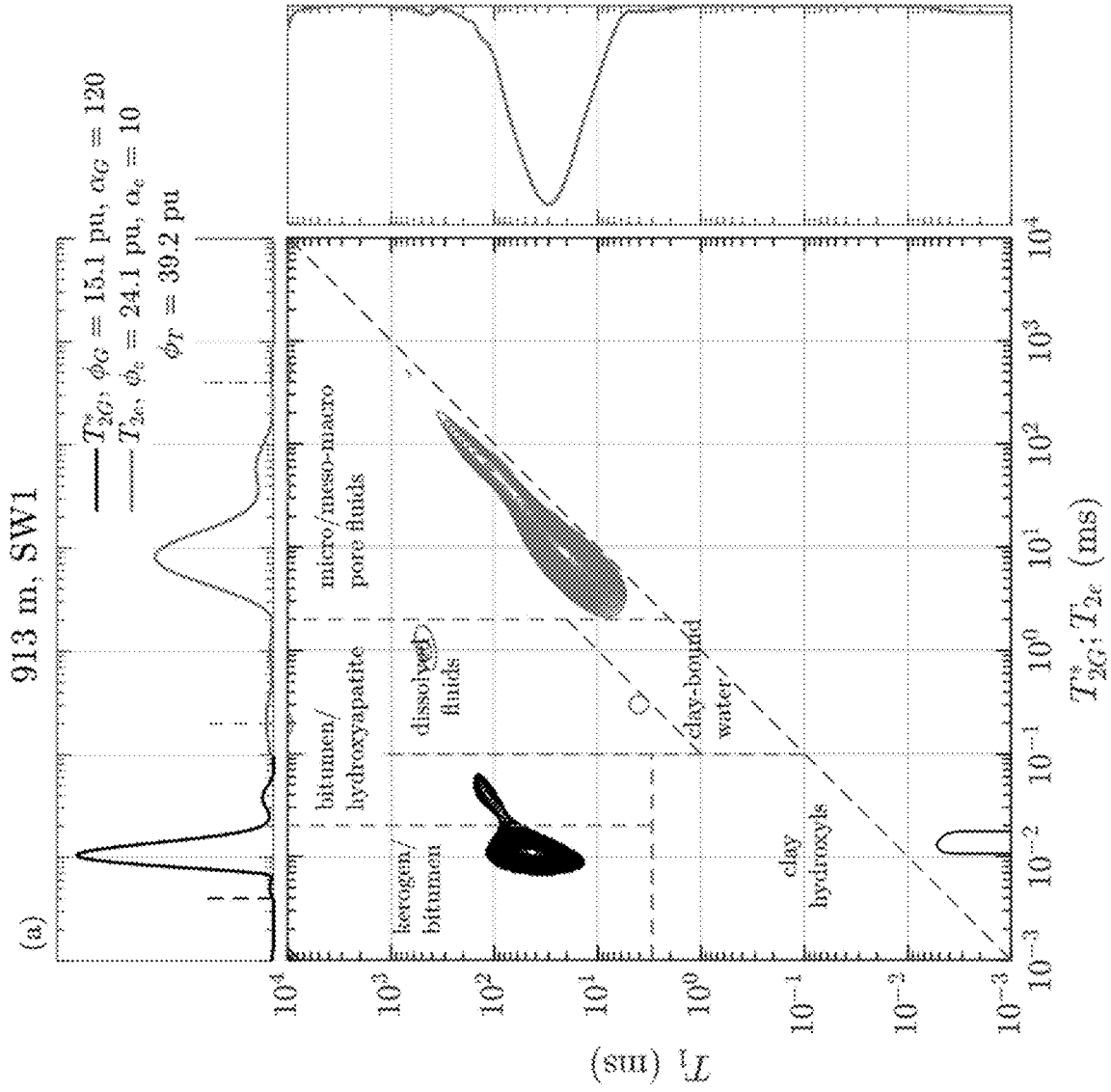
FIGS. 10A and 10B. Multi-exponential P($T_1$, $T_{2e}$) and multi-Gaussian P($T_1$, $T^*_{2G}$) contour maps spliced together P($T_1$, {$T^*_{2G}$; $T_{2e}$}), for (a) 913 m and (b) 920 m cores at SW1, respectively. Dashed grey lines show the various cutoffs used for fluid-typing and solid-typing, as well as the $T_1$=$T_2$ unity line. Top subplot shows projected $T_2$ distributions showing multi-exponential (grey) and multi-Gaussian (black) regions, along with $t_d$ (dashed black line), $t_E$ (dashed grey line) and $t_{max}$ (dashed-dot grey line), and optimal regularization parameters $\alpha_e$, $\alpha_G$ and porosities $\phi_e$, $\phi_G$, $\phi_T$ listed. Right subplot shows projected $T_1$ distribution.
Figure 10B:
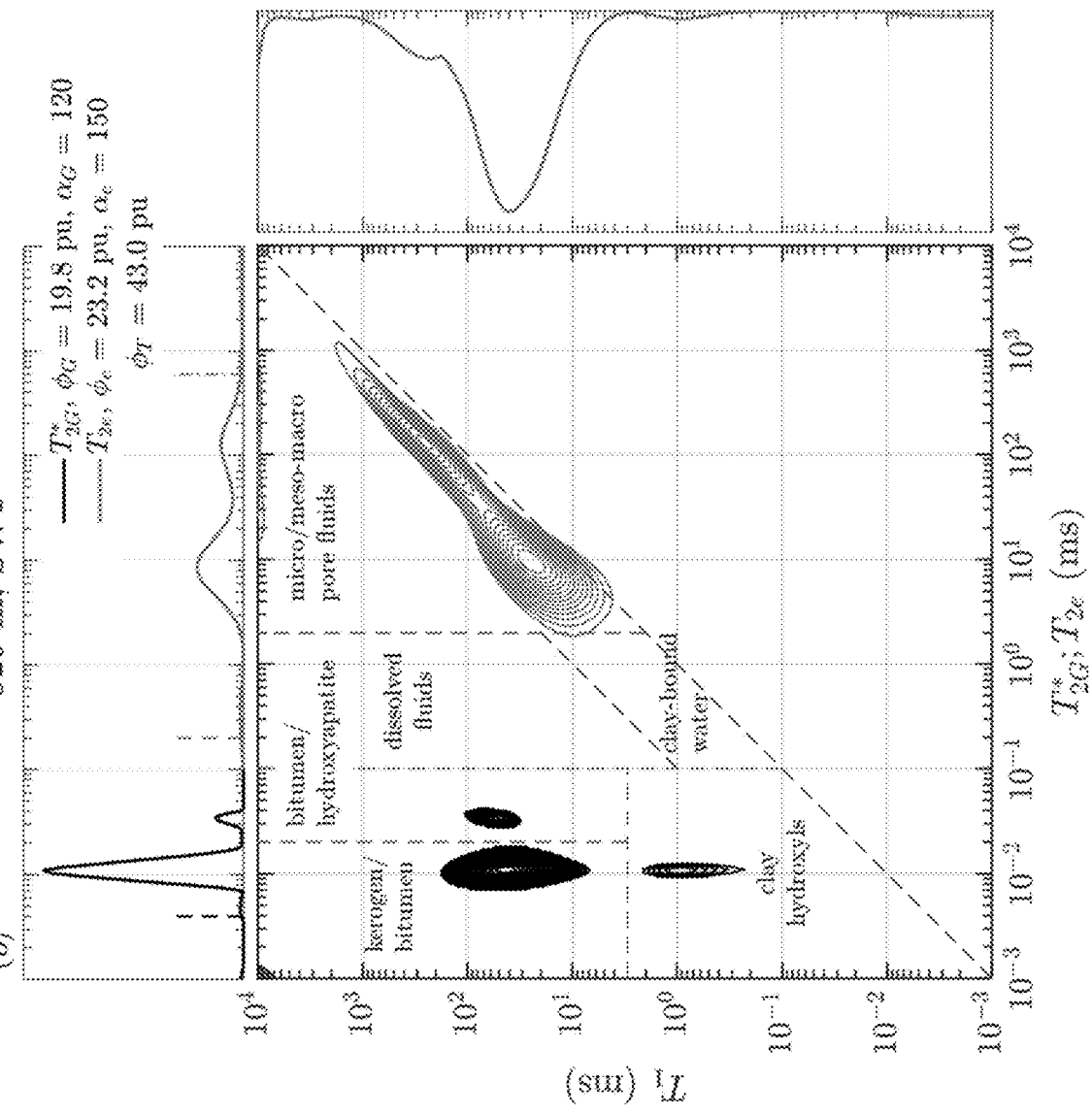

The results of the 2D P($T_1$, {$T^*_{2G}$; $T_{2e}$}) distribution obtained from the splice inversion is shown in FIG. 10 for 913 m and 920 m cores at SW1. Various cutoffs are applied to the 2D maps to separate the liquid-like components (micro/meso-macro fluids, dissolved fluids, and clay-bound water) from solid-like signals (kerogen, bitumen, and clay hydroxyls), the interpretation of which is given below. Note that the component porosities ($\phi_e$, $\phi_G$ and $\phi_T$) of the 1D and 2D distributions are in good agreement, however, the 2D inversion tends to yield broader features (along the $T_2$ projection) compared to 1D $T_2$. This is a result of the larger regularization parameters $\alpha_e$ and $\alpha_G$ for 2D compared to 1D. Specifically, the 1D optimization tends to reach the BRD condition ($\chi/\chi_{opt}$=1) at low $\alpha$, while the 2D tends to reach the heel (d log $\chi$/d log $\alpha$=0.1) at a higher a. Note however that the signal amplitude $\phi$ and $(T_1/T_2)_{pk}$ ratio at the peak, i.e., mode, of each component in the 2D distribution is largely independent of the 2D broadening.

Liquid Components

Figure 11A:
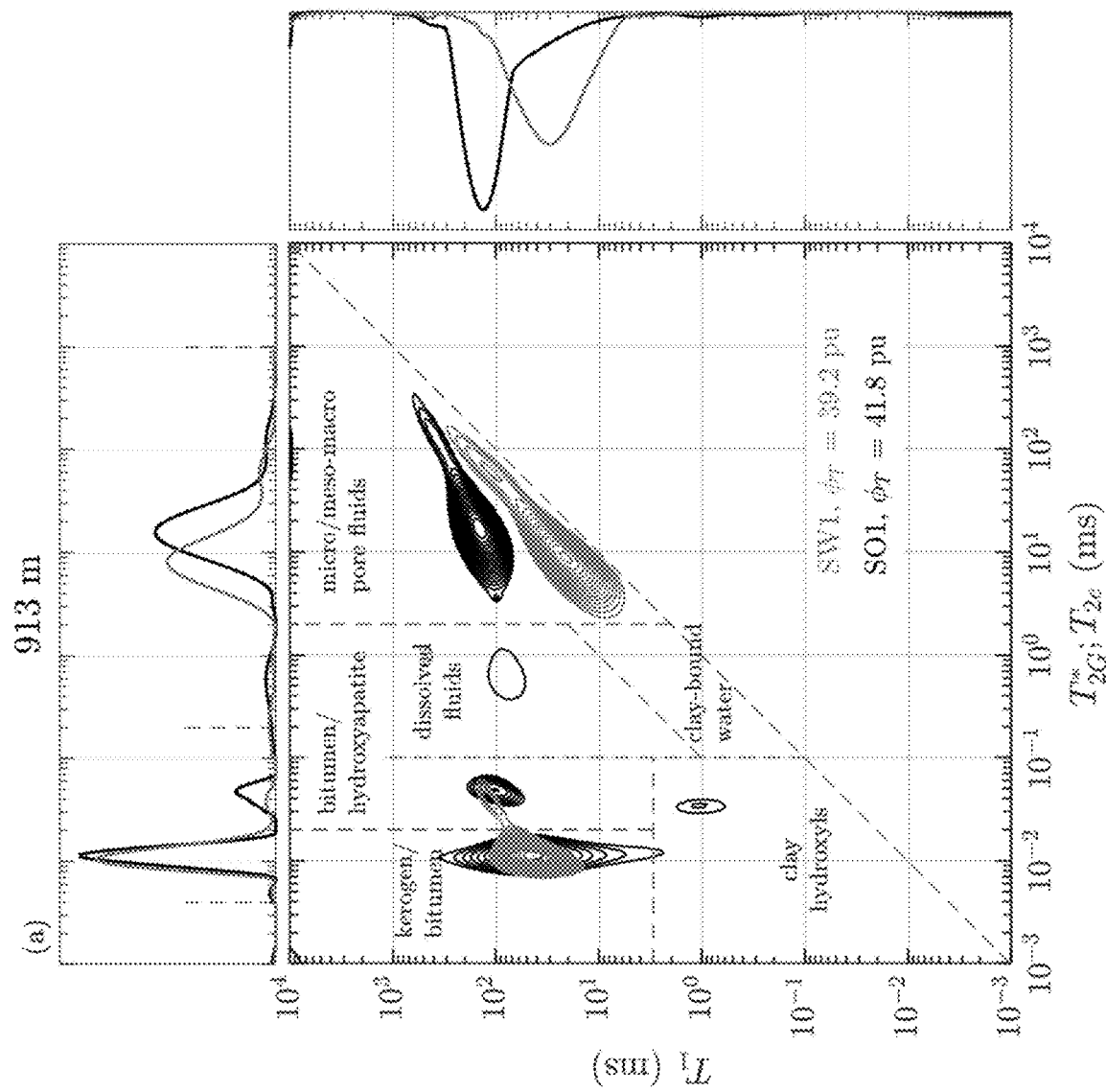
FIGS. 11A and 11B. P($T_1$, {$T^*_{2G}$; $T_{2e}$}) distributions at SW1 and SO1, for (a) 913 m and (b) 920 m cores, respectively. Dashed grey lines show the various cutoffs used for fluid-typing and solid-typing, as well as the $T_1$=$T_2$ unity line. Top subplot shows projected $T_2$ distributions, along with $t_d$ (dashed black line), $t_E$ (dashed grey line) and $t_{max}$ (dashed-dot grey line). Right subplot shows projected $T_1$ distribution. The total signal intensity $\phi_T$ are also listed in the map.
Figure 11B:
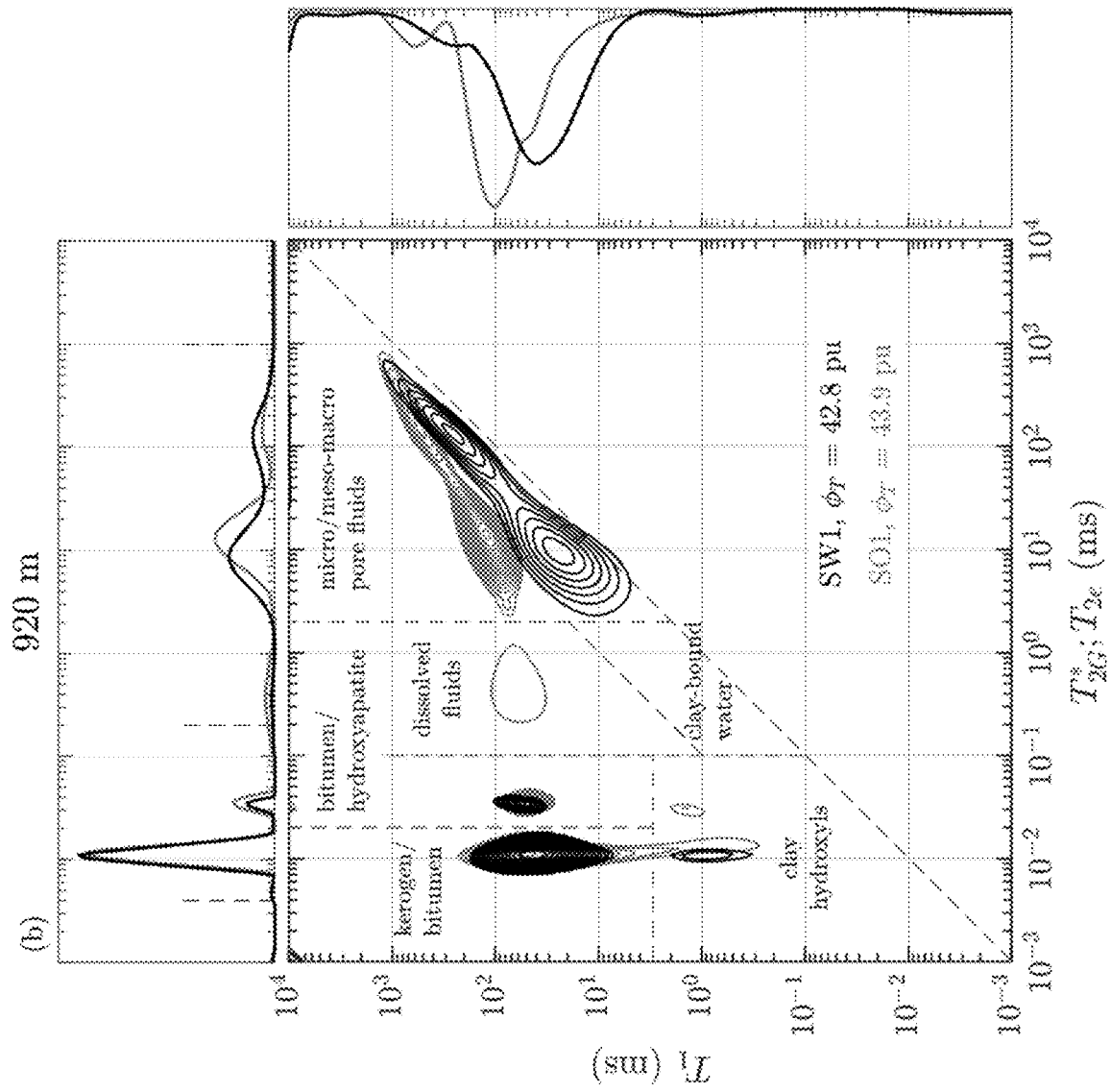

The comparison of $T_1$-{$T^*_{2G}$;$T_{2e}$} maps between fully water saturated (SW1) and fully heptane saturated (SO1) samples using the splice 2D method are shown in FIG. 11, for both 913 m and 920 m samples, along with cutoffs separating each solid/fluid component. The signal amplitudes $\phi$ (pu) and $(T_1/T_2)_{pk}$ ratios at the peak, i.e., mode, of each component in the 2D distribution are listed in Table 1.

TABLE 1

| Solid/fluid typing | Quantity | Unit | 913 m SW1 | 913 m SO1 | 920 m SW1 | 920 m SO1 |
|---|---|---|---|---|---|---|
| Kerogen/bitumen | $\phi_G$ | (pu) | 13.2 | 11.9 | 17.0 | 15.6 |
| Bitumen/hydroxyapatite | | | 0.7 | 2.2 | 1.2 | 2.7 |
| Clay hydroxyls | | | 1.1 | 1.6 | 1.6 | 2.0 |

TABLE 1-continued

| Solid/fluid typing | Quantity | Unit | 913 m SW1 | 913 m SO1 | 920 m SW1 | 920 m SO1 |
|---|---|---|---|---|---|---|
| Dissolved fluid | $\phi_e$ | | 1.1 | 1.8 | 0.5 | 2.9 |
| Clay bound water | | | 0.3 | 0.2 | 0.4 | 0.2 |
| Micro/meso-macro pore fluid | | | 22.8 | 24.1 | 22.2 | 20.5 |
| Kerogen/bitumen | $\left(\dfrac{T_1}{T_{2G}^*}\right)_{pk}$ | (ratio) | 3970 | 4820 | 3970 | 4510 |
| Bitumen/hydroxyapatite | | | 2870 | 2080 | 1600 | 1320 |
| Clay hydroxyls | | | — | 31 | 87 | 245 |
| Dissolved fluid | $\left(\dfrac{T_1}{T_{2e}}\right)_{pk}$ | | 439 | 113 | 16 | 113 |
| Clay bound water | | | — | 1.7 | 5.0 | 1.5 |
| Micro/meso-macro pore fluid | | | 2.3 | 8.5 | 2.6 | 8.5 |

Table 1 shows signal amplitude $\phi$ (pu) and $(T_1/T_2)_{pk}$ (taken at the peak of the 2D distribution in FIG. 11) for solid and liquid components for 913 m and 920 m, at SW1 and SO1. Empty entries indicate that the $(T_1/T_2)_{pk}$ was not well defined due to low porosity.

Micro/Meso-Macro Pores

The chalk is a micritic calcite, with a dual porosity system consisting of micro-pores ($\phi=11\Leftrightarrow12$ pu) and meso-macro ($\phi_e=12\Leftrightarrow13$ pu), with a total porosity of $\phi_e=22\Leftrightarrow24$ pu [48]. The micro pore system in the micritic calcite is tight and water wet. On the other hand, the meso-macro pore system contains both calcite and kerogen and becomes mixed-wet as oil-wetting components are generated. For the 920 m core, the relaxation times $T_{2e,pk}\approx9$ ms and $T_{1,pk}\approx24$ ms at SW1 (fully water saturated) are shorter than $T_{2e,pk}\approx15$ ms and $T_{1,pk}\leq123$ ms at SO1 (fully heptane saturated). The difference in relaxation times between SW1 and SO1 is due to larger surface relaxivity for water in the micritic micro-pores compared to heptane in the micritic micro-pores.

Figure 12A:
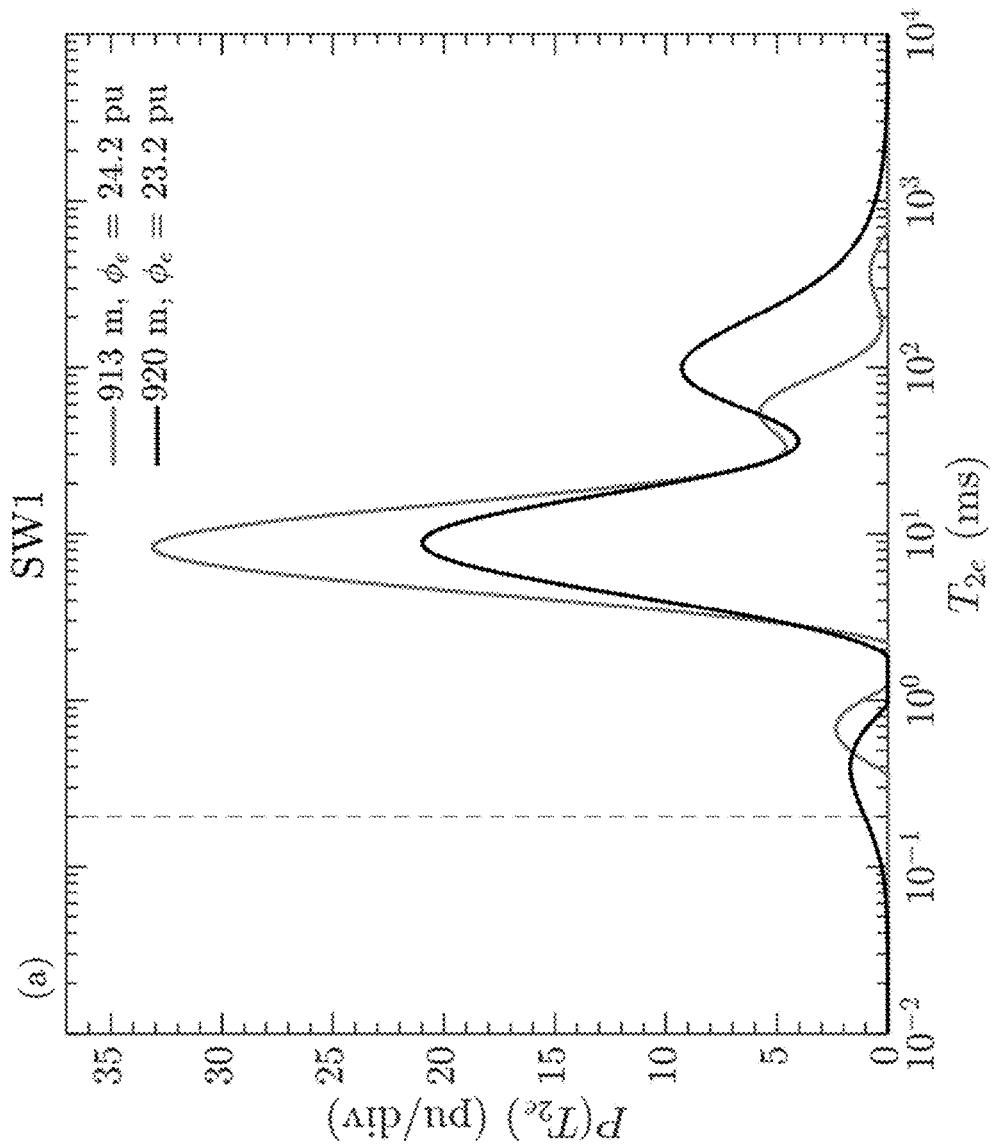
FIGS. 12A and 12B. $T_{2e}$ distribution for 913 m versus 920 m, at (a) SW1 and (b) SW0, respectively. Signal intensity $\phi_e$ is listed.
Figure 12B:
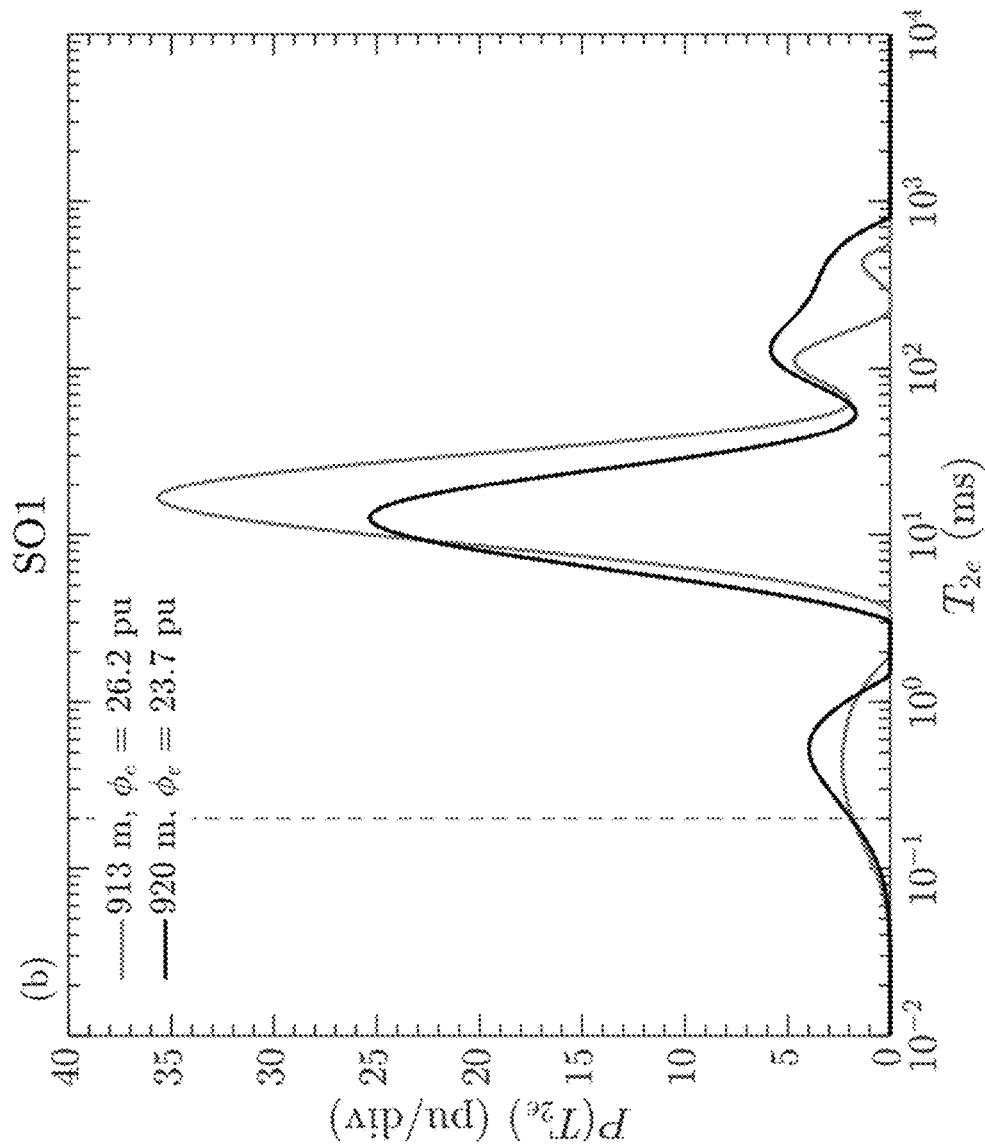

The 913 m core shows similar trends between SW1 and SO1, however the $T_{2e}$ distributions are broader for 920 m than for 913 m, see FIG. 12 for a direct comparison. This is because the micro/meso-macro pore network for 920 m is in the weak diffusive coupling regime, resulting in two well separated $T_{2e}$ peaks for micro and meso-macro [48,49]. On the other hand, for 913 m the micro/meso-macro pore network is in the strong diffusive coupling regime, resulting in more of a single $T_{2e}$ peak. The difference in diffusive coupling between the two cores is due to the larger bitumen content at 920 m ($\approx3$ pu) compared to 913 m ($\approx1$ pu), where the bitumen tends to block the diffusion of fluids between micro-pores and meso-macro pores [48,49]. This interpretation is confirmed below, where bitumen extraction results in a narrower $T_{2e}$ distribution for 920 m at SO1, indicating stronger diffusive coupling by removal of the bitumen blockage.

Fluid Typing

For both 913 m and 920 m cores, the $(T_1/T_{2e})_{pk}\approx8.5$ at SO1 is significantly larger than $(T_1/T_{2e})_{pk}\approx2.5$ at SW1, implying that the contrast in $T_1/T_{2e}$ between water and light hydrocarbons is a good tool for fluid typing and saturation in organic-rich chalks at 20 MHz. The contrast in $T_1/T_{2e}$ is due to larger confinement effects on heptane than on water, resulting in slower dynamics for heptane. As shown in polymer-heptane mixes, $T_1/T_{2e}$ for heptane increases with decreasing concentration (i.e., increasing confinement) of heptane in the viscous polymer, and furthermore $T_1/T_{2e}$ for heptane increases with increasing NMR frequency [57,65,66]. At has also been shown that diffusive coupling can play a role in the increase of $T_1/T_{2e}$ for heptane as the heptane saturation is decreased (i.e., confinement is increased) in kerogen isolates [31].

Figure 13A:
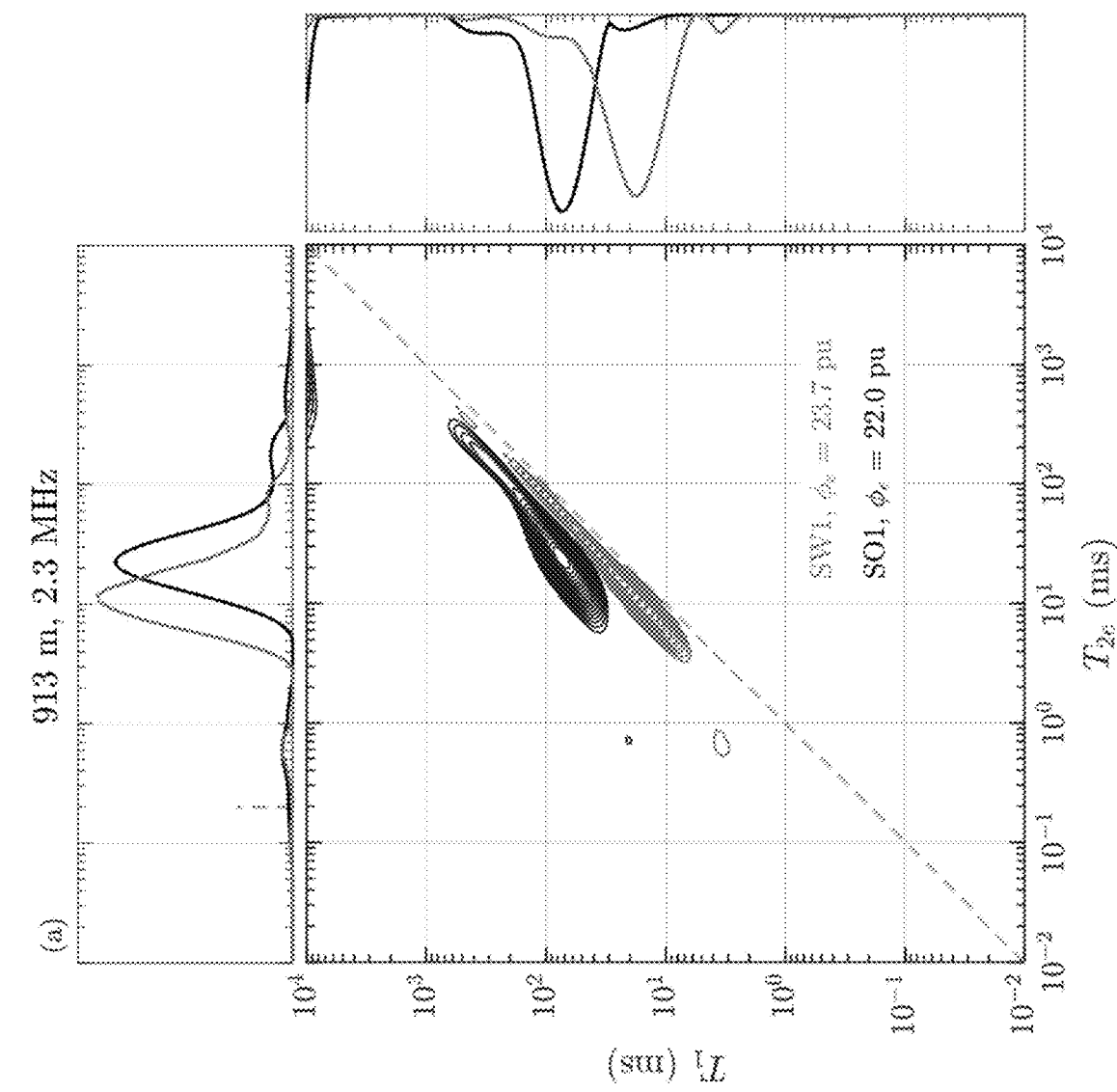
FIGS. 13A and 13B. $T_1$-$T_{2e}$ maps at 913 m for SW1 and SO1 at (a) 2.3 MHz and (b) 20 MHz, respectively. Signal intensity $\phi_e$ is listed.
Figure 13B:
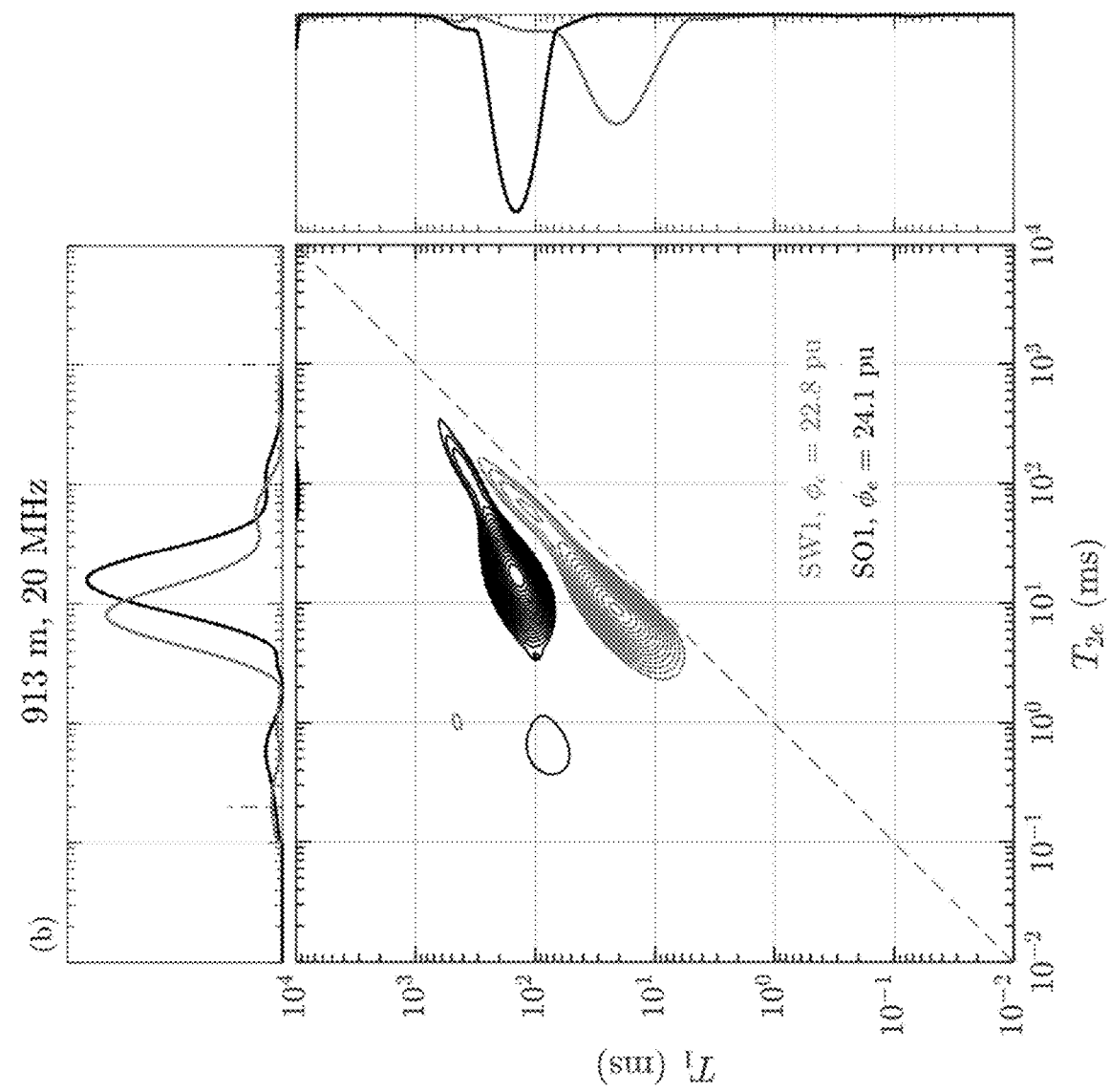
Figure 14A:
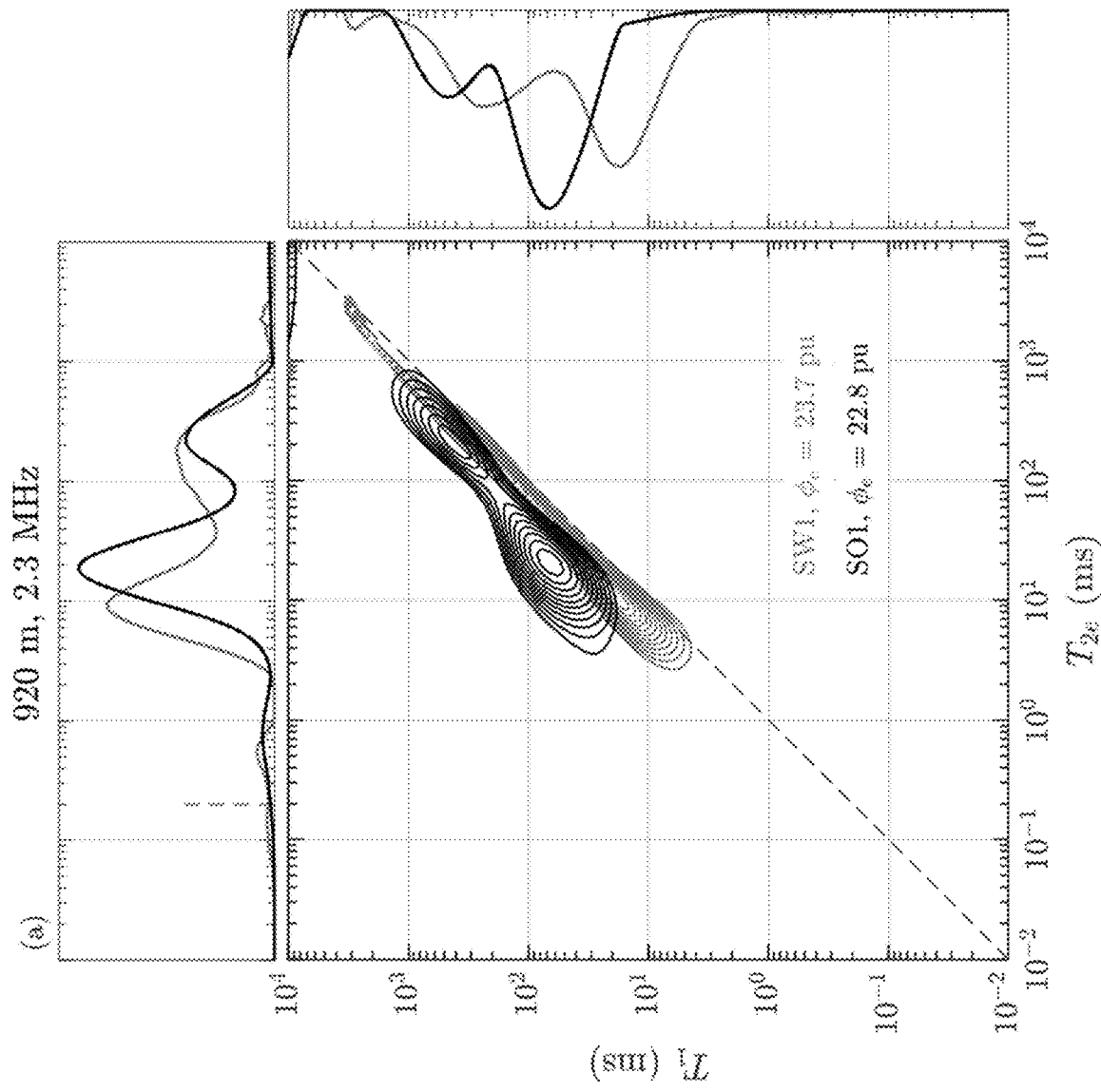
FIGS. 14A and 14B. $T_1$-$T_{2e}$ maps at 920 m for SW1 and SO1 at (a) 2.3 MHz and (b) 20 MHz, respectively. Signal intensity $\phi_e$ is listed.
Figure 14B:
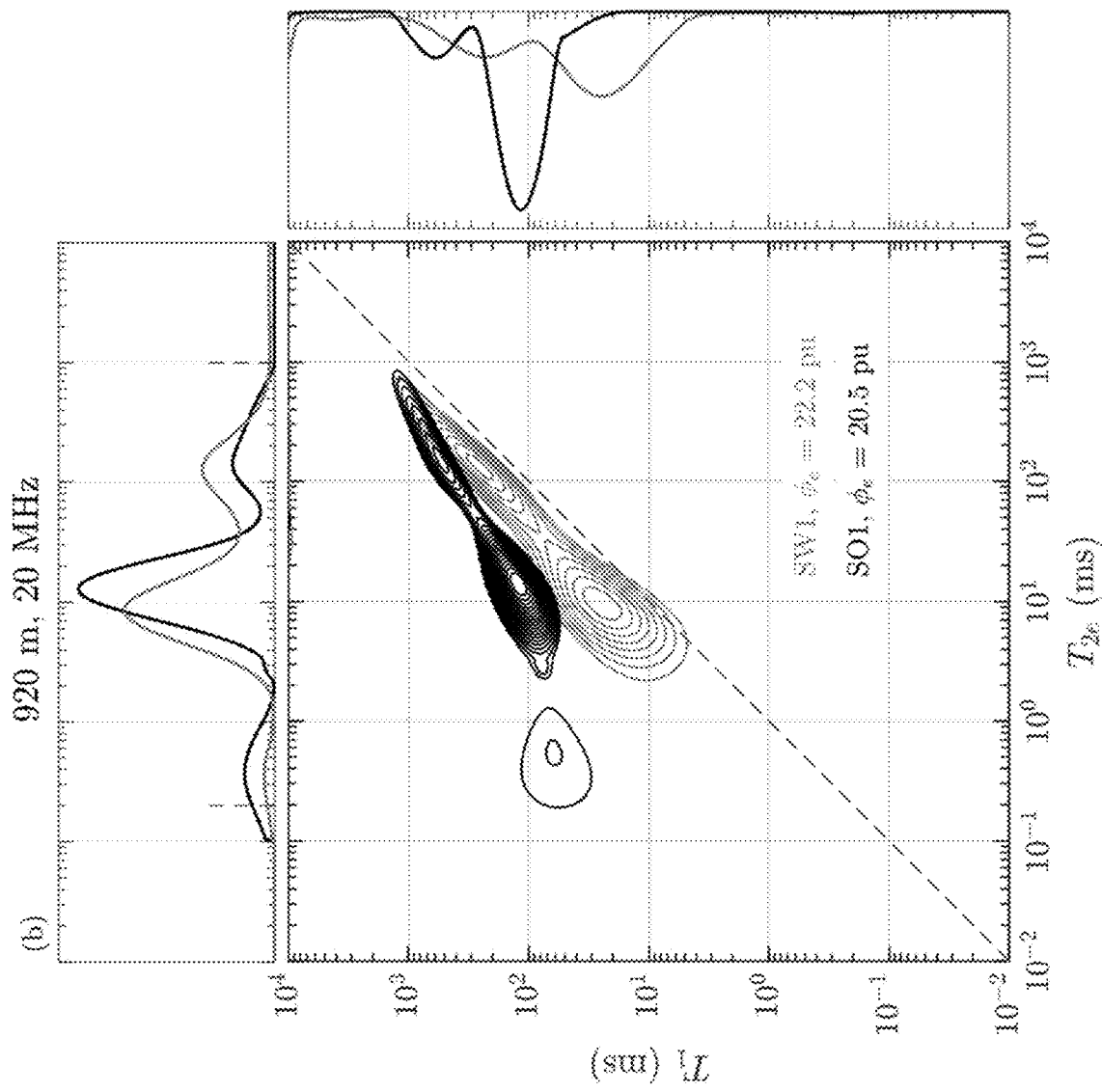

In FIG. 13, S7 we compare $T_1$-$T_{2e}$ maps as a function of NMR frequency ($f_0=2.3$ MHz and 20 MHz) for SW1 and SO1, for both 913 m and 920 m. The data clearly indicate a larger contrast in $T_1/T_{2e}$ between fluids at 20 MHz than at 2.3 MHz. Namely, at 20 MHz the peaks are at $(T_1/T_{2e})_{pk}\approx8.5$ at SO1 and $(T_1/T_{2e})_{pk}\approx2.5$ at SW1, while at 2.3 MHz the peaks are at $(T_1/T_{2e})_{pk}\approx3.1$ at SO1 and $(T_1/T_{2e})_{pk}\approx1.5$ at SW1. While this indicates that 20 MHz is preferable for fluid typing and saturation in organic-rich chalks, and likewise for organic-rich shale [67], it also indicates that 2 MHz core-analysis is required for calibrating the interpretation of NMR logging tools (which also operate at $f_0$ 2 MHz for wireline tools).

The other fluid components consist of clay-bound water and dissolved fluids. A small amount of clay-bound water ($\phi_e=0.2\Leftrightarrow0.4$ pu) with $(T_1/T_{2e})_{pk}=2\Leftrightarrow5$ is found, which is discussed below with regards to clay hydroxyls and clay mineral typing. Note that while the clay-bound water signal is visible on the 1D $T_{2e}$ projections, it is too small and broad to be visible with the 2D contours.

The amount of dissolved fluids depends on whether the fluid is water ($\phi_e\approx1$ pu) or heptane ($\phi_e=2\Leftrightarrow3$ pu), indicating that more heptane is dissolved in the bitumen than water, as expected. There is also a large difference in $T_1/T_{2e}$ between dissolved water $(T_1/T_{2e})_{pk}\approx16$ at SW1 and dissolved heptane $(T_1/T_{2e})_{pk}\approx113$ at SO1. These findings for the dissolved fluids agree with water versus heptane-saturated kerogen isolates [29]. As discussed below, the dissolved heptane swells the bitumen, which causes the bitumen to be expelled from the kerogen into the pore network.

Solid Components

The solid components in the $T_1$-$\{T^*_{2G}; T_{2e}\}$ maps shown in FIG. 11 are split into its various regions, which for the 920 m core at SW1 consists of $\phi_G\approx17$ pu signal in the "kerogen/bitumen" region, $\phi_G\approx1$ pu signal in the "bitumen/hydroxyapatite" region, and $\phi_G\approx1.5$ pu signal in the "clay-hydroxyls" region.

Clay Hydroxyls

Figure 15A:
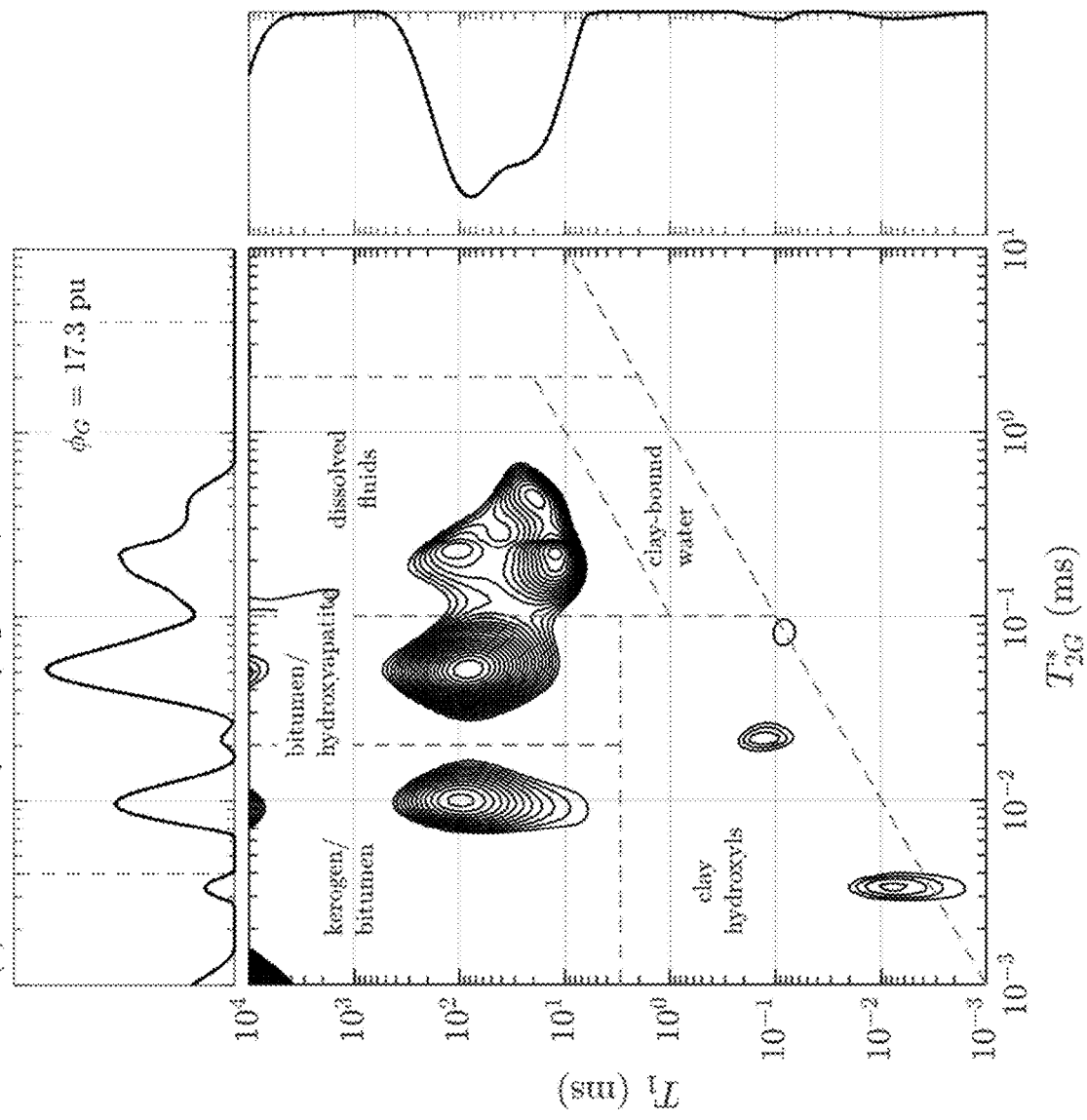
FIGS. 15A and 15B. $T_1$-$T^*_{2G}$ maps for (a) dry hydroxyapatite powder, and (b) as-received clay powders, respectively. Signal intensity $\phi_G$ is listed.
Figure 15B:
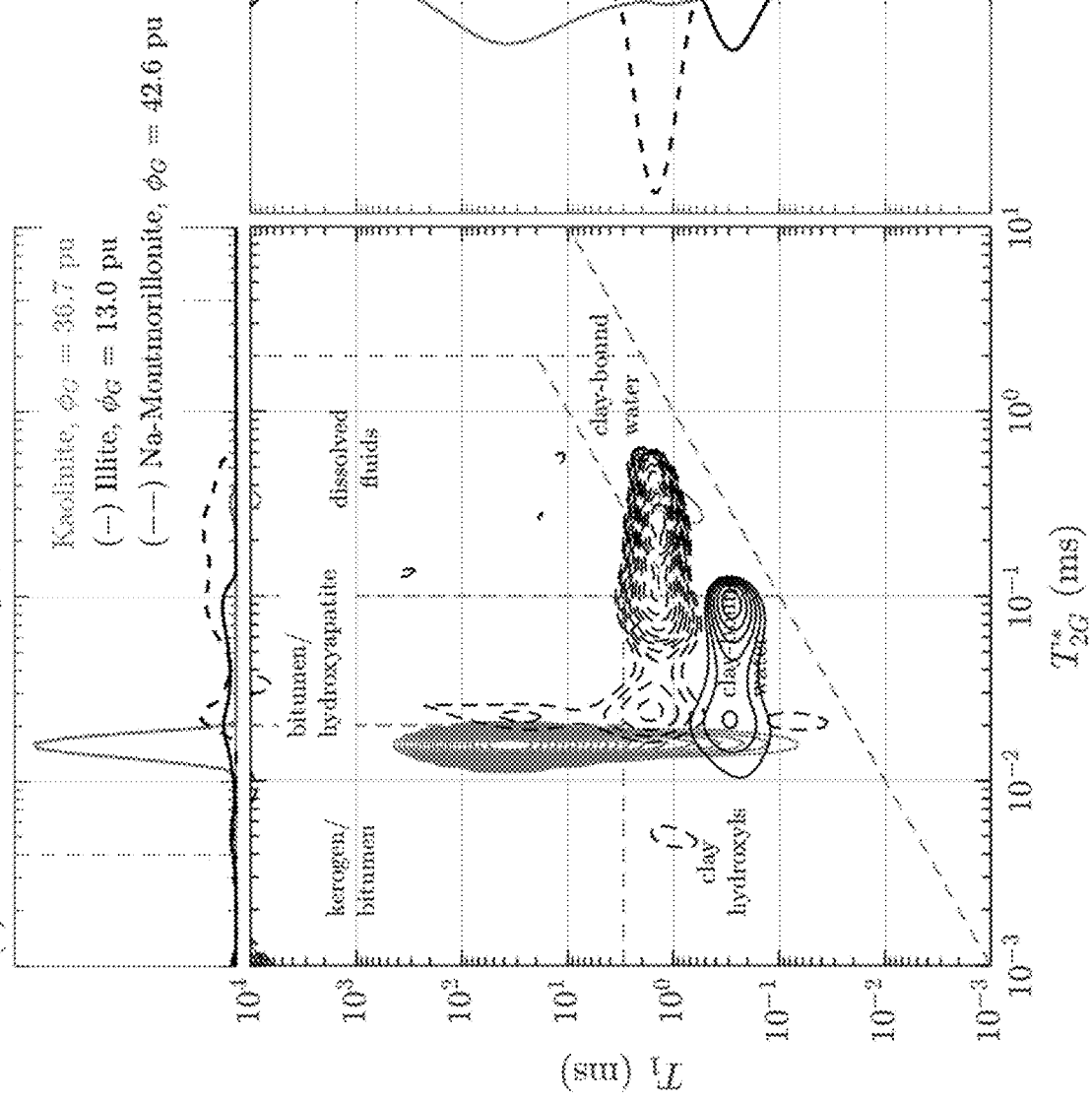

The observation that there is more signal in the clay-hydroxyls region ($\phi_G\approx1.5$ pu) than clay-bound water ($\phi_e\approx0.5$ pu) indicates that the clays have a high number of hydroxyls per unit cell and low cation-exchange capacity, which, according to mineralogy shows the clay mineral is most likely kaolinite. According to the mineralogy from XRD at 920 m, there is about $\approx3$ vol % of unspecified clays, which we assume are kaolinite. FIG. 15 shows $T_1$-$T^*_{2G}$ maps for a selection of clay isolate powders, which indicate a signal intensity of $\phi_G\approx37$ pu for kaolinite isolates. This then predicts a signal intensity of $\phi_G \approx 1$ pu from kaolinite in the cores, which is consistent with $\phi_G \approx 1.5$ pu in the clay-hydroxyls region of the cores in FIG. 11.

We note however that the location of the kaolinite powder signal in FIG. 15 spills into the kerogen/bitumen region. It was previously reported that $T_2$ for kaolinite decreases when going from powder form to compacted pellet form [1]. Furthermore, the $T_1$-$T_2$ maps previously indicated that $T_{1,pk} \approx 1$ ms for kaolinite pellets [1], which is significantly less than $T_{1,pk} \approx 30$ ms for the kaolinite powder. It is therefore most likely that the kaolinite in the cores more closely resembles the compacted kaolinite pellets rather than kaolinite powders.

Mineralogy from XRD also finds apatite ($\approx 6.4$ vol %) at 920 m. FIG. 15 shows the $T_1$-$T^*_{2G}$ map for dry hydroxyapatite powder, where $\phi_G \approx 17$ pu signal intensity is found for the isolate. This predicts a signal intensity of $\phi_G \approx 1$ pu from hydroxyapatite in the cores, which is consistent with $\phi_G \approx 1$ pu in the bitumen/hydroxyapatite region of the cores at SW1 in FIG. 11. The main peak in the $T_1$-$T_{2G}$ map of hydroxyapatite in FIG. 15 ($T_1$ 100 ms and $T^*_{2G} \approx 0.05$ ms) is consistent with the peak within the bitumen/hydroxyapatite region of the cores. The hydroxyapatite in the core is compacted which may shorten $T_1$ and $T^*_{2G}$ compared to powder, although the compaction affect is less likely to occur for hydroxyapatite than for kaolinite.

Figure 16:
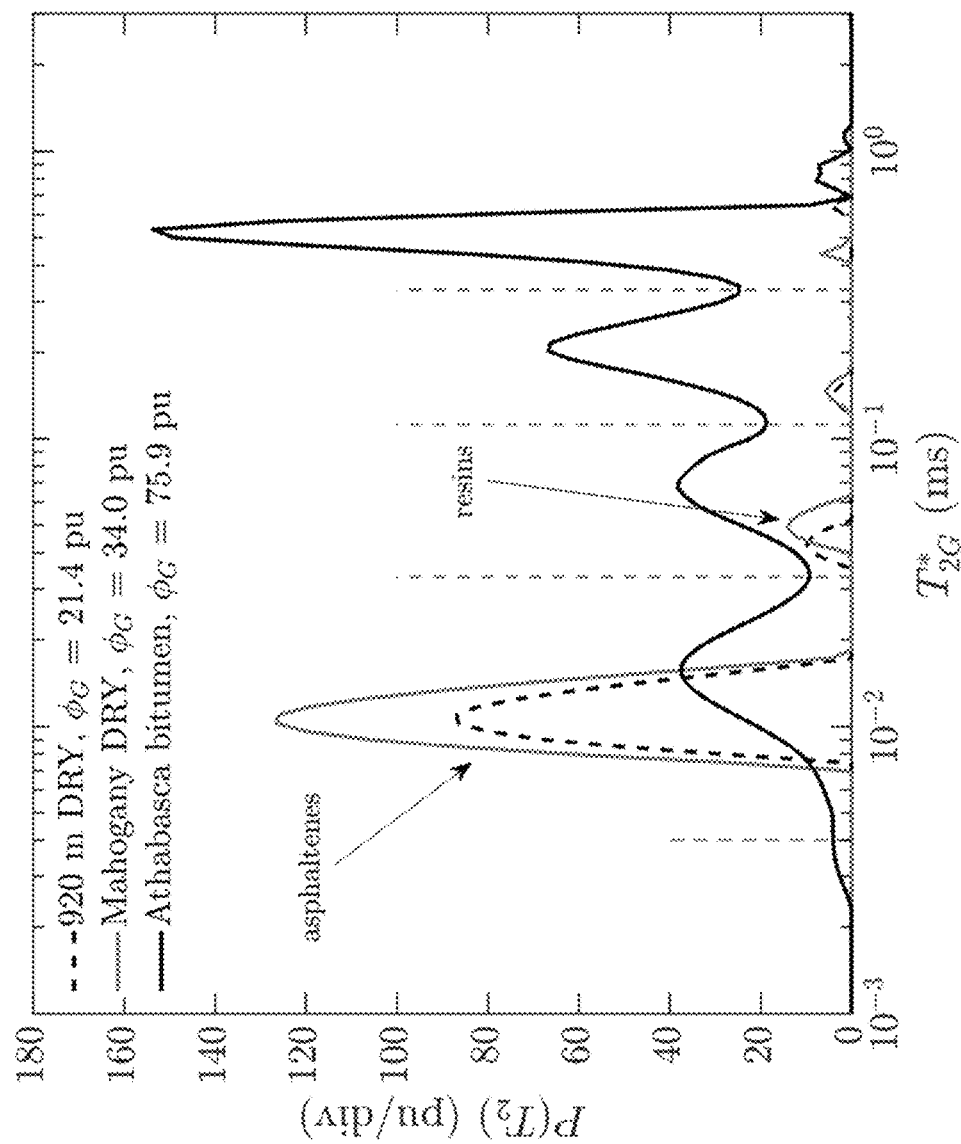
FIG. 16. $T^*_{2G}$ distributions for DRY Mahogany oil shale, DRY 920 m, and Athabasca bitumen, with indication of the asphaltene peak at short $T^*_{2G}$. Signal intensity $\phi_G$ is listed.
Figure 17A:
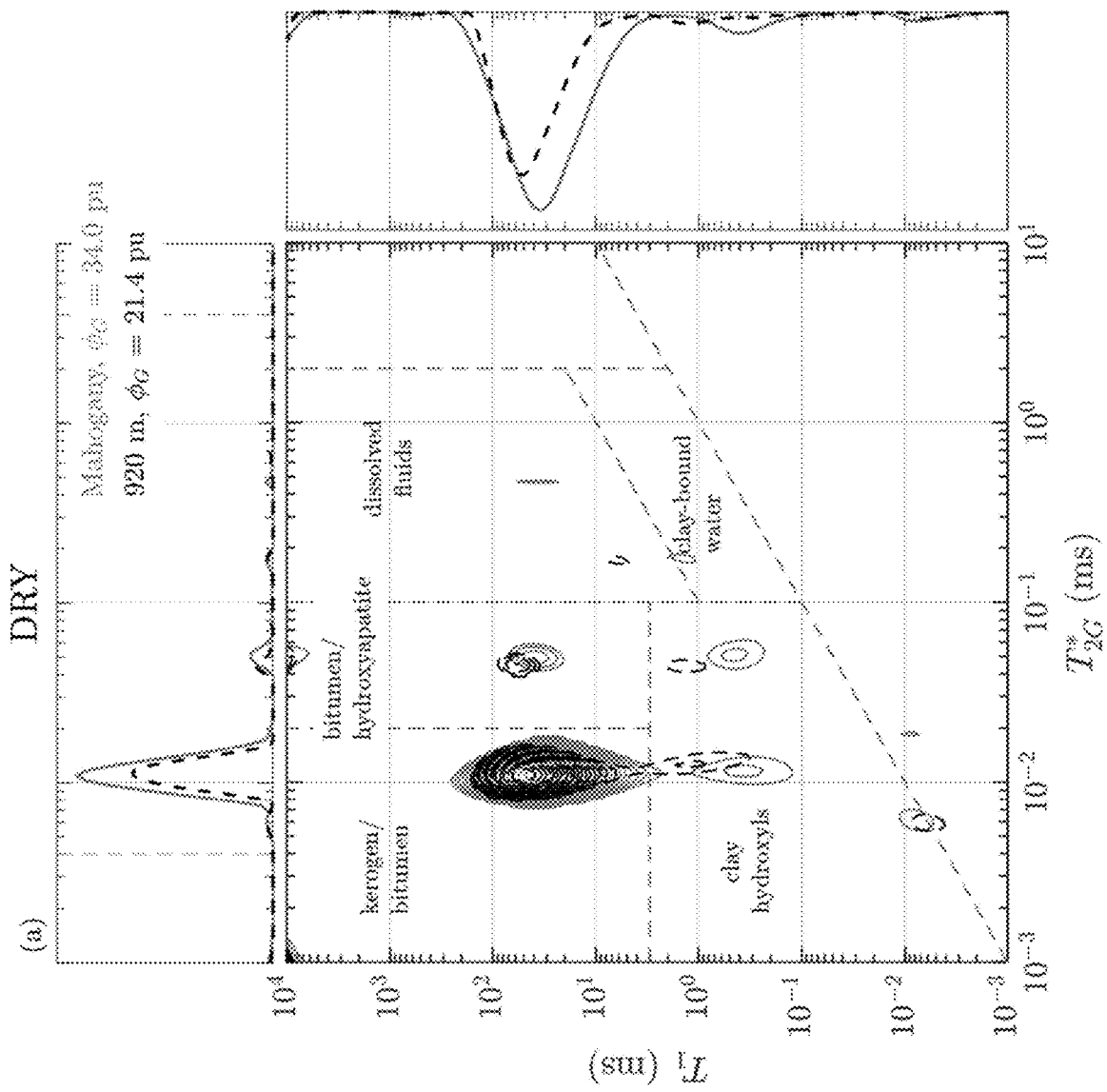
FIGS. 17A and 17B. $T_1$-$T^*_{2G}$ maps for (a) dry Mahogany oil shale and dry 920 m, and (b) Athabasca bitumen, respectively, where asphaltene, resin, aromatic, and saturate signal intensities are determined based on $T^*_{2G}$ cutoffs (dashed grey vertical lines). Signal intensity $\phi_G$ is listed.

The more likely origin of the $\phi_G \approx 1$ pu signal in the bitumen/hydroxyapatite region of the cores at SW1 is bitumen. FIG. 16 and FIG. 17a show the $T^*_{2G}$ distribution and $T_1$-$T^*_{2G}$ map (respectively) for a Mahogany oil shale, which is an immature organic-rich oil shale from the Green River formation. The Mahogany oil shale does not contain any hydroxyapatite, yet FIG. 16 shows a clear similarity between the dry 920 m sample and the dry Mahogany oil shale. Specifically, the location of both the large kerogen/bitumen peak at $T^*_{2G} \approx 0.01$ ms and the small bitumen/hydroxyapatite peak at $T^*_{2G} \approx 0.05$ ms are in close agreement, suggesting that the small peak at $T^*_{2G} \approx 0.05$ ms is bitumen rather than hydroxyapatite in both samples.

Kerogen/Bitumen

More insight can be obtained about the kerogen/bitumen region of the 2D $T_1$-$\{T^*_{2G}; T_{2e}\}$ maps by solvent extracting the bitumen and/or heptane saturating the samples. Note that the 920 m core was lightly crushed into fragments to improve the solvent extraction process (see Experimental), and that the NMR measurements were performed on the same set of homogenized fragments to maximize the accuracy.

Figure 19A:
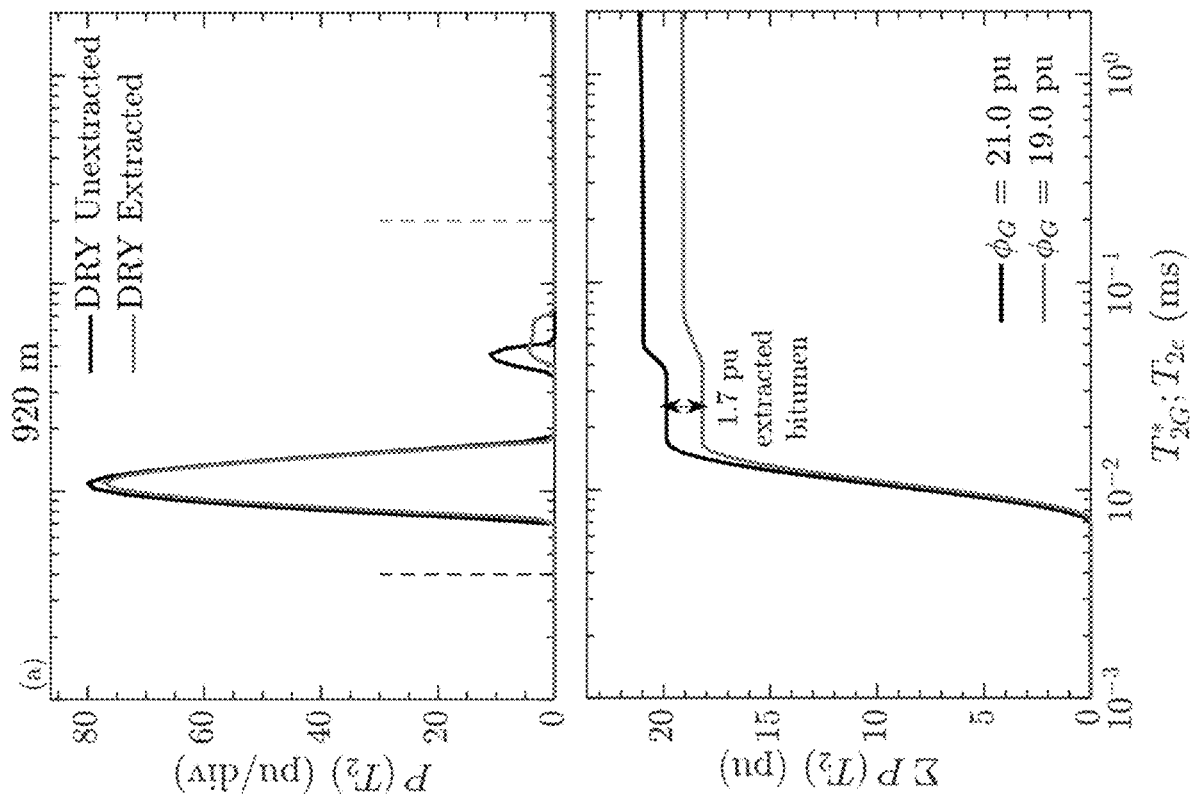
FIGS. 19A, 19B, and 19C. $P(T^*_{2G}; T_{2e})$ distributions at 920 m core fragments for (a) DRY unextracted versus DRY extracted, (b) DRY unextracted versus SO1 unextracted, and (c) DRY extracted versus and SO1 extracted, respectively. Top plots are the $P(T^*_{2G}; T_{2e})$ distributions, bottom plots are the cumulative $\Sigma P(T^*_{2G}; T_{2e})$ distributions. Solid signal $\phi_G$ (pu) are listed, along with various interpretations of porosity differences from (b).

FIG. 19a shows the effects of bitumen extraction on the 1D P($T^*_{2G}$; $T_{2e}$) distributions at 920 m by comparing the dry fragments before and after bitumen extraction. The solid-like signal intensity decreases from $\phi_G \approx 21.0$ pu to $\phi_G \approx 19.1$ pu after extraction, which as listed in Table 2 is a result of the kerogen/bitumen peak at $T^*_{2G} \approx 0.01$ ms decreasing from $\phi_G \approx 18.6$ pu to $\phi_G \approx 16.4$ pu after extraction. In other words, $\Delta \phi_G \approx 1.7$ pu of bitumen was extracted from the kerogen/bitumen region, which is also shown in the cumulative plot in the lower panel of FIG. 19a. This is quantitatively consistent with [49] where solvent extraction on cuttings resulted in $\approx 1.9$ pu of extracted bitumen (see FIG. 19 in [49], where $\approx 6.6$ vol % of the pore space is bitumen extracted).

TABLE 2

| | | | 920 m | | | |
| | | | Unextracted | | Extracted | |
| Solid/fluid typing | Quantity | Unit | DRY | SO1 | DRY | SO1 |
|---|---|---|---|---|---|---|
| Kerogen/bitumen | $\phi_G$ | (pu) | 18.1 | 15.6 | 16.4 | 14.9 |
| Bitumen/hydroxyapatite | | | 0.6 | 2.7 | 0.4 | 2.4 |
| Clay hydroxyls | | | 2.2 | 2.0 | 2.3 | 2.2 |
| Dissolved fluid | $\phi_e$ | | — | 2.9 | — | 3.9 |
| Clay bound water | | | — | 0.2 | — | 0.2 |
| Micro/meso-macro pore fluid | | | — | 20.5 | — | 19.6 |
| Kerogen/bitumen | $\left(\frac{T_1}{T^*_{2G}}\right)_{pk}$ | (ratio) | 4510 | 4510 | 3720 | 3720 |
| Bitumen/hydroxyapatite | | | 1090 | 1320 | 950 | 2080 |
| Clay hydroxyls | | | 166 | 245 | 128 | 166 |
| Dissolved fluid | $\left(\frac{T_1}{T_{2e}}\right)_{pk}$ | | — | 113 | — | 52 |
| Clay bound water | | | — | 1.5 | — | 2.5 |
| Micro/meso-macro pore fluid | | | — | 8.5 | — | 6.5 |

Table 2 shows signal amplitude $\phi$ (pu) and $(T_1/T_2)_{pk}$ (taken at the peak of the 2D distributions in FIG. 20) for 920 m Unextracted and Extracted, at DRY and SO1. Empty entries indicate that no data was acquired in that category.

Meanwhile, the smaller peak residing in the bitumen/hydroxyapatite region at $T^*_{2G} \approx 0.05$ ms remained roughly the same $\phi_G \approx 0.9$ pu after solvent extraction, most likely because this bitumen is harder to extract. We note however that 30⇔40% of the bitumen in the bitumen/hydroxyapatite region was extracted from the more mature cores deeper in the well (data not shown).

Figure 19B:
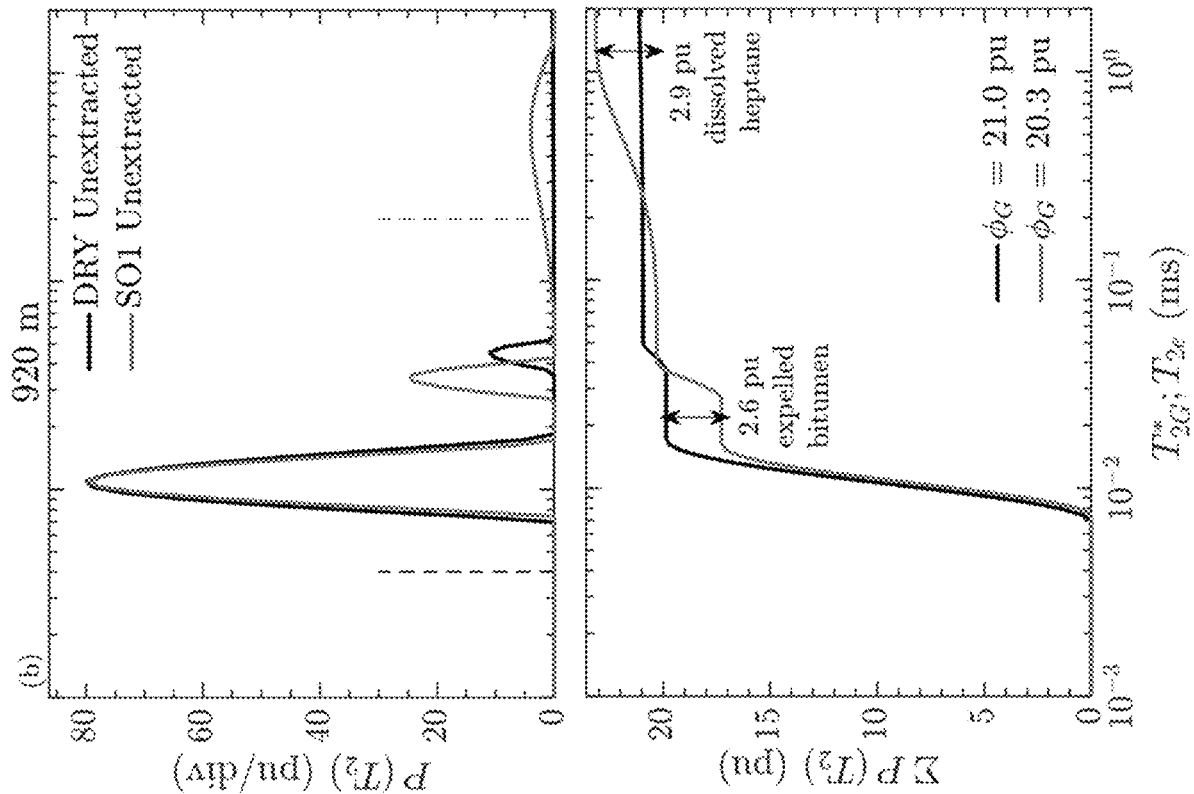

FIG. 19b then shows the effects of heptane saturation on the unextracted fragments. The kerogen/bitumen peak now decreases by $\Delta \phi_G \approx 2.6$ pu because of heptane saturation, which we interpret as bitumen swelling from dissolved heptane, causing it to be expelled from the kerogen. The swollen bitumen is expelled from the kerogen into the mixed-wet meso-macro pores which have fewer $^1$H sites on their surfaces. In other words, the bitumen goes from the pure kerogen environment with high $^1$H density (and therefore larger second moment $\Delta \omega^2 = 1/T^2_{2G}$), to the calcite/kerogen environment of the meso-macro pores with low $^1$H density (i.e., smaller $\Delta \omega^2 = 1/T^2_{2G}$). This change in $^1$H environment contributes to an increase in $T^*_{2G}$ for the expelled bitumen, which contributes to the increase from $T^*_{2G} \approx 0.01$ ms to $T^*_{2G} \approx 0.03$ ms in FIG. 19b. Meanwhile, the $\phi_e \approx 2.9$ pu of heptane dissolved in the expelled bitumen appears at $T_{2e} \approx 0.4$ ms. This finding is qualitatively like polymer-heptane mixes, where a clear separation in $T_{2e}$ is found between the viscous polymer (which is a model for bitumen)

and the dissolved heptane (see FIG. 2b of [65]). The data also indicate that there is a total of $\phi_G \approx 15.6$ pu kerogen at $T^*_{2G} \approx 0.01$ ms after heptane saturation.

Another contribution to the increase in $T^*_{2G}$ for the expelled bitumen is that the bitumen acquires a lower viscosity because of the dissolved heptane, and therefore a longer $T^*_2G$. Note however that such a viscosity effect would require an exponential (i.e., fluid-like) $T_{2e}$ decay in magnetization $M_{Solid}(t)$ rather than Gaussian. Alternatively, the decay may be in between exponential and Gaussian during the glassy transition between solid and liquid. Based on the empirical relation $T_{2e} \propto \sqrt{T/\eta}$ for bitumen [57], the expelled bitumen has a viscosity of $\eta \approx 10^7$ cP at 35° C., which according to Section 2.1 is close to the transition regime. This increase in $T_2$ is qualitatively like a recent publication where $T_2$ of the bitumen increased (i.e., its viscosity decreased) as a result of thermal maturation by hydrous pyrolysis [38].

While the data in FIG. 19b data indicate that there is $\Delta\phi_G \approx 2.6$ pu bitumen expelled from the kerogen, FIG. 19a indicates that there is only $\Delta\phi_G \approx 1.7$ pu extracted bitumen. In other words, there is $\Delta\phi_G \approx (2.6-1.7) \approx 0.9$ pu of bitumen that cannot be easily extracted by solvents, which is not surprising given the difficulty in fully extracting bitumen from tight unconventional rocks due to the restricted mass transfer.

Figure 19C:
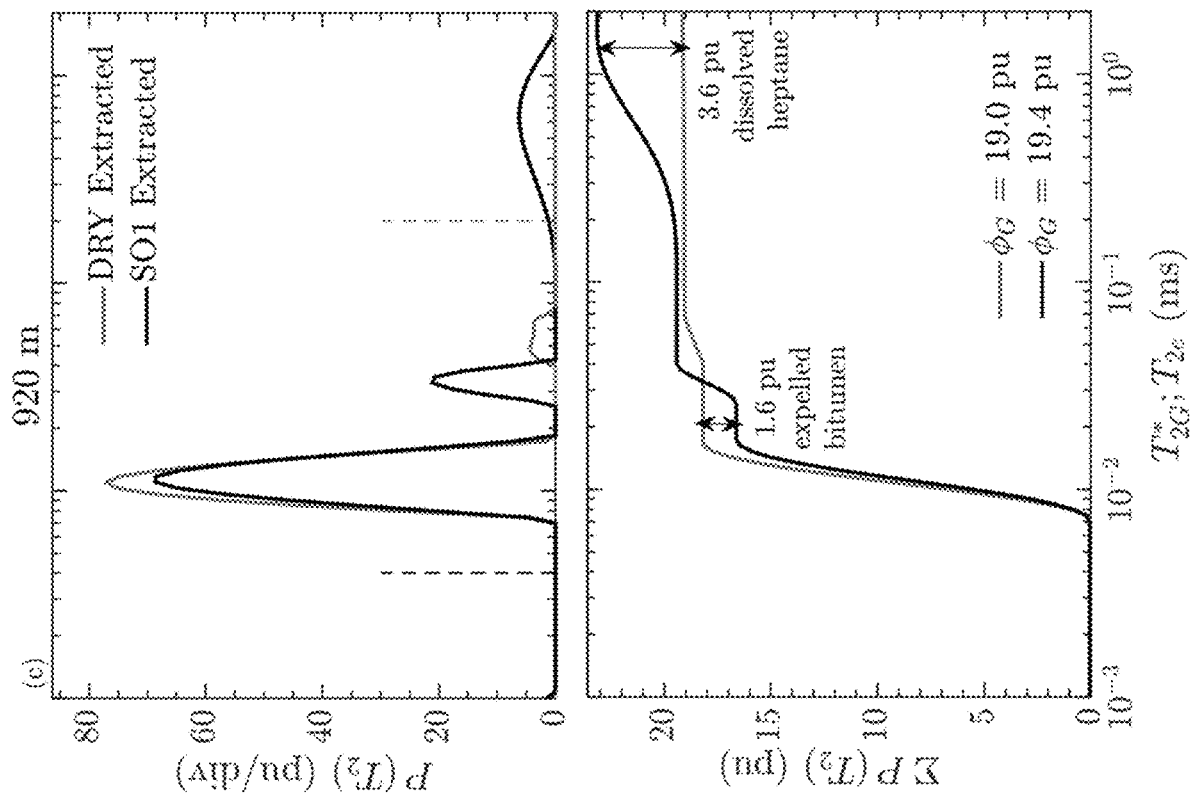

FIG. 19c shows the effects of heptane saturation on the extracted fragments, where the data indicates $\Delta\phi_G \approx 1.6$ pu of swollen bitumen expelled from the kerogen. This implies that there is $\Delta\phi_G \approx 1.6$ pu bitumen that cannot be easily extracted by solvents. The data also indicate that there is a total of $\phi_G \approx 14.9$ pu kerogen at $T^*_{2G} \approx 0.01$ ms after extraction and heptane saturation.

To summarize the collection of data at 920 m in FIG. 19, there is a total of $\phi_G=14.9 \Leftrightarrow 15.6$ pu kerogen, plus a total of $\phi_G=2.6 \Leftrightarrow 3.3$ pu bitumen of which $\phi_G \approx 1.7$ pu can be easily extracted by solvents and $\phi_G=0.9 \Leftrightarrow 1.6$ pu cannot be easily extracted by solvents. This is consistent with the TOC$\approx$11 wt % ($\approx$18 pu, equivalently) for the total organic matter (kerogen plus bitumen) before extraction. There is also $\phi_e=2.6 \Leftrightarrow 3.6$ pu heptane that gets dissolved in the bitumen, which causes the bitumen to swell and get expelled from the kerogen to the meso-macro pore space in the micritic chalk.

Alternative Units

While expressing the solid-like signals in porosity units (pu) is convenient for comparing with liquids on the same plot, it is also helpful to convert (pu) into a ratio of $^1$H mass to dry rock mass. The mass of solid-like $^1$H is given by:

$$M_H = 10\phi_G BV \rho_W \frac{2}{18} \quad (12)$$

in units of (mg_H), where BV is the bulk volume of the rock, $\rho_W=1$ g/cm$^3$ is the density of water, and $\phi_G$ is the signal intensity in (pu), where no HI$_{NMR}$ Correction is required, i.e., HI$_{NMR}=1$. The mass of the dry core is $M_{dry\_rock}$, from which bulk density $\rho_{B\_dry}=M_{dry\_rock}/BV$, which yields:

$$m_H = \frac{M_H}{M_{dry\_rock}} = 10\phi_G \frac{\rho_W}{\rho_{B\_dry}} \frac{2}{18} \quad (13)$$

in units of (mg_H/g_rock), for the total mass of $^1$H per mass of dry rock.

Given that $\rho_{B\_dry} \approx 1.63$ g/cm$^3$ at 920 m, there is a total of $\phi_G=10.2 \Leftrightarrow 10.6$ mg_H/g_rock from kerogen, and a total of $\phi_G=1.8 \Leftrightarrow 2.2$ mg_H/g_rock from bitumen of which $\phi_G \approx 1.2$ mg_H/g_rock are extracted by solvents and $\phi_G=0.6 \Leftrightarrow 1.1$ mg_H/g_rock are not extracted by solvents.

Further conversion of (mg_H/g_rock) units into (mg_HC/g_rock) units (i.e., RockEval equivalent units for S1 and S2) requires independent knowledge of the H/C molar ratio [68] for both bitumen (S1) and kerogen (S2). Furthermore, given the high sulfur content in these cores (10$\Leftrightarrow$13 wt %), the H/S molar ratio would also have to be factored into the calculation since NMR relaxation does not distinguish $^1$H associated with carbon from $^1$H associated with sulfur.

Asphaltene Content

Another interpretation of the data in FIG. 19 is that the SARA (saturates-aromatics-resins-asphaltenes) components of the bitumen are separated by $T^*_{2G}$, with asphaltenes having the shortest relaxation $T^*_{2G} \approx 0.01$ ms, potentially followed by resins, aromatics, and saturates in order of increasing $T_2$ [69,70]. This is supported by the Athabasca bitumen data in FIG. 16 and FIG. 17b, which show distinct peaks in the $T^*_{2G}$ distribution. Specifically, the $T^*_{2G}$ distribution and $T_1$-$T^*_{2G}$ map for Athabasca bitumen indicate $\approx$ 20.3 pu signal from asphaltenes below $T^*_{2G}<0.04$ ms, or 26 vol %=20.3 pu×100/$\phi_G$ equivalently, where $\phi_G \approx 75.9$ pu is the total signal intensity (i.e., the NMR hydrogen index is HI$_{NMR} \approx 0.759$).

Figure 17B:
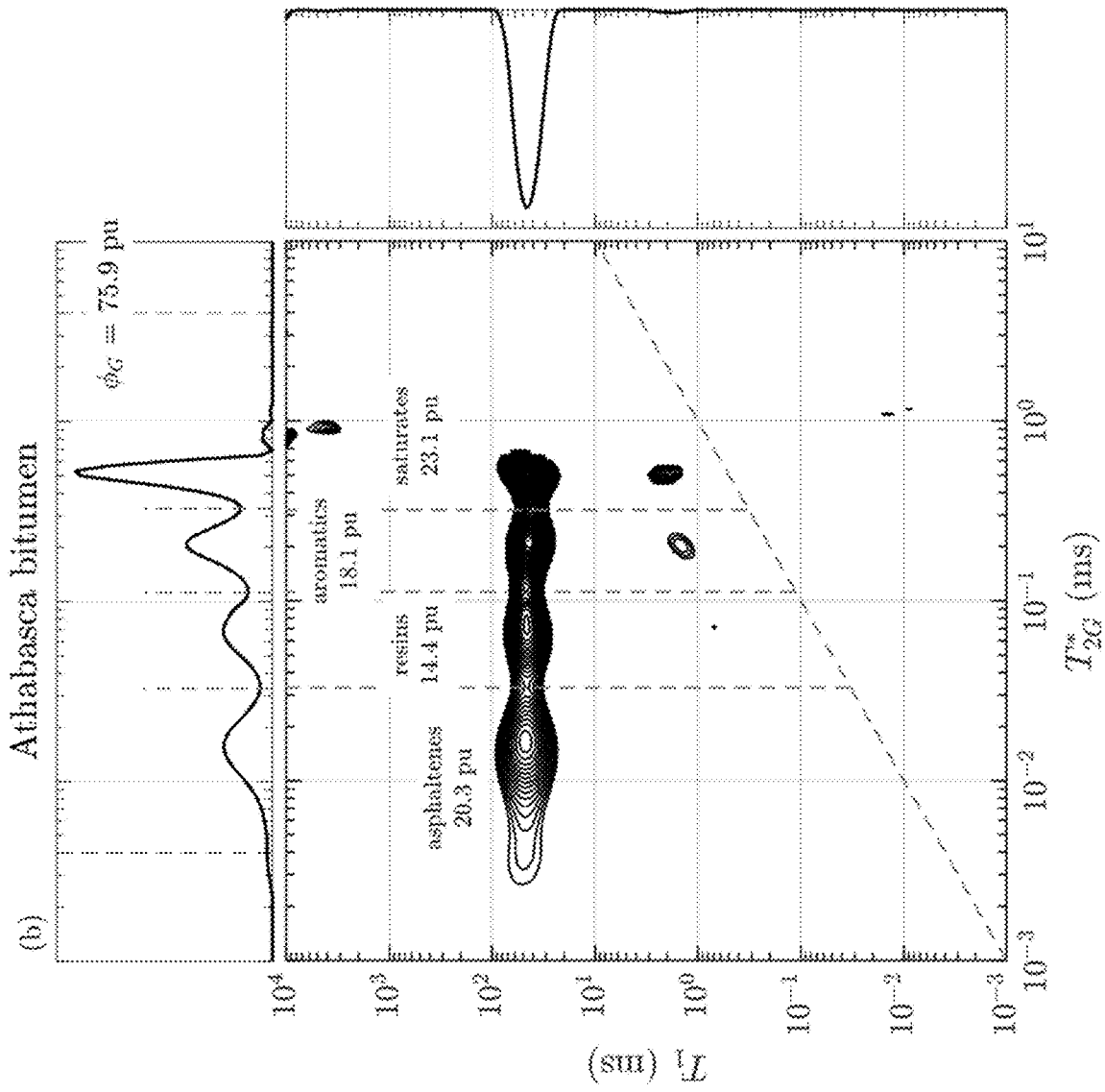
Figure 18:
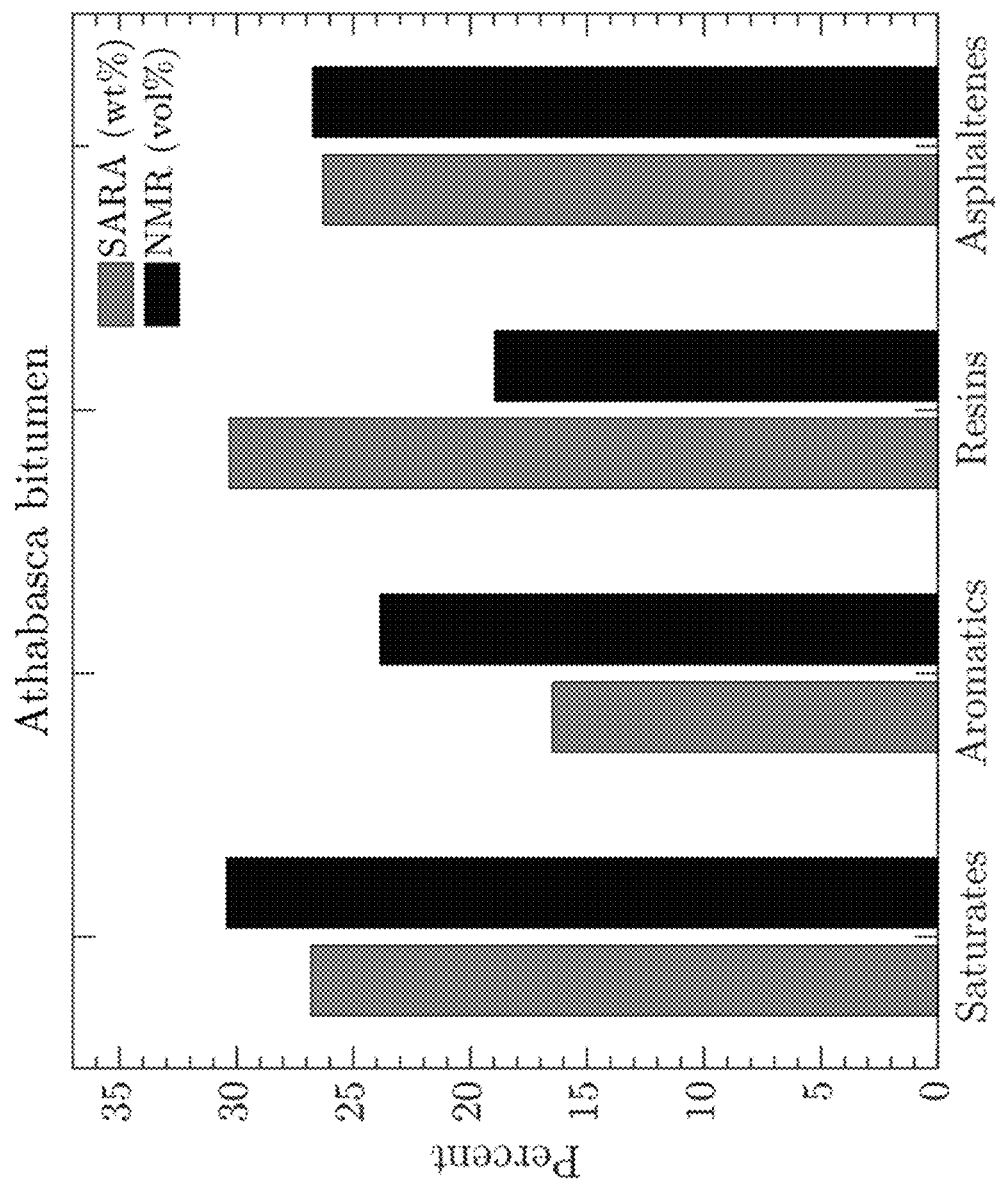
FIG. 18. Bar chart of asphaltene, resin, aromatic, and saturate fractions of Athabasca bitumen according to SARA analysis (wt %), and NMR (vol %) based on FIG. 17b.

A similar analysis for the saturates, aromatics, and resins can also be made based on the $T^*_{2G}$ cutoffs shown in FIG. 17b, and the results are compared with independent SARA analysis in FIG. 18. The NMR predictions for saturate and asphaltene fractions are consistent with SARA analysis, while some deviations exist between resins and aromatics. Note that perfect agreement is not expected for all fractions since NMR fractionation is based on molecular weight, while SARA analysis is based on polarity and polarizability. Conversion of the NMR fractions from (vol %) units to (wt %) units can also be applied, assuming the elemental ratios H/C, H/S, H/O, H/N are known for each fraction. Alternatively, differences between NMR in (vol %) units and SARA in (wt %) units can be used to obtain information about the differences in elemental ratios H/C, H/S, H/O, H/N between each fraction.

Using this interpretation on the 920 m core in FIG. 19, it is possible that the $\phi_G \approx 3$ pu bitumen in the kerogen/bitumen region at $T^*_{2G} \approx 0.01$ ms is comprised of asphaltenes alone, while the $\phi_G \approx 1$ pu bitumen in the bitumen/hydroxyapatite region consist of resins, aromatics, and saturates. This predicts $\approx$75 wt % asphaltenes for the bitumen in the 920 m core, which is reasonable given that this formation is immature.

Cross-Relaxation

Figure 20A:
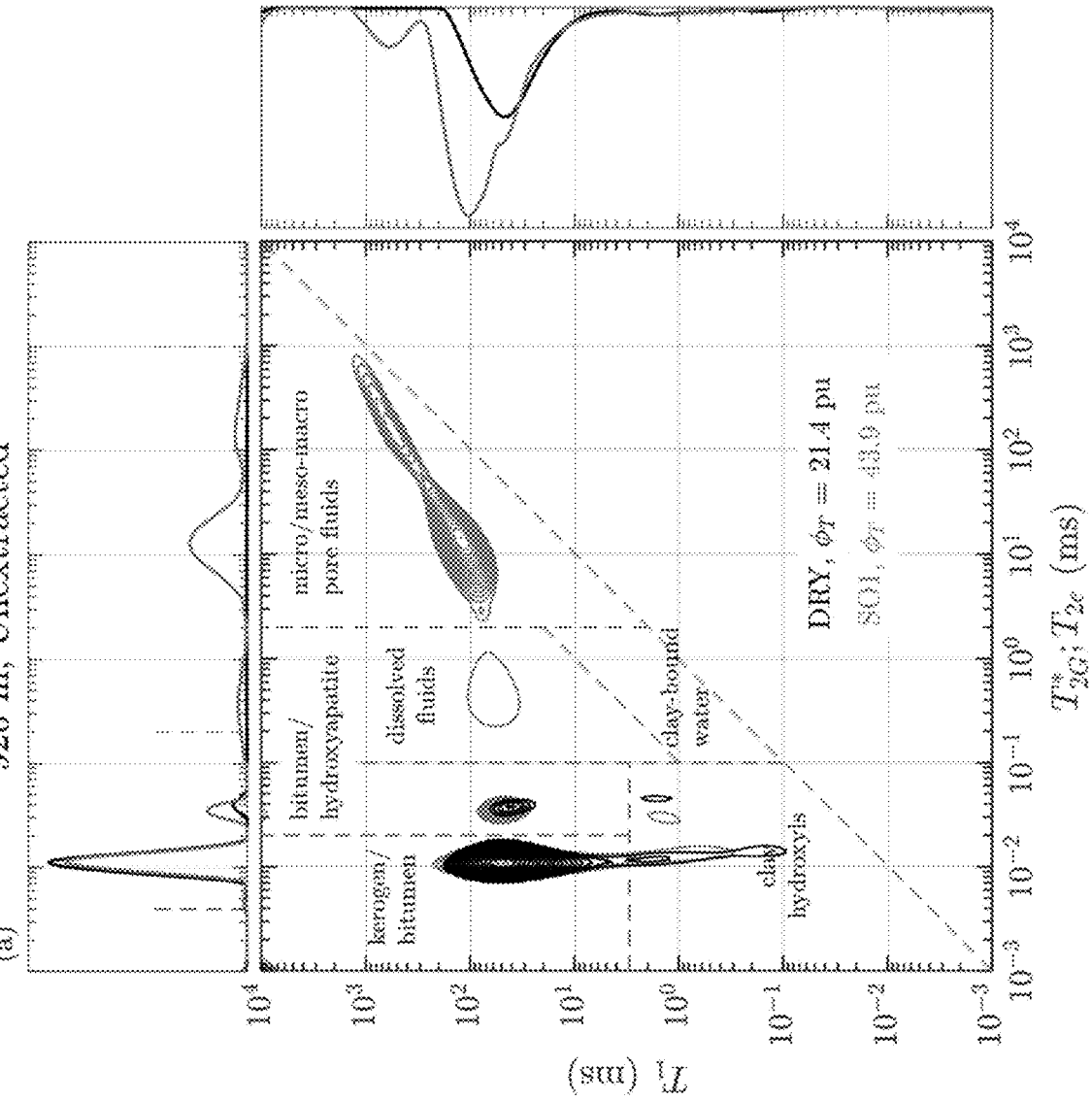
FIGS. 20A and 20B. $P(T_1, \{T^*_{2G}; T_{2e}\})$ distributions for DRY and SO1 at 920 m, for (a) unextracted and (b) bitumen extracted core fragments, respectively. Dashed grey lines show the various cutoffs used for fluid-typing and solid-typing, as well as the $T_1 = T_2$ unity line. The top subplot shows projected $T_2$ distributions, along with $t_d$ (dashed black line), $t_E$ (dashed grey line) and $t_{max}$ (dashed-dot grey line). The right subplot shows projected $T_1$ distribution. The total signal $\phi_T$ (pu) are also listed in the map.
Figure 20B:
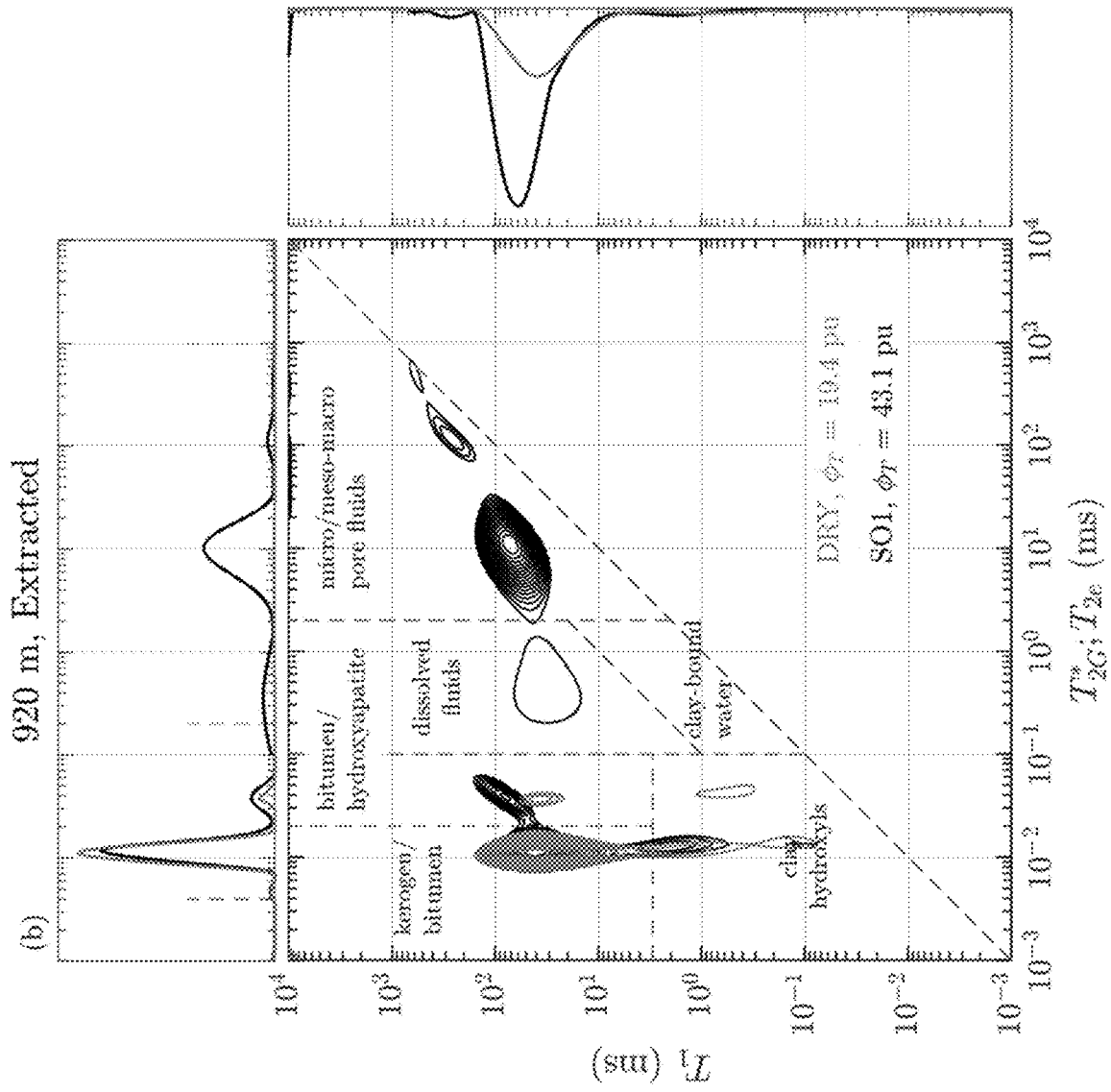

FIG. 20a and FIG. 20b show the 2D map equivalents for FIG. 19b and FIG. 19c, respectively. The micro/meso-macro pore region indicates that extracting the bitumen results in one peak in $T_{2e}$ (FIG. 20b) instead of two peaks in $T_{2e}$ (FIG. 20a), which confirms the interpretation that bitumen-swollen kerogen is blocking the diffusive-coupling between micro-pores and meso-macro pores at 920 m.

The solid-like components indicate large $T_1/T^*_{2G}$ ratios, namely $(T_1/T^*_{2G})_{pk}=3700 \Leftrightarrow 4500$ for kerogen/bitumen, $(T_1/T^*_{2G})_{pk}=1300 \Leftrightarrow 2000$ for bitumen/hydroxyapatite, and $(T_1/T_{2e})_{pk}=50 \Leftrightarrow 110$ for dissolved heptane. However, note that while these three regions are well separated in $\{T^*_{2G}; T_{2e}\}$, remarkably they all have similar $T_{1,pk}=40 \Leftrightarrow 50$ ms values (FIG. 20a). This is an indicator of strong cross-relaxation effects in $T_1$, where differences in $T_1$ across $^1$H sites are averaged out due to the spatial proximity of $^1$H-$^1$H dipole-dipole interactions between the different $^1$H sites [71].

Cross relaxation in $T_1$ has also been reported in viscous hydrocarbons such as crude-oils [72] and polymer-heptane mixes [57,65,66] at high frequencies ($f_0$=400 MHz), as evidenced by a narrowing of the $T_1$ distribution with increasing frequency and/or viscosity. This is also shown in the case of Athabasca bitumen in FIG. 17b. On the other hand, cross-relaxation effects are not present in $T_2$ (unless in the rotating frame of reference) due to differences in chemical shift between the different $^1$H sites [35]; therefore the $T_2$ distribution remains broad.

REFERENCES

[1] Fleury, M., Gautier, S., Norrant, F., Kohler E., Characterization of nano porous systems with low field NMR: application to kaolinite and smectite clays, Society of Core Analysts, SCA2011-32, 2011

[2] Fleury, M., Kohler, E., Norrant, F., Gautier, S., M'Hamdi, J., Barré, L., Characterization and quantification of water in smectites with low-field NMR, Journal of Physical Chemistry C, 117, 4551-4560, 2013

[3] Washburn, K. E., Relaxation mechanisms and shales, Concepts in Magnetic Resonance Part A, 43A (3), 57-78, 2014

[4] Washburn, K. E., Anderssen, E., Vogt, S. J., Seymour, J. D., Birdwell, J. E., Kirkland, C. M., Codd, S. L., Simultaneous Gaussian and exponential inversion for improved analysis of shales by NMR relaxometry, Journal of Magnetic Resonance, 250, 7-16, 2015

[5] Yang, K., Connolly, P. R. J., Li, M., Seltzer, S. J., McCarty, D. K., Mahmoud, M., El-Husseiny, A., May, E. F., Johns, M. L., Shale rock core analysis using NMR: Effect of bitumen and water content, Journal of Petroleum Science and Engineering, 195, 107847, 2020

[6] Zamiri, M. S., MacMillan, B., Marica, F., Guo, J., Romero-Zerón, L., Balcom, B. J., Petrophysical and geochemical evaluation of shales using magnetic resonance $T_1$-$T^*_2$ relaxation correlation, Fuel, 284, 119014, 2021

[7] Enjilela, R., Guo, J., MacMillan, B., Marica, F., Afrough, A., Balcom, B., $T_1$-$T^*_2$ relaxation correlation measurements, Journal of Magnetic Resonance, 326, 106961, 2021

[8] Zamiri, M. S., Marica, F., Romero-Zerón, L., Balcom, B. J., Monitoring shale water uptake using 2D magnetic resonance relaxation correlation and SPRITE MRI, Chemical Engineering Journal, 428, 131042, 2022

[9] Zamiri, M. S., Guo, J., Marica, F., Romero-Zerón, L., Balcom, B. J., Characterization of kerogen in shale core plugs using $T_2^*$-based magnetic resonance methods, Fuel, 324, 124573, 2022

[10] Fleury, M., Romero-Sarmiento, M., Characterization of shales using $T_1$-$T_2$ NMR maps, Journal of Petroleum Science and Engineering, 137, 55-62, 2016

[11] Nicot, B., Vorapalawut, N., Rousseau, B., Madariaga, L. F., Hamon, G., Korb, J.-P., Estimating saturations in organic shales using 2D NMR, Petrophysics, 57(1), 19-29, 2016

[12] Dang, S. T., Sondergeld, C. H., Rai, C. S, Interpretation of nuclear-magnetic-resonance response to hydrocarbons: application to miscible enhanced-oil-recovery experiments in shales, Society of Petroleum Engineers, SPE Res Eval & Eng, 22 (01): 302-309, SPE-191144-PA, 2019

[13] Liu, B., Bai, L., Chi, Y., Jia, R., Fu, X. Yang, L., Geochemical characterization and quantitative evaluation of shale oil reservoir by two-dimensional nuclear magnetic resonance and quantitative grain fluorescence on extract: A case study from the Qingshankou Formation in Southern Songliao Basin, northeast China, Marine and Petroleum Geology, 109, 561-573, 2019

[14] Khatibi, S., Ostadhassan, M., Xie, Z. H., Gentzis, T., Bubach, B., Gan, Z., Carvajal-Ortiz, H., NMR relaxometry a new approach to detect geochemical properties of organic matter in tight shales, Fuel, 235, 167-177, 2019

[15] Liu, K., Gentzis, T., Carvajal-Ortiz, H., Xie, Z. H., Ostadhassan, M., Experimental investigation of solid organic matter with a 2D NMR $T_1$-$T_2$ map, Energy Fuels, 35, 19, 15709-15720, 2021

[16] Silletta, E. V., Vila, G. S., Domené, E. A., Velasco, M. I., Bedini, P. C., Garro-Linck, Y., Masiero, D., Monti, G. A., Acosta, R. H., Organic matter detection in shale reservoirs using a novel pulse sequence for $T_1$-$T_2$ relaxation maps at 2 MHz, Fuel, 312, 122863, 2022

[17] Guo, J., MacMillan, B., Zamiri, M. S., Balcom, B. J., Magnetic resonance $T_1$-$T_2$ and $T_{1\rho}$-$T^*_2$ relaxation correlation measurements in solid-like materials with non-exponential decays, Journal of Magnetic Resonance, 328, 107005, 2021

[18] MacMillan, B., Balcom, B., Enjilela, R., Afrough, A., Method and apparatus for $T_1$-$T^*_2$ relaxation correlation magnetic resonance measurement of materials, U.S. Pat. No. 11,486,949, 2022

[19] Guo, J., Zamiri, M. S., Balcom, B. J., Rapid measurement of $T^*_1$-$T^*_2$ relaxation correlation with a Look-Locker sequence, Journal of Magnetic Resonance, 335, 107123, 2022

[20] Chen, Q., Marble, A. E., Colpitts, B. G., Balcom, B. J., The internal magnetic field distribution, and single exponential magnetic resonance free induction decay, in rocks, Journal of Magnetic Resonance, 175, 300-308, 2005

[21] Hurlimann, M. D., Diffusion and Relaxation Effects in General Stray Field NMR Experiments, Journal of Magnetic Resonance, 148, 367-378, 2001

[22] Valori, A., Hursan, G., Ma, S. M., Laboratory and downhole wettability from NMR $T_1/T_2$ ratio, Petrophysics, 58, 352-365, 2017

[23] Ozen A. E., Sigal R. F., $T_1/T_2$ NMR surface relaxation ratio for hydrocarbons and brines in contact with mature organic-shale reservoir rocks, Petrophysics 54 (1), 11-19. 2013

[24] Rylander, E., Singer, P. M., Jiang, T., Lewis, R. E., McLin, R., Sinclair, S. M., NMR $T_2$ distributions in the Eagle Ford shale: Reflections on pore size, Society of Petroleum Engineers, SPE-164554-MS, 2013

[25] Jiang, T., Rylander, E., Singer, P. M., Lewis, R., Sinclair, S. M., Integrated petrophysical interpretation of Eagle Ford shale with 1-D and 2-D nuclear magnetic resonance (NMR), Society of Petrophysicists and Well Log Analysts, SPWLA-2013-LL,

[26] Singer, P. M., Rylander, E., Jiang, T., Lewis, R. E., McLin, R., Sinclair, S. M., 1D and 2D NMR core-log integration in organic shale, Society of Core Analysts, SCA2013-18, 2013

[27] Kausik, K. Fellah, K., Rylander, E., Singer, P. M., Lewis, R. E., Sinclair, S. M., NMR relaxometry in shale and implications for logging, Petrophysics, 57, 339-350, 2016

[28] Valori, A., Van Den Berg, S., Ali, F., Abdallah, W., Permeability estimation from NMR time dependent methane saturation monitoring in shales, Energy Fuels, 31, 5913, 2017

[29] Singer, P. M, Chen, Z., Hirasaki, G. J., Fluid typing and pore size in organic shale using 2D NMR in saturated kerogen isolates, Petrophysics, 57, 604-619, 2016

[30] Chen, Z., Singer, P. M., Kuang, J., Vargas, F. M., Hirasaki, G. J., Effects of bitumen extraction on the 2D NMR response of saturated kerogen isolates, Petrophysics, 58, 470-484, 2017

[31] Singer, P. M., Chen, Z., Wang, X., Hirasaki, G. J., Diffusive coupling in heptane-saturated kerogen isolates evidenced by NMR $T_1$-$T_2$ and $T_2$-$T_2$ maps, Fuel, 280, 118626, 2020

[32] Silletta, E. V., Delfa, G. M., Velasco, M. I., Donadelli, J. A., Monti, G. A., Smal, C., Acosta, R. H., Quantification of imbibed heptane in shale rocks determined by edited $T_1$-$T_2$ nuclear magnetic resonance relaxation experiments at high magnetic field, Energy Fuels, https://doi.org/10.1021/acs.energyfuels.2c01554, 2022

[33] Yang, Z., Hirasaki, G. J., NMR measurement of bitumen at different temperatures, Journal of Magnetic Resonance, 192, 280-293, 2008

[34] Acosta, R. H., Silletta, E. V., Monti, G. A., Garro Linck, Y., Bedini, P. C., Vila, G. S., Masiero, D. M., Domené, E. A., Velsco, M. I., Detection of solid organic material and fluids in the shale rock by means of low field NMR, US 2021/0123874 A1, 2021

[35] Kowalewski, J., Mäler, L., Nuclear spin relaxation in liquids: theory, experiments, and applications, Series in Chemical Physics, Taylor & Francis, 2006

[36] Powles, J. G., Mansfield, P., Double-pulse nuclear-resonance transients in solids, Physics Letters, 2, 58-59, 1962

[37] Powles, J. G., Strange, J. H., Zero time resolution nuclear magnetic resonance transients in solids, Proceedings of the Physical Society, 82, 6-15, 1963

[38] Xie, Z. H., Gentzis, T., Carvajal-Ortiz, H., Measuring kerogen, solid organics, and oil production potentials of unconventional source rocks using solid type 20-MHz NMR techniques, Society of Petrophysicists and Well-Log Analysts, SPWLA-2021-0094, 2021

[39] Gentzis, T., Carvajal-Ortiz, H., Xie, Z. H., Hackley, P. C., Fowler, H., An integrated geochemical, spectroscopic, and petrographic approach to examining the producibility of hydrocarbons from liquids-rich unconventional formations, Fuel, 298, 120357, 2021

[40] Washburn, K. E., Birdwell, J. E., Updated methodology for nuclear magnetic resonance characterization of shales, Journal of Magnetic Resonance, 233, 17-28, 2013

[41] Panattoni, F., Colbourne, A. A, Fordham, E. J., Mitchell, J., Grey, C. P., Magusin, P. C. M. M., Improved description of organic matter in shales by enhanced solid fraction detection with low-field $^1$H NMR relaxometry, Energy Fuels, 35 (22), 18194-18209, 2021

[42] Birdwell, J. E., Washburn, K. E., Multivariate analysis relating oil shale geochemical properties to NMR relaxometry, Energy Fuels, 29, 2234-2243, 2015

[43] Boutis, G. S., Ravinath Kausik, R., Comparing the efficacy of solid and magic-echo refocusing sequences: Applications to $^1$H NMR echo spectroscopy of shale rock, Solid State Nuclear Magnetic Resonance 88, 22-28, 2017

[44] Li, J., Jiang, C., Wang, M., Xu, L., Li, M., Yu, C., Wu, Y., Lu, S., Determination of in situ hydrocarbon contents in shale oil plays. Part 1: Is routine Rock-Eval analysis reliable for quantifying the hydrocarbon contents of preserved shale cores?, Organic Geochemistry, 170, 104449, 2022

[45] Li, J., Jiang, C., Wang, M., Xu, L., Li, M., Yu, C., Wu, Y., Lu, S., Determination of in situ hydrocarbon contents in shale oil plays. Part 2: Two-dimensional nuclear magnetic resonance (2D NMR) as a potential approach to characterize preserved cores, Marine and Petroleum Geology, https://doi.org/10.1016/j.marpetgeo.2022.105890, 2022

[46] Xu, C., Xie, R., Guo, J., Jin, G., Fan, W., Xiao, L., Comprehensive characterization of petrophysical properties in shale by solvent extraction experiments and 2D NMR, Fuel, 335, 127070, 2023

[47] Chen, Z., Singer, P. M., Wang, X., Hirasaki, G. J., Vinegar, H. J., Evaluation of light hydrocarbon composition, pore size, and tortuosity in organic-rich chalks using NMR core analysis and logging, Society of Petrophysicists and Well-Log Analysts, SPWLA-2019-K, 2019

[48] Chen, Z., Singer, P. M., Wang, X., Vinegar, H. J., Nguyen, S. V., Hirasaki, G. J., NMR evaluation of light-hydrocarbon composition, pore size, and tortuosity in organic-rich chalks, Petrophysics 60 (06), 771-797, 2019

[49] Vinegar, E. G., Rosenberg, Y. O., Reznick, I., Gordin, Y., Singer, P. M., Wang, X., Chen, Z., Nguyen, S. V., Li, W., Bradley, T., Hirasaki, G. J., Lake, L. W., Feinstein, S., Hatzor, Y. H., Vinegar, H. J., What happens to the petrophysical properties of a dual porosity organic-rich chalk during early-stage organic maturation?, Society of Petrophysicists and Well-Log Analysts, SPWLA-5092, 2020

[50] Vinegar, E., Singer, P. M., Hirasaki, G. J., Chen, Z., Wang, X., Vinegar, H. J., Determination of fluid-phase-specific petrophysical properties of geological core for oil, water and gas phases, U.S. Patent Application 63/005,482, Apr. 6, 2020

[51] Vinegar, H. J., Singer, P. M., Hirasaki, G. J., Chen, Z., Wang, X., Vinegar, E., New method of estimating permeability using NMR diffusion measurements, U.S. Patent Application 63/005,482, Apr. 6, 2020

[52] Wang, X., Singer, P. M., Chen, Z., Hirasaki, G. J., Vinegar, H. J., A new method of estimating tortuosity and pore size in unconventional formations using NMR restricted diffusion measurements, Society of Petrophysicists and Well-Log Analysts, SPWLA-5046, 2020

[53] Wang, X., Singer, P. M., Liu, Y., Chen, Z., Hirasaki, G. J., Vinegar, H. J., Pore size, tortuosity, and permeability from NMR restricted diffusion in organic-rich chalks, Petrophysics 62(3), 244-264, 2021

[54] Vinegar, H. J., Singer, P. M., Hirasaki, G. J., Chen, Z., Wang, X., Method for determining the composition of natural gas liquids, mean pore-size and tortuosity in a subsurface formation using NMR, U.S. Pat. No. 11,099, 292, Aug. 24, 2021

[55] Cowan, B. Nuclear magnetic resonance and relaxation; Cambridge University Press, 1997

[56] Singer, P. M, Asthagiri, D., Chapman, W. G., Hirasaki, G. J., Molecular dynamics simulations of NMR relaxation and diffusion of bulk hydrocarbons and water, Journal of Magnetic Resonance, 277, 15-24, 2017

[57] Singer, P. M., Valiya Parambathu, A., Wang, X., Asthagiri, D., Chapman, W. G., Hirasaki, G. J., Fleury, M., Elucidating the $^1$H NMR relaxation mechanism in polydisperse polymers and bitumen using measurements, MD simulations, and models, J. Phys. Chem. B, 124, 4222, 2020

[58] Mitchell, J., Gladden, L. F., Chandrasekera, T. C., Fordham, E. J., Low-field permanent magnets for industrial process and quality control, Progress in Nuclear Magnetic Resonance Spectroscopy, 76, 1-60, 2014

[59] Venkataramanan, L., Song, Y. Q., Hurlimann, M. D., Solving Fredholm integrals of the first kind with tensor product structure in 2 and 2.5 dimensions, IEEE Transactions on Signal Processing, 50, 1017-1026, 2002

[60] Song, Y. Q., Venkataramanan, L., Hurlimann, M. D., Flaum, M., Frulla, P., Straley, C., $T_1$-$T_2$ correlation spectra obtained using a fast two-dimensional Laplace inversion, Journal of Magnetic Resonance, 154, 261-268, 2002

[61] Singer, P. M., Arsenault, A., Imai, T., Fujita, M., $^{139}$La NMR investigation of the interplay between the lattice, charge, and spin dynamics in charge ordered high $T_c$ cuprate $La_{1.875}Ba_{0.125}CuO_4$, Physical Review B, 101, 174508, 2020

[62] Rosenberg, Y. O., Reznik, I. J., Vinegar, H. J., Feinstein, S., Bartov, Y., Comparing natural and artificial thermal maturation of a Type II-S source rock, Late Cretaceous, Israel, Marine and Petroleum Geology, 124, 104773, 2021

[63] McCarthy, K., Rojas, K., Niemann, M., Palrnowski, D., Peters, K., Stankiewicz, A., Basic petroleum geochemistry for source rock evaluation, Oilfield Review, 23(2), 32-43, 2011

[64] Carvajal-Ortiz, H., Gentzis, T., Critical considerations when assessing hydrocarbon plays using Rock-Eval pyrolysis and organic petrology data: Data quality revisited, International Journal of Coal Geology, 152, 113-122, 2015

[65] Singer, P. M., Chen, Z., Alemany L. B., Hirasaki, G. J., Zhu, K., Xie, Z. H., Vo, T. D., Interpretation of NMR relaxation in bitumen and organic shale using polymer-heptane mixes, Energy Fuels, 32 (2), 1535, 2018

[66] Valiya Parambathu, A., Singer, P. M., Hirasaki, G. J., Chapman, W. G., Asthagiri, D., Critical role of confinement in the NMR surface relaxation and diffusion of n-heptane in a polymer matrix revealed by MD simulations, J. Phys. Chem. B, 124, 3801, 2020

[67] Dick, M. J., Veselinovic, D., Green, D., Review of recent developments in NMR core analysis, Petrophysics, 63 (3), 454, 2022

[68] Ungerer, P., Collell, J., Yiannourakou, M., Molecular modeling of the volumetric and thermodynamic properties of kerogen: Influence of organic type and maturity, Energy Fuels, 29, 91-105, 2015

[69] Volkov, V. Y., Al-Muntaser, A. A., Varfolomeev, M. A., Khasanova, N. M., Sakharov, B. V., Suwaid, M. A., Djimasbe, R., Galeev, R. I., Nurgaliev, D. K., Low-field NMR-relaxometry as fast and simple technique for in-situ determination of SARA-composition of crude oils, Journal of Petroleum Science and Engineering, 196, 107990, 2021

[70] Galeev, R. I., Sakharov, B. V., Khasanova, N. M., Volkov, V. Y., Fazlyyyakhmatov, M. G., Shamanov, I. N., Emelianov, D. A., Kozlova, E. V., Petrashov, O. V., Varfolomeev, M. A., Nurgaliev, D. K., Novel low-field NMR method for characterization content and SARA composition of bitumen in rocks, Journal of Petroleum Science and Engineering, 214, 110486, 2022

[71] Singer, P. M., Asthagiri, D., Chen, Z., Valiya Parambathu, A., Hirasaki, G. J., Chapman, W. G., Role of internal motions and molecular geometry on the NMR relaxation of hydrocarbons, Journal of Chemical Physics, 148 (16), 164507, 2018

[72] Kausik, K., Freed, D., Fellah, K., Feng, L., Ling, Y., Simpson, G., Frequency and temperature dependence of 2D NMR $T_1$-$T_2$ maps of shale, Petrophysics, 60 (1), 2019

The invention claimed is:

1. A method of nuclear magnetic resonance (NMR) measurement on a sample, the method comprising:
a) applying a 180° RF pulse to the sample, thereby yielding an inverted longitudinal magnetization $M_z=-M_0$ away from equilibrium;
b) during a selected inversion recovery time $\tau_1$, allowing $M_z$ to recover towards an equilibrium value of $M_z=M_0$ governed by a time constant $T_1$;
c) after the selected inversion recovery time $\tau_1$, applying a 90° RF pulse for rotating the instantaneous $M_z$ into a transverse plane $M_{x,y}$;
d) at a selected pulse-separation time $\tau_S$, applying a second 90° RF pulse for rotating $M_{x,y}$ within the transverse plane, creating observable magnetization by formation of a solid-echo;
e) sampling with discretized time steps the observable solid-echo magnetization during a time t following the applying of the second 90° RF pulse to acquire signal amplitude measurements as the observable transverse magnetization decays toward equilibrium with magnetization $M_{x,y}=0$, wherein, during the time t, a decay time constant is $T^*_{2G}$;
f) repeating at least once, responsively to a recovery of the sample substantially to equilibrium, steps (a) to (e) with a different selected recovery time $\tau_1$ in step (c); and
g) processing the solid-echo measurements to produce a $T_1$-$T^*_{2G}$ map for use in characterizing the sample, wherein the characterizing includes at least one of determining a structure and determining a plurality of components.

2. The method of claim 1, wherein the solid-like components comprise at least one of kerogen, bitumen, and a clay hydroxyl of a geologic sample.

3. The method of claim 1, wherein the liquid-like components comprise at least one of a micropore fluid, a meso-macropore fluid, a fluid dissolved in organic matter, and a clay-bound water of a geologic sample.

4. The method of claim 1, wherein the instrumental deadtime $t_d$ is not greater than 0.01 ms.

5. The method of claim 1, wherein the longitudinal magnetization is saturated ($M_z=0$) by a series of RF pulses, followed by a selected inversion recovery time $\tau_1$, followed by rotation into the transverse plane to form a solid-echo.

6. The method of claim 1, additionally comprising: using the measurements before and after bitumen extraction of the sample to predict bitumen content and bitumen properties including at least one of asphaltene, resin, aromatic, and saturate fractions of the bitumen in the sample.

7. The method of claim 1, additionally comprising: using the measurements before and after saturation of the sample with light hydrocarbons to predict expelled bitumen content and bitumen properties including at least one of asphaltene, resin, aromatic, and saturate fractions of the bitumen in the sample.

8. The method of claim 1, wherein the sample comprises bulk crude-oil or bulk bitumen to predict the asphaltene, resin, aromatic, and/or saturate fractions of the bulk crude-oil or bulk bitumen.

9. The method of claim 1, wherein the inversion is based on 2D inverse Laplace techniques for use in determining structure or components of the sample.

10. The method of claim 1, wherein the transverse magnetization $M_{x,y}$ decay is inverted with one of an exponential function, a Gaussian function, and a sinc-Gaussian kernel function.

11. The method of claim 1, wherein the longitudinal magnetization $M_z$ recovery is inverted with an exponential kernel.

12. The method of claim 1, wherein one or more of the nominal 90° RF pulse comprises a different tip angle.

13. The method of claim 1, wherein one or more of the nominal 180° RF pulse comprises a different tip angle.

14. The method of claim 1, wherein one or more of the steps (a) to (g) is correlated with geochemistry data, such as RockEval or LECO, for determining structure or components of the sample.

15. The method of claim 1, when applied to predict NMR-derived geochemical quantities including S1, S2, S1/S2, HI, OI, as well as elemental ratios H/C, H/S, H/O, H/N of elements for the crude-oil or bitumen.

16. The method of claim 1, wherein a distinction between solid-like and liquid-like NMR signal is determined by a transverse relaxation time being respectively above or below a value of 0.1 ms.

17. The method of claim 1, wherein a distinction between solid-like and liquid-like NMR signal is determined by a viscosity being respectively above or below a value of $10^7$ cP.

18. A method of nuclear magnetic resonance (NMR) measurement on a sample, the method comprising:
   a) measuring liquid-like components using an inversion-recovery CPMG sequence, without dephasing from the inhomogeneous magnetic field;
   b) processing the measurements of the liquid-like components to produce a $T_1$-$T_{2e}$ map of the liquid-like components;
   c) measuring solid-like components using an inversion-recovery solid-echo sequence, with minimal instrumental deadtime;
   d) processing the measurements of the liquid-like components to produce a $T_1$-$T^*_{2G}$ map of the solid-like components;
   e) combining the $T_1$-$T_{2e}$ map with the $T_1$-$T^*_{2G}$ map using a $T_2$ cutoff to create a spliced $T_1$-$\{T^*_{2G}; T_{2e}\}$ map; and
   f) analyzing the $T_1$-$\{T^*_{2G}; T_{2e}\}$ map for use in characterizing the sample, wherein the characterizing includes at least one of determining a structure and determining a plurality of components.

19. The method of claim 18, wherein the solid-like components comprise at least one of kerogen, bitumen, and a clay hydroxyl of a geologic sample.

20. The method of claim 18, wherein the liquid-like components comprise at least one of a micropore fluid, a meso-macropore fluid, a fluid dissolved in organic matter, and a clay-bound water of a geologic sample.

21. The method of claim 18, wherein the instrumental deadtime $t_d$ is not greater than 0.01 ms.

22. The method of claim 18, wherein the longitudinal magnetization is saturated ($M_z$=0) by a series of RF pulses, followed by a selected inversion recovery time $\tau_1$, followed by rotation into the transverse plane to form a solid-echo.

23. The method of claim 18, additionally comprising: using the measurements before and after bitumen extraction of the sample to predict bitumen content and bitumen properties including at least one of asphaltene, resin, aromatic, and saturate fractions of the bitumen in the sample.

24. The method of claim 18, additionally comprising: using the measurements before and after saturation of the sample with light hydrocarbons to predict expelled bitumen content and bitumen properties including at least one of asphaltene, resin, aromatic, and saturate fractions of the bitumen in the sample.

25. The method of claim 18, wherein the sample comprises bulk crude-oil or bulk bitumen to predict the asphaltene, resin, aromatic, and/or saturate fractions of the bulk crude-oil or bulk bitumen.

26. The method of claim 18, wherein the inversion is based on 2D inverse Laplace techniques for use in determining structure or components of the sample.

27. The method of claim 18, wherein the transverse magnetization $M_{x,y}$ decay is inverted with one of an exponential function, a Gaussian function, and a sinc-Gaussian kernel function.

28. The method of claim 18, wherein the longitudinal magnetization $M_z$ recovery is inverted with an exponential kernel.

29. The method of claim 18, wherein one or more of the nominal 90° RF pulse comprises a different tip angle.

30. The method of claim 18, wherein one or more of the nominal 180° RF pulse comprises a different tip angle.

31. The method of claim 18, wherein one or more of the steps (a) to (g) is correlated with geochemistry data, such as RockEval or LECO, for determining structure or components of the sample.

32. The method of claim 18, when applied to predict NMR-derived geochemical quantities including S1, S2, S1/S2, HI, OI, as well as elemental ratios H/C, H/S, H/O, H/N of elements for the crude-oil or bitumen.

33. The method of claim 18, wherein a distinction between solid-like and liquid-like NMR signal is determined by a transverse relaxation time being respectively above or below a value of 0.1 ms.

34. The method of claim 18, wherein a distinction between solid-like and liquid-like NMR signal is determined by a viscosity being respectively above or below a value of $10^7$ cP.

* * * * *